(12) United States Patent
Lee et al.

(10) Patent No.: US 7,120,064 B2
(45) Date of Patent: Oct. 10, 2006

(54) MONOLITHIC, COMBO NONVOLATILE MEMORY ALLOWING BYTE, PAGE AND BLOCK WRITE WITH NO DISTURB AND DIVIDED-WELL IN THE CELL ARRAY USING A UNIFIED CELL STRUCTURE AND TECHNOLOGY WITH A NEW SCHEME OF DECODER AND LAYOUT

(75) Inventors: Peter W. Lee, Saratoga, CA (US);
Fu-Chang Hsu, San Jose, CA (US);
Hsing-Ya Tsao, San Jose, CA (US);
Han-Rei Ma, Los Altos, CA (US);
Koucheng Wu, San Jose, CA (US)

(73) Assignee: Aplus Flash Technology, Inc., San Jose, CA (US)

( * ) Notice: Subject to any disclaimer, the term of this patent is extended or adjusted under 35 U.S.C. 154(b) by 0 days.

(21) Appl. No.: 11/036,961

(22) Filed: Jan. 14, 2005

(65) Prior Publication Data

US 2005/0128805 A1    Jun. 16, 2005

Related U.S. Application Data

(62) Division of application No. 10/223,208, filed on Aug. 19, 2002, now Pat. No. 6,862,223.

(60) Provisional application No. 60/394,202, filed on Jul. 5, 2002.

(51) Int. Cl.
*G11C 16/04*    (2006.01)

(52) U.S. Cl. .......................... 365/185.33; 365/185.01; 365/185.05

(58) Field of Classification Search .......... 365/185.17, 365/185.11, 185.28, 185.33
See application file for complete search history.

(56) References Cited

U.S. PATENT DOCUMENTS

| 5,748,538 A | 5/1998 | Lee et al. ............. 365/185.06 |
| 6,174,759 B1 | 1/2001 | Verhaar et al. ............ 438/201 |
| 6,212,102 B1 | 4/2001 | Georgakos et al. .... 365/185.18 |
| 6,266,274 B1 | 7/2001 | Pockrandt et al. ..... 365/185.17 |
| 6,307,781 B1 | 10/2001 | Shum .................... 365/185.17 |
| 6,326,661 B1 | 12/2001 | Dormans et al. .......... 257/315 |

(Continued)

OTHER PUBLICATIONS

U.S. Appl. No. 09/852,247, filed May 9, 2001, "A Novel 3-Step Write Operation Nonvolatile Semiconductor One-Transistor, NOR-Type Flash EEPROM Memory Cell," AP-01-001.

(Continued)

*Primary Examiner*—Gene N. Auduong
(74) *Attorney, Agent, or Firm*—Saile Ackerman LLC; Stephen B. Ackerman; Rosemary L. S. Pike

(57) ABSTRACT

A novel FLASH-based EEPROM cell, decoder, and layout scheme are disclosed to eliminate the area-consuming divided triple-well in cell array and allows byte-erase and byte-program for high P/E cycles. Furthermore, the process-compatible FLASH cell for EEPROM part can be integrated with FLASH and ROM parts so that a superior combo, monolithic, nonvolatile memory is achieved. Unlike all previous arts, the novel combo nonvolatile memory of the present invention of ROM, EEPROM and FLASH or combination of any two is made of one unified, fully compatible, highly-scalable BN+ cell and unified process. In addition, its cell operation schemes have zero array overhead and zero disturbance during P/E operations. The novel combo nonvolatile memory is designed to meet the need in those markets requiring flexible write size in units of bytes, pages and blocks at a lower cost.

20 Claims, 49 Drawing Sheets

U.S. PATENT DOCUMENTS

| | | |
|---|---|---|
| 6,370,081 B1 | 4/2002 | Sakui et al. ............ 365/238.5 |
| 6,400,604 B1 | 6/2002 | Noda .................... 365/185.12 |
| 6,556,481 B1 | 4/2003 | Hsu et al. |
| 6,678,191 B1 * | 1/2004 | Lee et al. .............. 365/185.17 |
| 6,850,438 B1 * | 2/2005 | Lee et al. .............. 365/185.11 |

OTHER PUBLICATIONS

U.S. Appl. No. 09/891,782, filed Jun. 27, 2001, "A Novel 3-Step Write Operation Nonvolatile Semiconductor One-Transistor Flash EEPROM Memory," AP 01-001.2.

* cited by examiner

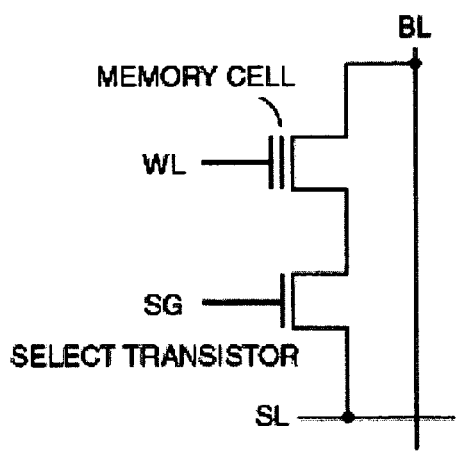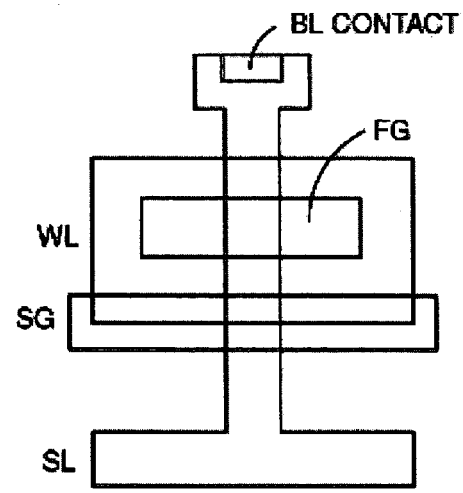
FIG. 5A (Prior Art)      FIG. 5B (Prior Art)
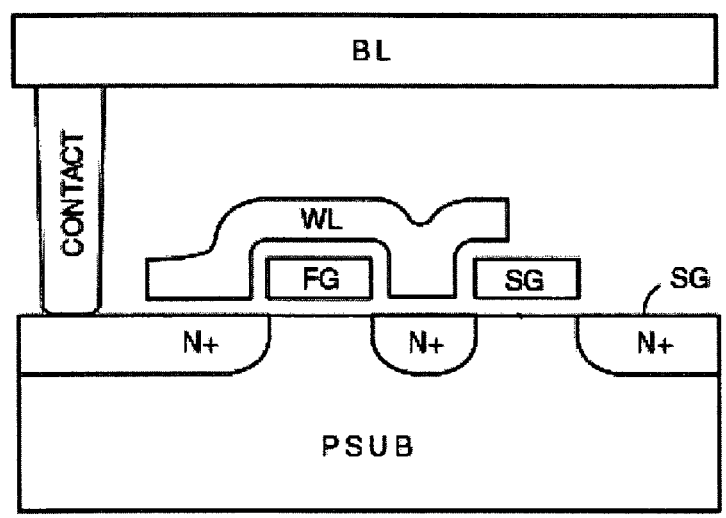
FIG. 5C (Prior Art)

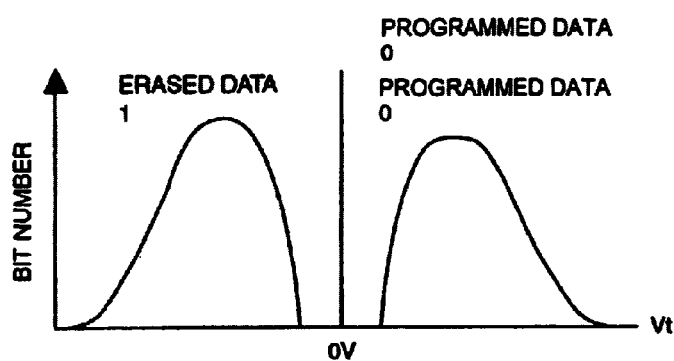 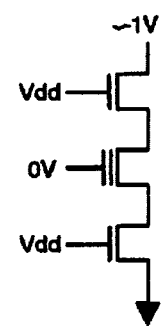
FIG. 9A  FIG. 9B
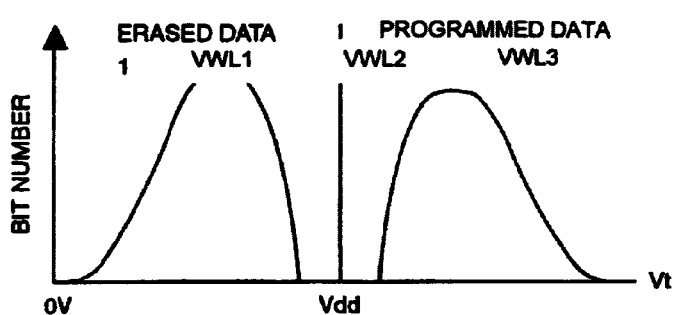 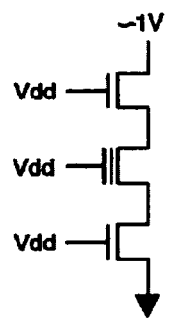
FIG. 9C  FIG. 9D

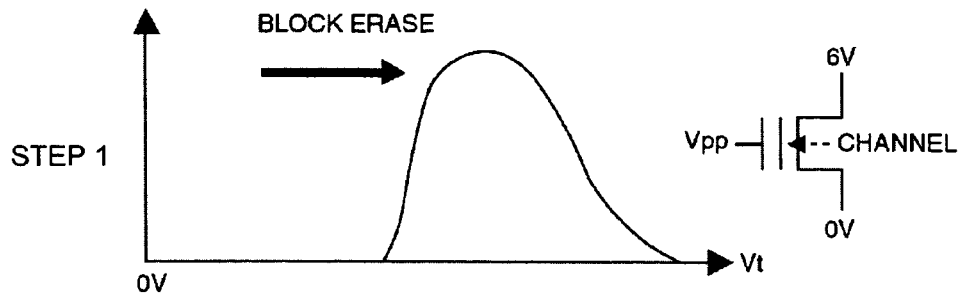
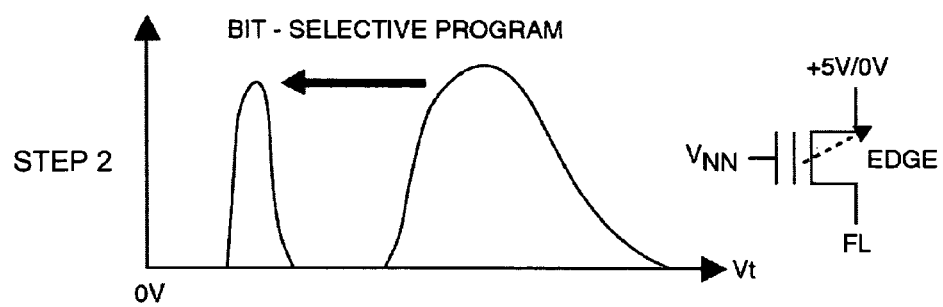
FIG. 31A (Prior Art)          FIG. 31B (Prior Art)
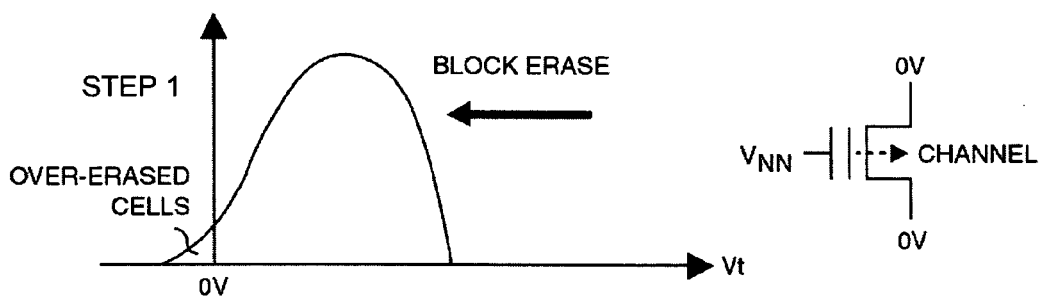
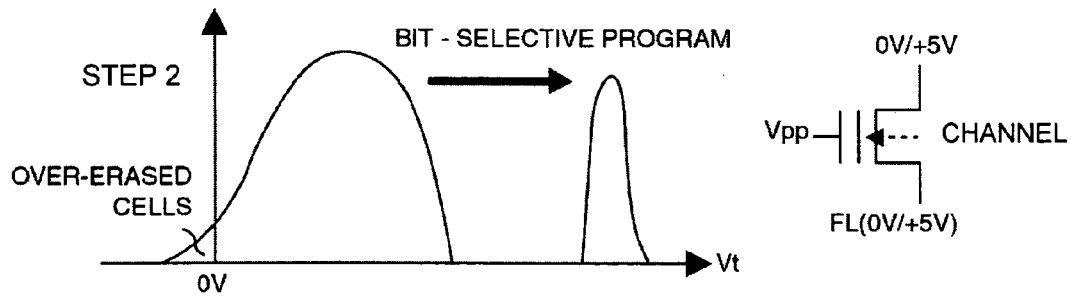
FIG. 32A (Prior Art)          FIG. 32B (Prior Art)

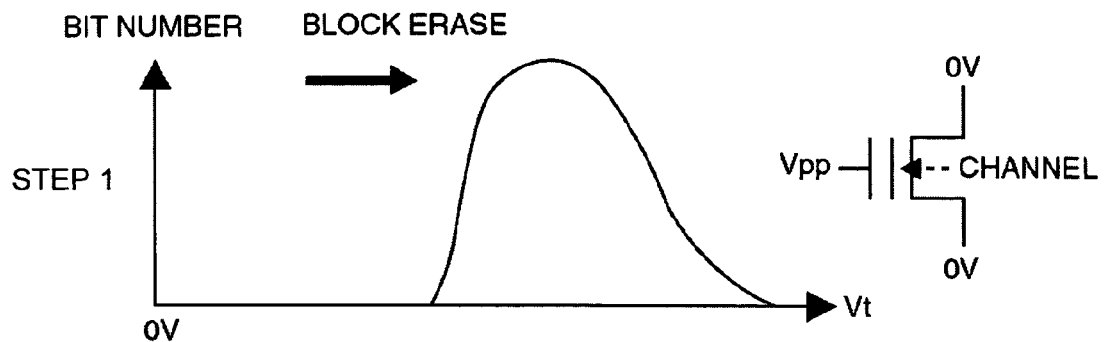
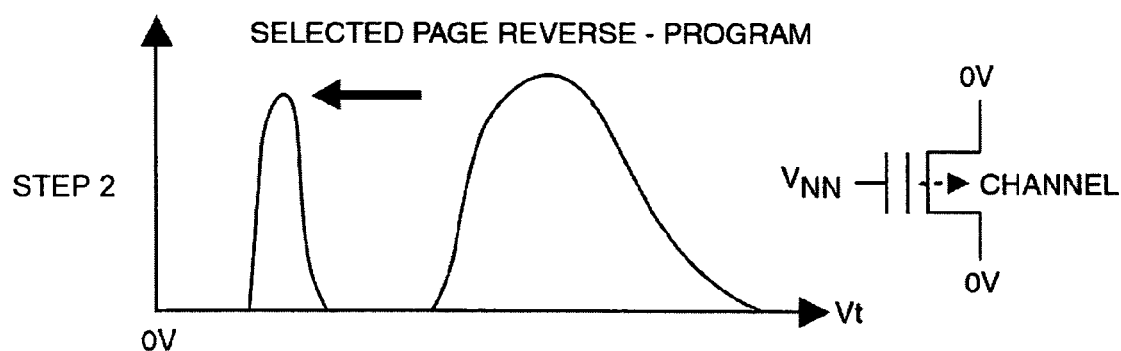
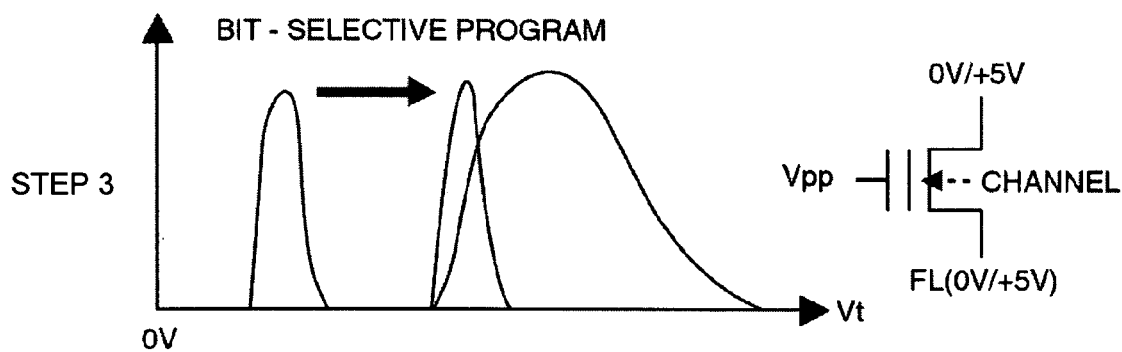
FIG. 33A  FIG. 33B

MONOLITHIC, COMBO NONVOLATILE MEMORY ALLOWING BYTE, PAGE AND BLOCK WRITE WITH NO DISTURB AND DIVIDED-WELL IN THE CELL ARRAY USING A UNIFIED CELL STRUCTURE AND TECHNOLOGY WITH A NEW SCHEME OF DECODER AND LAYOUT

RELATED PATENT APPLICATIONS

This is a division of patent application Ser. No. 10/223,208, filing date Aug. 19, 2002 now U.S. Pat. No. 6,862,223, A Novel Monolithic, Combo Nonvolatile Memory Allowing Byte, Page And Block Write With No Disturb And Divided-Well In The Cell Array Using A Unified Cell Structure And Technology With A New Scheme Of Decoder And Layout, which claims priority to Provisional Patent Application Ser. No. 60/394,202, filing date Jul. 5, 2002, A Novel Monolithic, Combo Nonvolatile Memory Allowing Byte, Page And Block Write With No Disturb And Divided-Well In The Cell Array Using A Unified Cell Structure And Technology With A New Scheme Of Decoder, assigned to the same assignee as the present invention, which are herein incorporated by reference in their entirety.

Co-pending U.S. patent application Ser. No. 09/852,247 to F. C. Hsu et al filed on May 9, 2001 and Ser. No. 09/891,782 to F. C. Hsu et al filed on Jun. 27, 2001.

BACKGROUND OF THE INVENTION (1) Field of the Invention

The present invention relates to a novel combination nonvolatile memory and a novel embedded memory. The nonvolatile memory is comprised of three key memories: ROM (Read-Only-Memory), EEPROM (Electrically Erasable and Programmable Read Only Memory) and FLASH. The embedded memory is comprised of the combination of the above three nonvolatile memories, SRAM, CPU, and shared buses of data, address, and control signals.

(2) Description of the Prior Art

ROM data can only be altered at the manufacturing site by changing the costly photo mask sets, while both data of EEPROM and FLASH is allowed to be in-system flexibly changed at user's site at lower cost and faster throughput than ROM. The main differences in product specification requirements between FLASH and EEPROM are not the write scheme nor write speed but the write size and endurance cycles. Endurance cycle stands for the number of successful program and erase cycles when changing FLASH or EEPROM data. Write operation in the present invention means an erase is commonly performed first and then followed by a program operation.

For example, both Flash and EEPROM memories can perform on-chip erase and program operation without relying on an external high-voltage power supply. In other words, a single low-voltage VDD supply is sufficient for in-system data reprogramming for both memories. Typically, only two preferred erase schemes such as edge-FN tunneling or channel-FN tunneling are extensively employed in both FLASH and EEPROM memories. Traditionally the program schemes are more available than the erase schemes. Besides FN-tunneling, CHE (Channel-Hot-Electron) and SCHEI (Source-side Hot-Electron-Injection) are the dominant schemes for 1Tr-ETOX(Electrically-Tunneling-Oxide) and 1.5Tr split-gate flash memory respectively. The technology that uses FN-tunneling erase schemes includes 1Tr-NAND FLASH from Toshiba and Samsung, 1Tr-AND from Hitachi, 1Tr-Dinor from Mitsubishi, 1Tr-OR from Aplus and EEPROM of 2Tr-FLOTOX. The major product specification differences between FLASH and EEPROM are the write-size and P/E cycles. For example, FLASH typically only performs page(128 B) or block(64 KB) erase and page(128 B) or byte(1 B) program, while EEPROM requires byte(1 B) erase and byte(1 B) program, causing large overhead in the cell array area. The EEPROM data change size is down to the level of one single byte, much smaller than FLASH erase size. The EEPROM cell structure and program erase scheme are designed for highly reliable FN-channel erase and FN-channel program to achieve high P/E cycles. Furthermore, the data change rate of EEPROM is much higher than FLASH, thus P/E cycles of more than 500K and write speeds of less than 10 mS are strictly requirements in EEPROM. In contrast to EEPROM, today's majority of leading FLASH cells, cell operating schemes, process and its associated array architectures are neither optimized for the schemes of FN-channel erase and FN-channel program nor for meeting a byte operation product specification.

Traditional FLASH memory is less flexible than EEPROM in erase size, but 2Tr-FLOTOX EEPROM suffers a big penalty in cell size and cell array area. There are two disadvantages that cause this larger cell size and cell array area of 2Tr-FLOTOX EEPROM. One is the non-scalable cell structure due to a requirement of extremely high program voltages of 15V in the bitline. The other disadvantage is the requirement of flexible byte erase and byte program, which results in an unique area consuming cell array architecture-divided wordline and divided bitline in units of bytes. The unique byte-array organization allows EEPROM cell to perform FN-channel erase and FN-channel program for highly reliable P/E cycles without disturbing the remaining bytes either in the same selected wordline or the same selected bitlines. Since the cell structure and P/E scheme of traditional 2Tr-FLOTOX EEPROM technology is not scalable as compared with its FLASH counterpart, the highest density of EEPROM technology available in 2002 is only 1 Mb made of 0.25um, while FLASH is 1 Gb made of 0.12 um. The density of EEPROM is about 1000 times behind FLASH in the nonvolatile market.

In conclusion, there is a strong market need for faster byte-erase and byte-program (less than 10 mS), higher P/E cycles (more than 500K) and the larger density (more than 1 Mb) at a lower manufacturing cost. e.g. A demand for low-cost FLASH-based EEPROM to offer comparable P/E cycles like EEPROM on the units of byte.

Recently, several FLASH-based EEPROM cells of prior art were disclosed claiming to have high cell scalability and highly reliable P/E cycles with the same P/E schemes of FN-channel-erase and FN-channel program. These recent prior arts intend to replace the un-shrinkable 2Tr-FLOTOX EEPROM cell and technology. Although the proposed FLASH-based EEPROM cell sizes are indeed being improved to be smaller than their FLOTOX counterparts to achieve the single-byte erase and program, the cell arrays turn out to have larger overhead than FLOTOX-array. For example, in Toshiba's disclosed 3Tr-NAND and 4Tr-NAND (as well as other prior art), the cell array is divided into a vertical triple-well for each single byte pitch. These are disclosed in Toshiba's U.S. Pat. Nos. 6,370,081 and 6,400,604. As a consequence, the total die area of Toshiba's proposed FLASH-based EEPROM still has a very large overhead. This overhead is drastically increased as the cell geometry is shrunken smaller and smaller.

Other patents disclose FLASH or EEPROM memories. These include Infineon's U.S. Pat. No. 6,307,781 to Shum, U.S. Pat. No. 6,212,102 to Georgakos et al, and U.S. Pat. No. 6,266,274 to Pockrandt et al, U.S. Phillips' U.S. Pat. No. 6,174,759 to Verhaar et al and U.S. Pat. No. 6,326,661 to Dormans et al, and Aplus' U.S. Pat. No. 5,748,538 to Lee et al and co-pending U.S. patent application Ser. No. 09/852, 247 filed on May 9, 2001 and Ser. No. 09/891,782 filed on Jun. 27, 2001, herein incorporated by reference.

SUMMARY OF THE INVENTION

The present invention overcomes all the above said drawbacks in 2Tr-FLOTOX-EEPROM, Toshiba's 3Tr-NAND and 4Tr-NAND and other similar FLASH-based EEPROM technologies. A novel FLASH-based EEPROM cell, decoder, and layout scheme are disclosed to eliminate the area-consuming divided triple-well in cell array and allows byte-erase and byte-program for high P/E cycles. Furthermore, the process-compatible FLASH cell for EEPROM part can be integrated with FLASH and ROM parts so that a superior combo, monolithic, nonvolatile memory is achieved. Unlike all previous arts, the novel combo nonvolatile memory of the present invention of ROM, EEPROM and FLASH or combination of any two is made of one unified, fully compatible, highly-scalable BN+ cell and unified process. In addition, its cell operation schemes have zero array overhead and zero disturbance during P/E operations. The novel combo nonvolatile memory is designed to meet the need in those markets requiring flexible write size in units of bytes, pages and blocks at a lower cost.

The present invention has been made with consideration of the above said drawbacks, and has as its object the provision of a new nonvolatile cell structure, cell operating schemes and conditions, cell process and cell array architectures. These are designed to replace traditional byte-erasable and byte-programmable 2Tr-FLOTOX EEPROM memory cell, Toshiba's 3Tr-NAND and 4Tr-NAND cells, Infineon's newly 2Tr cell and other similar FLASH cells. Furthermore, the same EEPROM cell structure, cell operating schemes and conditions and process can be extended to integrate FLASH or ROM or both with EEPROM for a monolithic combo nonvolatile memory.

An object of the present invention is to provide a unified, highly-scalable nonvolatile cell structure and process made of BN+ S/D (source/drain) for integrating large-size erase FLASH, single-byte erase EEPROM and photo-mask programmable ROM into one monolithic nonvolatile memory.

Another object of the present invention is to provide a combo monolithic nonvolatile memory comprised of FLASH and EEPROM. The FLASH part allows page(128 B) and block(64 KB) erase, while the EEPROM part supports single byte(1 B) and page(128 B) erase through the use of the same cell structure and same P/E schemes. FLASH can be used to store either program code or program data but EEPROM is dedicated for data storage.

Another object of the present invention is to provide a combo monolithic nonvolatile memory comprised of ROM and EEPROM. ROM data can only be altered by photo mask changes at the manufacturing site, while EEPROM part similarly supports single byte(1 B) and page(128 B) erase at the user site.

Still another object of the present invention is to provide a monolithic nonvolatile memory that employs the unified cell program and erase scheme of FN-channel erase and FN-channel-program for both FLASH and EEPROM in one chip.

Yet another object of the present invention is to provide a nonvolatile cell that is comprised of 3Tr BN+ S/D as derived from FLASH OR-array proposed by the same inventors of the present invention for zero disturb during byte-erase and byte-program operations.

Yet another further object of the present invention is to provide a nonvolatile cell that is comprised of 2Tr BN+ S/D as derived from FLASH OR-array proposed by the same inventors of the present invention for minor bitline disturb and zero wordline disturb during byte-erase and byte-program operations to further reduce cell and array size.

Still another object of the present invention is to provide a novel zero-disturb row-decoder scheme and unique layout technique that horizontally outputs a plurality of metal lines connecting to the selected wordline in units of bytes in BN+ cell array, to completely remove the vertically divided triple well on a byte basis in Toshiba's byte-writable EEPROM array comprising either 3Tr-NAND or 4Tr-NAND cell structures as well as other similar byte-writable arrays.

Yet another further object of the present invention is to provide a novel zero-disturb column-decoder scheme and unique layout techniques that vertically output a plurality of metalline buses connecting to the selected wordline in units of bytes in BN+ cell array to completely eliminate the vertically divided triple well on byte basis in Toshiba's 3Tr-NAND or 4Tr-NAND cell structures as well as other similar byte-writable cell arrays.

A further object of the present invention is to provide novel schemes of zero-disturb column-decoders, row-decoders and unique layout techniques that output a plurality of metalline buses running vertically or horizontally, connecting to the selected wordline in units of bytes in Toshiba's 3Tr-NAND or 4Tr-NAND arrays to completely eliminate Toshiba's and other's vertically divided triple well for byte-writable arrays.

Still another object of the present invention is to provide novel schemes of zero-disturb column-decoders, row-decoders and unique layout techniques that output a plurality of metalline buses running vertically or horizontally, connecting to the selected wordline in units of bytes in 1Tr-ETOX array to completely eliminate any divided triple well for byte-writable arrays.

A further object of the present invention is to provide novel schemes of split operating voltages of zero-disturb column-decoders, row-decoders and unique layout techniques that output a plurality of metalline buses running vertically or horizontally, connecting to the selected wordline in units of bytes in Toshiba's 3Tr-NAND and 4Tr-NAND arrays to completely eliminate their vertically divided triple well for byte-writable arrays. The split operating voltages of the present patent can further reduce P/E program voltages from 20V to +/−10V.

Still a further object of the present invention is the layout of the peripheral (insert) circuits right underneath of the aforesaid area occupied by a plurality of either horizontal or vertical metal buss lines generated from the novel row-decoder or column decoder of the present invention.

Yet another object of the present invention is provide a set of flow-charts that clearly explain the operations of byte-erase and byte-program based on the cell schemes of FN-channel erase and FN-channel program like a traditional 2Tr-FLOTOX EEPROM cell.

BRIEF DESCRIPTION OF THE DRAWINGS

The present invention will become more fully understood from the detailed description given subsequently and the accompanying drawings, flow-charts and diagrams that are given by way of illustration only, and thus are not limited to the present invention.

FIG. 1B is a 3Tr-cell. The $1^{st}$ transistor is a n-channel select transistor with gate connected to SG, drain connected to bitline and source, connected to $2^{nd}$ select transistor with gate connected to WL and source connected to SL and the floating-gate, two-poly nonvolatile memory transistor with tunneling oxide surrounding by BN+.

FIG. 5A and FIG. 5B illustrate a circuit schematic and top view of the layout of a prior art of Philip's 2Tr-NOR flash cell. FIG. 5C illustrates its cross-sectional view with cell drain directly connected to metal bitlines (BL) suffering drain disturb during byte-program operation. The cell's gate is connected to wordline WL. The cell's structure and the operating scheme are different from Infineon's counterpart.

FIG. 9A and FIG. 9C illustrate two kinds of distributions of the EEPROM cell's threshold voltages (Vt) of the present invention. FIG. 9A shows the Vt of erase cells are all in the negative state of data "1". The Vt of all the program cells are in positive with data "0". FIG. 9C shows the Vt of erase cells are partly in positive and partly in negative states of data "1". The Vt of all the program cells are all in positive larger than Vdd with data "0". FIG. 9B and FIG. 9D show the equivalent circuits and read operating conditions for three gates of EEPROM cell of the present invention. Only the wordline gate voltage is different to ensure the right read corresponding to positive and negative Vts in FIG. 9A and FIG. 9C.

FIG. 31A and FIG. 31B illustrate a scheme of a 3-step FN-channel erase and FN-channel program invented by Aplus' pending patent with same inventors. The scheme will be utilized by BN+ S/D FLASH cell associated with BN+ S/D EEPROM cell for the combo nonvolatile memory of the present invention.

FIG. 32A and FIG. 32B illustrate another prior art's write scheme for a traditional FLASH that performs FN-channel erase and FN-channel program.

FIG. 33A and FIG. 33B illustrate a novel scheme of a 3-step write scheme to be used in either 1Tr-OR FLASH or 3Tr-OR EEPROM of the present invention.

DESCRIPTION OF THE PREFERRED EMBODIMENTS

The present invention is a novel combo nonvolatile semiconductor memory and embedded memory that employs several new schemes of byte-wordline decoders and unique layout techniques associated with an unified, highly-scalable BN+ S/D (Source/Drain) cell architecture with the same process for integrating FLASH, EEPROM and ROM into one monolithic chip. The present invention will be described below in detail with reference to the accompanying drawings.

Figure 1A:
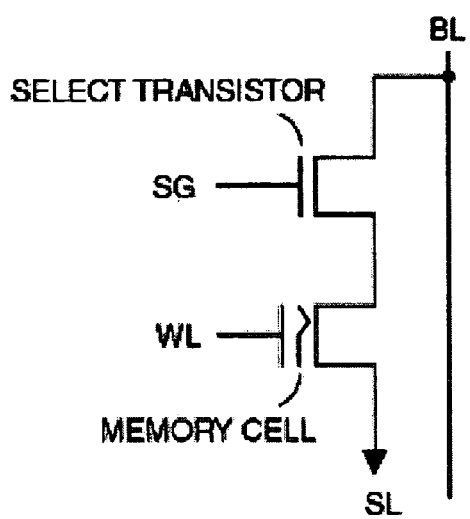
FIG. 1A, FIG. 1B and FIG. 1C illustrate a circuit schematic, top view of layout and the cross-sectional view of a prior art of conventional 2Tr-FLOTOX EEPROM cell. In reality.
Figure 1B:
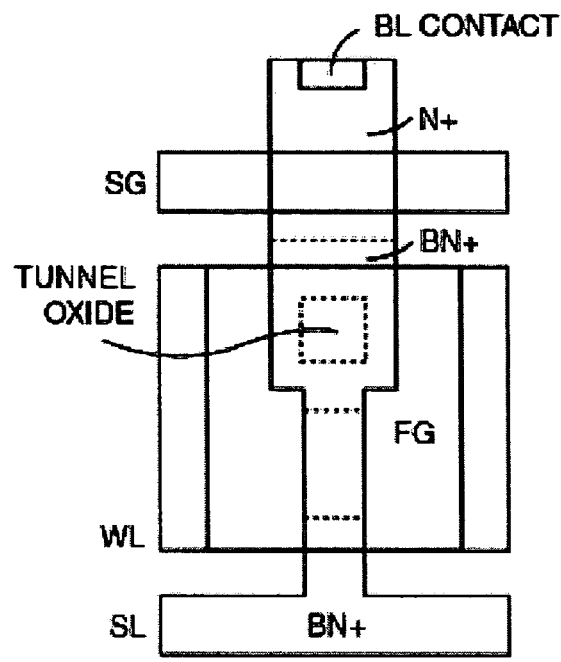
Figure 1C:
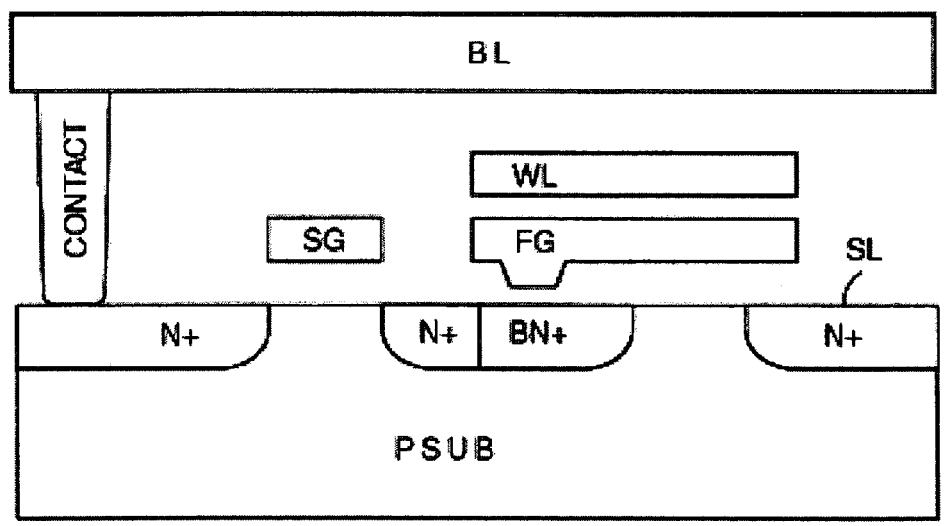

FIG. 1A, FIG. 1B and FIG. 1C illustrate a circuit schematic, top view of layout and the cross-sectional view of a prior art of conventional 2Tr-FLOTOX EEPROM cell. The $1^{st}$ transistor is a n-channel select transistor with its gate connected to SG, drain connected to metal1 (M1) bitline BL and source connected to the floating-gate, two-poly nonvolatile memory transistor with tunneling oxide surrounding by BN+ as shown in FIG. 1B. The tunneling oxide thickness is designed to be around 100 A and will have a FN-tunneling effect when 10V is applied across over between the floating P1 and channel of P-substrate, e.g., about 17V is applied to gate WL. For erase condition, the voltage of cell's gate WL is biased at around 15V–17V with cell's drain and source SL are both held at ground level. The drain voltage is coupled to bitline BL through the select transistor with SG biased at 15V–17V with grounded bitline BL during byte-erase operation.

In program operation, cell's drain voltage requires more than 15V with gate WL at ground level and source floating. 15V drain and channel voltage is coupled from bitline BL via the n-channel select transistor with gate SG tied to 17V and source line SL in floating state to avoid current leakage. The write schemes used in FLOTOX cell are both FN-channel erase and FN-channel program in units of bytes that achieves more than 500K P/E cycles.

Several drawbacks of FLOTOX technology include its non-scalable cell structure which requires 15V–17V in bitline during program operation. Such a high voltage requirement in bitline will drive the cell's junction breakdown higher and channel length larger, which is not suitable for technology below 0.25 um.

Figure 13:
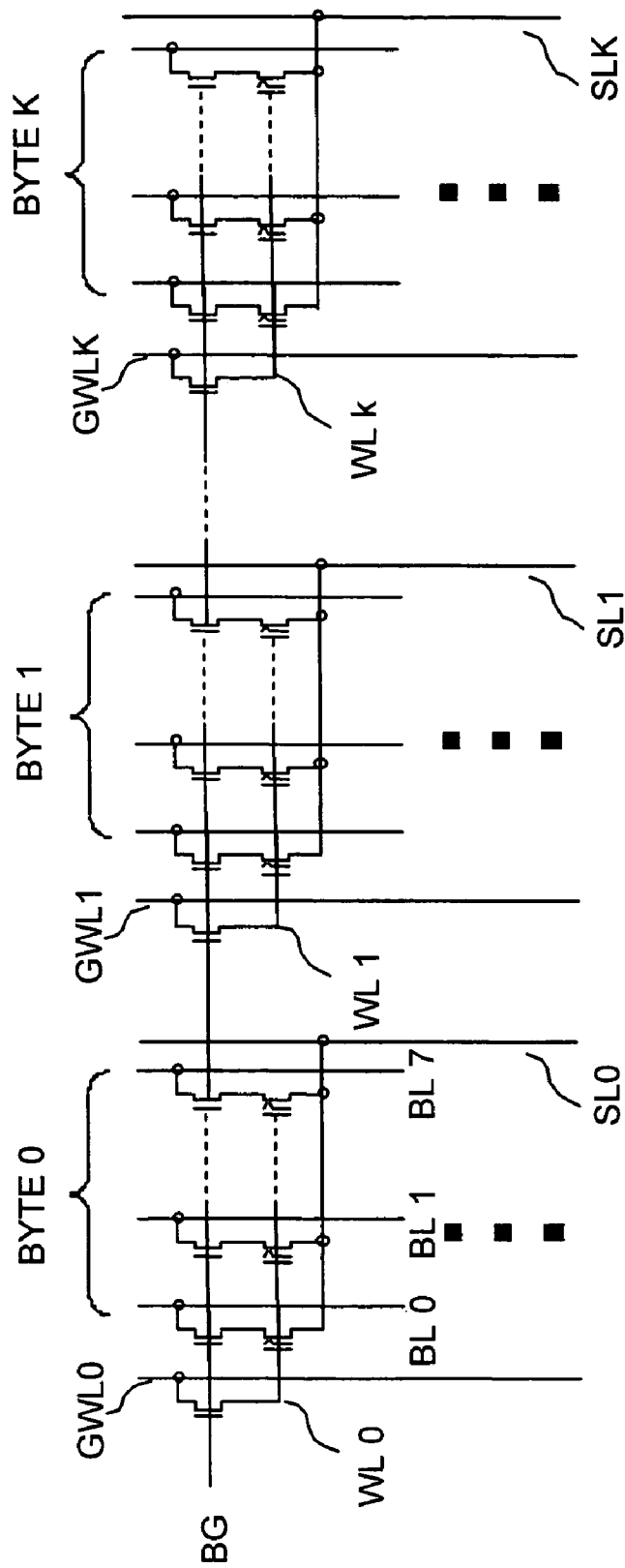
FIG. 13 illustrates a well-known circuit of traditional 2Tr-FLOTOX EEPROM cell array. The array is configured into a matrix with rows of wordlines and columns of bitlines divided into units of bytes. Each byte denoted as BYTEN of eight regular metal1 bitlines connecting to drains of eight cells through eight n-channel transistors with the common gate coupling to BG. The ninth bitline denoted as GWLK is coupled to the common gate WLN of the selected byte of eight floating-gate transistors through a n-channel transistor with its gate connecting to BG. The FLOTOX cells are not formed in the triple well but on the P-substrate. The cell-operating scheme uses FN-channel-erase and FN-channel program.

In addition, the overhead increase in cell array due to the requirement of divided-wordline (not shown in FIG. 1 but shown in FIG. 13) for a single byte write is another concern. Traditionally, the complicated layout connections between byte-wordlines and its decoders are done in a tight-pitch cell array area with high overhead. For example, a ninth metal bitline running vertically in parallel to eight bitlines has to be connected to the drain of a n-channel high-voltage device that can sustain more than 17V. Furthermore, the source of this high-voltage n-channel transistor is then connected to the common gate of eight cells. The channel length is very large and layout connection to poly gate becomes very crowded and is not at the same pace with cell array scalability trends. The cell array schematic is shown in FIG. 13.

In summary, traditional a 2Tr-FLOTOX cell is non-scalable and a byte-wordline has more overhead as technology advances. There is a strong need in finding a new flash-based technology to provide a new decoder scheme and a highly scalable memory cell with a requirement of lower bitline breakdown voltage to replace the expensive FLOTOX cell in higher density and fast speed EEPROM market.

The big challenge in finding an alternative low-cost, highly scalable flash technology to replace the costly non-scalable FLOTOX EEPROM is not obvious and straightforward. Firstly, the Flash-based EEPROM cell has to offer byte-write, e.g., byte-erase and byte-program without any disturbance to the remaining bytes. Secondly, it has to achieve the comparable or better P/E cycles of 500K than FLOTOX. Thirdly, it has to be highly scalable both in cell size as well as cell array overhead. Lastly, which write scheme in the past decade to use from today's varied flash technology is arguable. That explains why today's leading EEPROM technology is still using FLOTOX while FLASH has its own unique technology trend.

The recent Smart card and Smart card business evolution has reached a turning point. A high demand for a sophisticated and secure Smart card market has driven the technology for fast 32 b CPU plus 4 Mb higher density ROM and 4 Mb EEPROM. The die size of the advanced embedded Smart card has to be squeezed into a limited area of less than 25 mm$^2$ to avoid a die crack. Therefore, a flash-based, highly scalable cell and decoder scheme to offer write in units of byte as traditional FLOTOX EEPROM cell does become urgent. Recently, a proposed flash cell technology that uses write scheme of FN-channel erase and FN-channel program has been identified to be a FLOTOX cell replacement. The numbers of transistors of a unit cell are either two or three, with different advantages and disadvantages. In our study, FN-channel erase and FN-channel program as FLOTOX's write schemes are the most critical criteria for selecting the right flash-based EEPROM cell technology. There are several important players such as Infineon and Toshiba already selecting Flash-based EEPROM based on the aforementioned schemes.

Figure 2A:
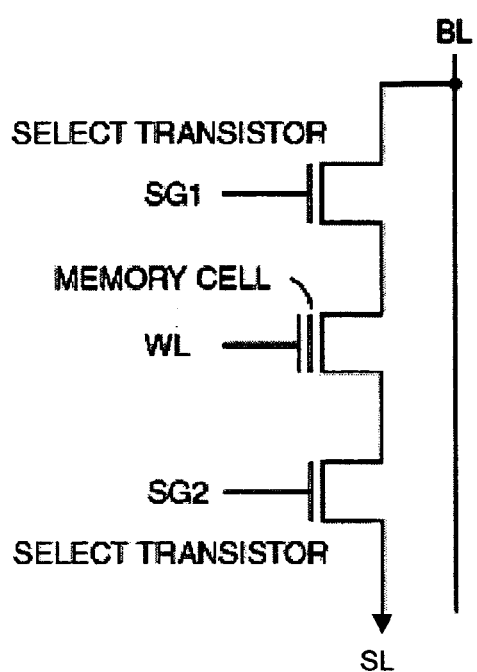
FIG. 2A and FIG. 2B illustrate a circuit schematic and top view of layout of a prior art of Toshiba's 3Tr-NAND cell for byte-writable EEPROM.
Figure 2B:
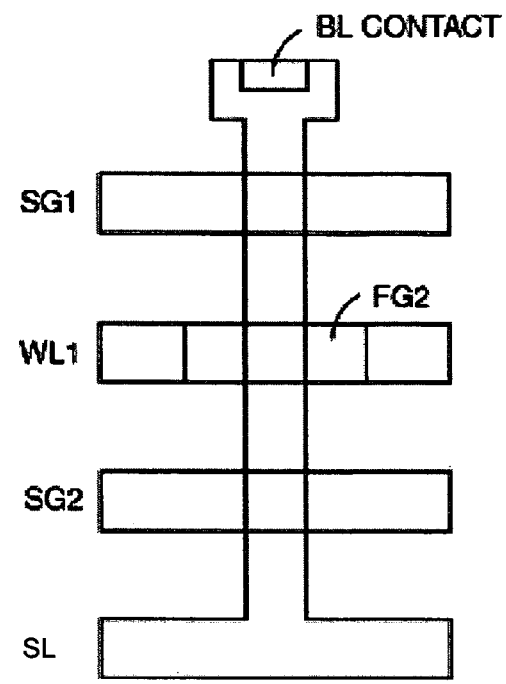
Figure 2C:
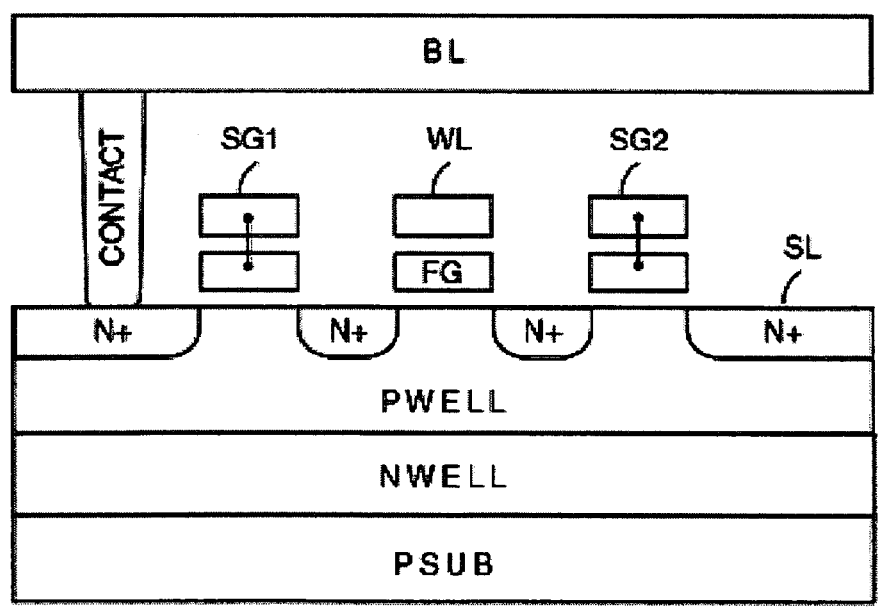
FIG. 2C illustrates the cross-sectional view of 3Tr-NAND cell with drains connected to M1 bitline BL and source connected to SL by n-active layer. The two n-channel transistors and one floating-gate cell are formed in a triple well.

FIG. 2A and FIG. 2B illustrate a circuit schematic and top view of layout of a prior art of Toshiba's 3Tr-NAND cell for byte-writable EEPROM. FIG. 2C illustrates the cross-sectional view of 3Tr-NAND cell with drain connected to M1 bitline BL and source connected to SL by n-active layer. The floating-gate (FG2) and two n-channel transistors with gates tied to SG1 and SG2 are formed in a triple well as indicated in FIG. 2C. The poly1 and poly2 are shorted in both SG1 and SG2 for better flatness in silicon surface. The write schemes used are FN-channel erase and FN-channel program. The details of the potentials of the select gates of SG1 and SG2, bitline BL and sourceline SL and P-well in the above-described erase, program and read operations was shown in their patents U.S. Pat. Nos. 6,370,081 and 6,400,604 but only a few key conditions are duplicated in the following Table 1 for concise description.

TABLE 1

|  | Erase | Program | Read |
| --- | --- | --- | --- |
| 1) Selected byte |  |  |  |
| P-Well | Vers | 0 V | 0 V |
| BL | Vers-Vb | 2 V | VBL |
| SL | Vers-Vb | 2 V | 0 V |
| WL | 0 V | Vprog | 0 V/VDD |
| SG1 | Vers β | 0 V | VDD |
| SG2 | Vers β | 0 V | VDD |
| 1) Unselected byte |  |  |  |
| P-Well | Vers | 0 V | 0 V |
| BL | Vers-Vb | 2 V | VBL/0 V |
| SL | Vers-Vb | 2 V | 0 V |
| WL | Vers β | 0 V | 0 V/VDD |
| SG1 | Vers β | 0 V | 0 V |
| SG2 | Vers β | 0 V | 0 V |

The meaning of above parameters were defined in Toshiba's patent and are repeated below.

Vers: Erase voltage which is around 21V

Vers-Vb: Erase voltages 20.5V of source node and drain node are Vb smaller than Vers.

Vb is the bipolar pn-junction diode drop of 0.5V.

Vers β: The coupling voltages to floating control gate and select gates

Vprog: The program gate voltages of around 20V applied to the selected wordline.

Figure 3A:
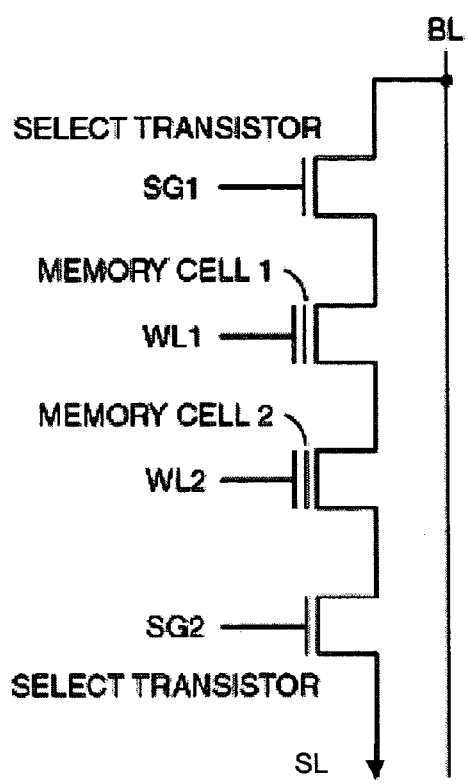
FIG. 3A and FIG. 3B illustrate a circuit schematic and top view of layout of a prior art of Toshiba's 4Tr-NAND cell for byte-writable EEPROM. Two nonvolatile memories are connected in series with two select transistors positioned on top and bottom.
Figure 3B:
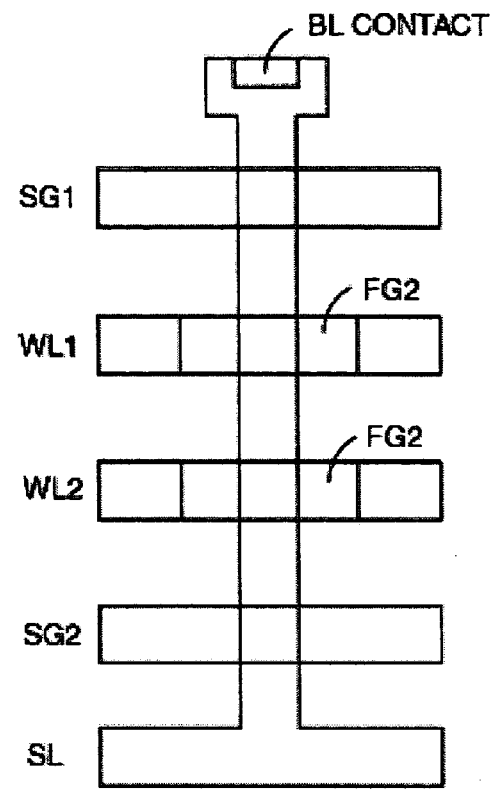
Figure 3C:
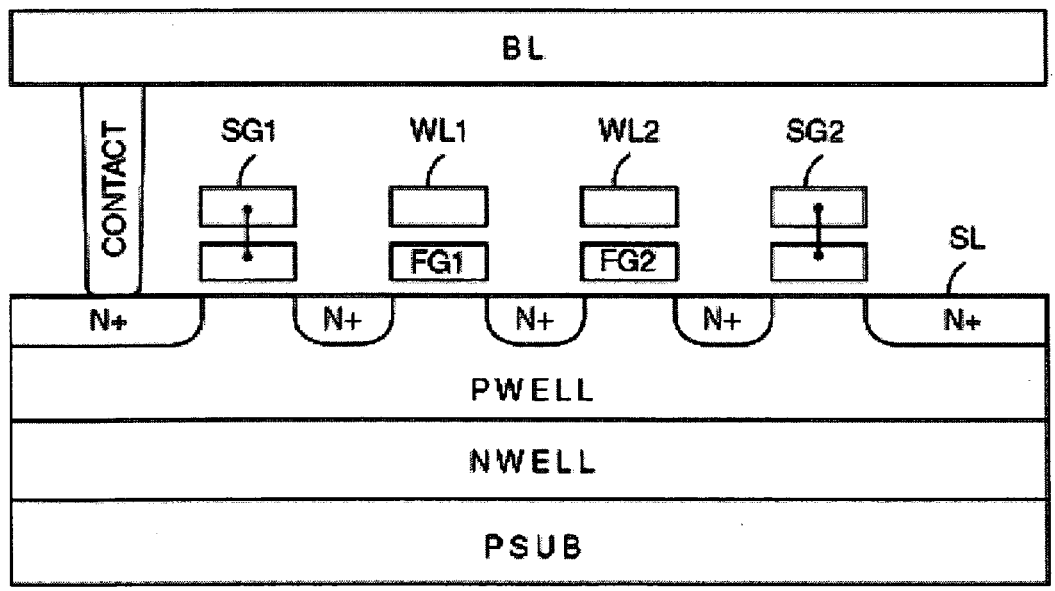
FIG. 3C illustrates the cross-sectional view of 4Tr-NAND cell with drains connected to M1 bitline BL and sources connected to n-active sourceline SL. The n-channel cells are formed in a triple well; Cell in both figures performs FN-channel erase and FN-channel program.
Figure 4A:
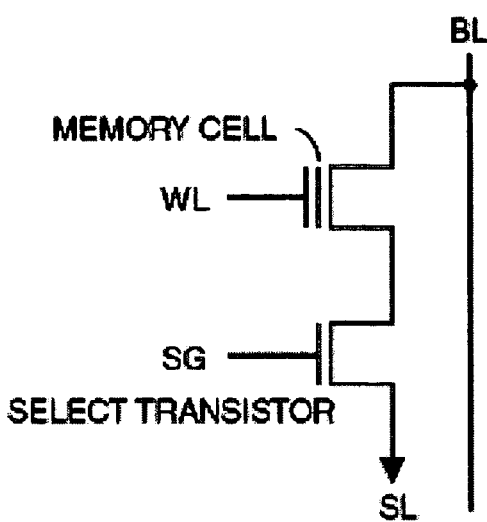
FIG. 4A and FIG. 4B illustrate a circuit schematic and top view of the layout of a prior art of Infineon's 2Tr-NOR flash cell.
Figure 4B:
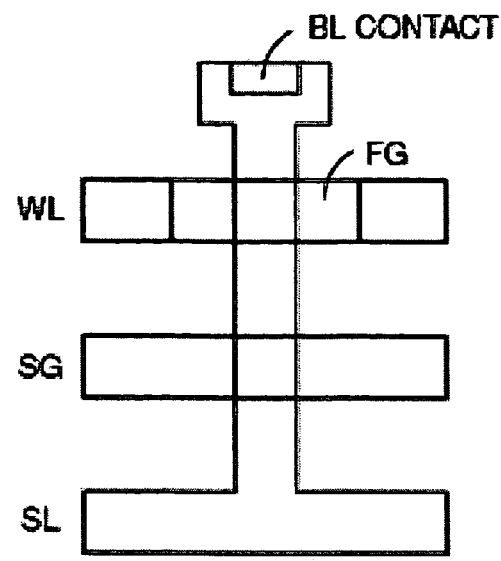
Figure 4C:
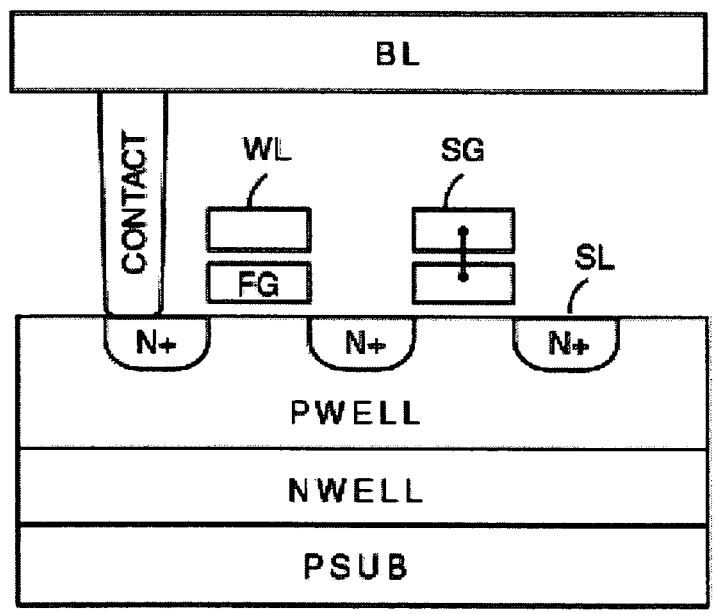
FIG. 4C illustrates its cross-sectional view of cell drains directly connecting to the metal bitlines (BL). Some drain disturb during byte-program operation will occur. The cell's gate is connected to wordline WL and cells are formed in a triple well. Similar to Toshiba, the floating-gate cell in both figures performs FN-channel erase and FN-channel program.

FIG. 3A and FIG. 3B illustrate a circuit schematic and top view of layout of a prior art of Toshiba's 4Tr-NAND cell for byte-writable EEPROM, U.S. Pat. Nos. 6,370,081 and 6,400,604. Two nonvolatile memories are source/drain connected alternatively in series with two select n-channel transistors positioning on top and bottom. FIG. 3C illustrates the cross-sectional view of 4Tr-NAND cell with drains connected to M1 bitline BL and sources connected to n-active sourceline SL. The two n-channel transistors and two floating-gate cells of FG2 are formed in a triple well. The floating-gate flash cell in both figures performs write schemes of FN-channel erase and FN-channel program. This approach is further to reduce the effective cell size from 3Tr-NAND. The details of the potentials of the select gates of SG1 and SG2, WL1, WL2, bitline BL and sourceline SL and P-Well in the above-described erase, program and read operations were shown in the disclosed patent and will not be described here;

FIG. 4A and FIG. 4B illustrate a circuit schematic and top view of layout of a prior art of Infineon's 2Tr-NOR flash cell. The patent number is U.S. Pat. No. 6,307,781 with title of "Two Transistor Flash Memory Device" and was granted on Oct. 23, 2001. FIG. 4C illustrates its cross-sectional view of cell's drain directly connecting to metal bitline BL. Although this prior art saves some cell area it suffers drain disturb during byte-program operation. The cell's gate is connected to wordline WL and formed in a triple well. Similar to Toshiba's write scheme, the floating-gate nonvolatile cell in both figures performs FN-channel erase and FN-channel program. The operating voltage conditions of WL, SG, BL and P-well are quite different from Toshiba's one and are shown in the following Table 2 as a simplified version.

TABLE 2

|  | Erase | Program | Read |
| --- | --- | --- | --- |
| 1) Selected cell |  |  |  |
| P-Well | +3 V | −3 V | 0 V |
| BL | +3 V | −3 V | +1.5 V |
| SL | +3 V | floating | 0 V |
| WL | −13 V | +13 V | VDD |
| SG | +3 V | −3 V | +3 V |
| 1) Unselected cell |  |  |  |
| P-Well | +3 V | +3 V | 0 V |
| BL | +3 V | −3 V | 0 V |
| SL | +3 V | floating | 0 V |
| WL | 0 V to +3 V | +13 V | 0 V |
| SG1 | +3 V | −3 V | 0 V |

As indicated in Table 2, it shows the 2Tr-NOR, nonvolatile floating-gate cells and n-channel select transistors formed in the divided triple P-well as Toshiba's ideas. This conclusion was based on the fact that different P-well voltages of +3V and −3V have to be coupled to selected and non-selected cells respectively as shown in the above Table 2. The cells of divided triple P-wells will suffer the drawback of big P-well spacing, thus increasing the penalty of cell array size. In addition, the unselected cells suffer disturbance during repeated program and erase operations. Consequently, the endurance of program and erase cycles will be drastically reduced although Infineon claims the disturbance is minor.

In summary, this 2Tr-NOR cell of prior art has a smaller cell size than the counterparts of Toshiba or FLOTOX but still suffers from a large cell array overhead due to the requirement of divided triple P-wells and area of byte-wordline decoders.

Figure 6A:
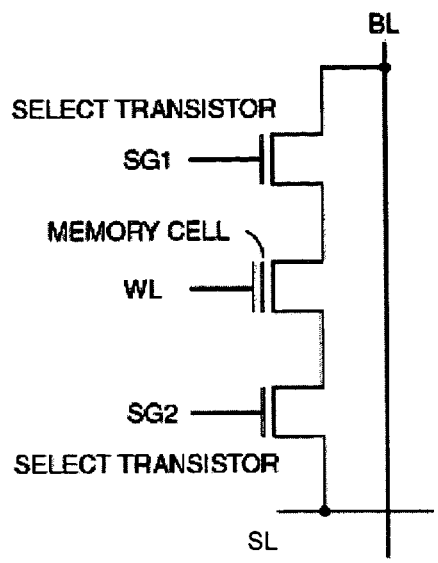
FIG. 6A and FIG. 6B illustrate a preferred embodiment of the present invention with respective circuit schematic and top view of the cell layout. Unlike Toshiba's 3Tr-NAND cell, this is a novel 3Tr-OR cell copied from Aplus' previous pending patent with the same inventors for byte-writable EEPROM.
Figure 6B:
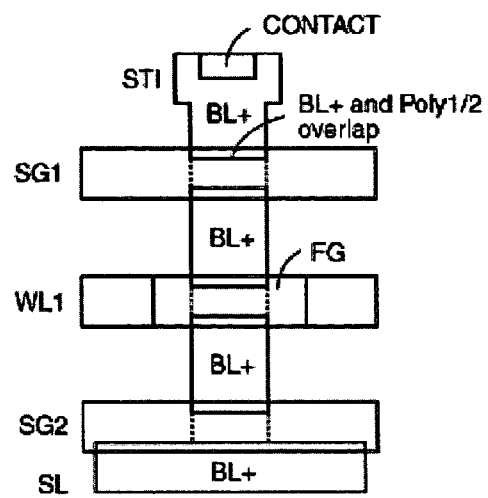
Figure 6C:
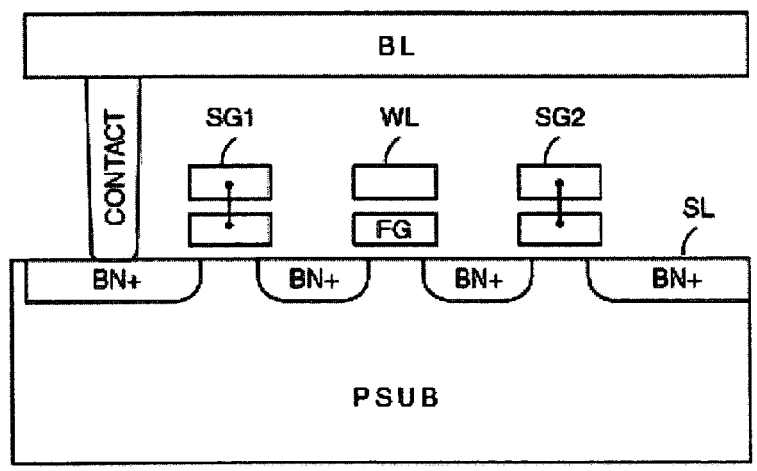
FIG. 6C illustrates the cross-sectional view of the 3Tr-OR cell of the present invention. The cell structure is designed to be the same as Aplus' pending FLASH cell with vertical gate and BN+ S/D patents by the same inventors, Ser. Nos. 09/852,247 and 09/891,782. The floating gate transistor of the 3Tr-OR cell employs the same operating scheme of FN-channel erase and FN-channel program like FLOTOX EEPROM cell with much lower bitline voltages. The 3Tr-OR n-channel cells are not formed in a triple well and is simply made on P-substrate as FLOTOX EEPROM cell to save cell array area.

FIG. 5A and FIG. 5B illustrate a circuit schematic and top view of the layout of another prior art Philip's 2Tr-NOR flash cell, U.S. Pat. Nos. 6,174,759 and 6,326,661. FIG. 5C illustrates its cross-sectional view with cell drain is directly connected to metal bitlines (BL) suffering drain disturb during byte-program operation. The cell's gate is connected to wordline WL. The cell's structure and the operating scheme are different from Infineon's counterpart;

FIG. 6A illustrates an example of the preferred embodiment of the present invention. The circuit schematic and top view of cell layout are shown in FIG. 6B. Unlike Toshiba's 3Tr-NAND cell, this is a novel 3Tr-OR cell copied from Aplus' previous pending patents Ser. Nos. 09/852,247 and 09/891,782 with the title of "3-step write" as listed above and was invented by the same inventors of the present invention for byte-writable EEPROM. FIG. 6C illustrates the cross-sectional view of BN+ S/D 3Tr-OR cell of the present invention. The nonvolatile cell structure is designed to be the same as Aplus' pending FLASH cell with floating-gate and BN+ S/D. The top and bottom select transistors are n-channel devices with BN+ S/D like FLASH cell of the pending patent. The floating-gate transistor of the 3Tr-OR cell employs the same operating schemes of FN-channel erase and FN-channel program like FLOTOX EEPROM cell but with much lower bitline voltages.

For example, zero bitline voltage is coupled to the cell that requires program and about +5V to bitline for those cells requiring program inhibit. All cells' Vt are decreased after erase operation. The program cell's Vt will be increased and any unprogrammed cells' Vt will remain the same as the erased Vt cells without disturb. The gate (WL) of selected nonvolatile cells are coupled with −20V for FN-channel erase to expel electrons out from floating gates.

Figure 6D:
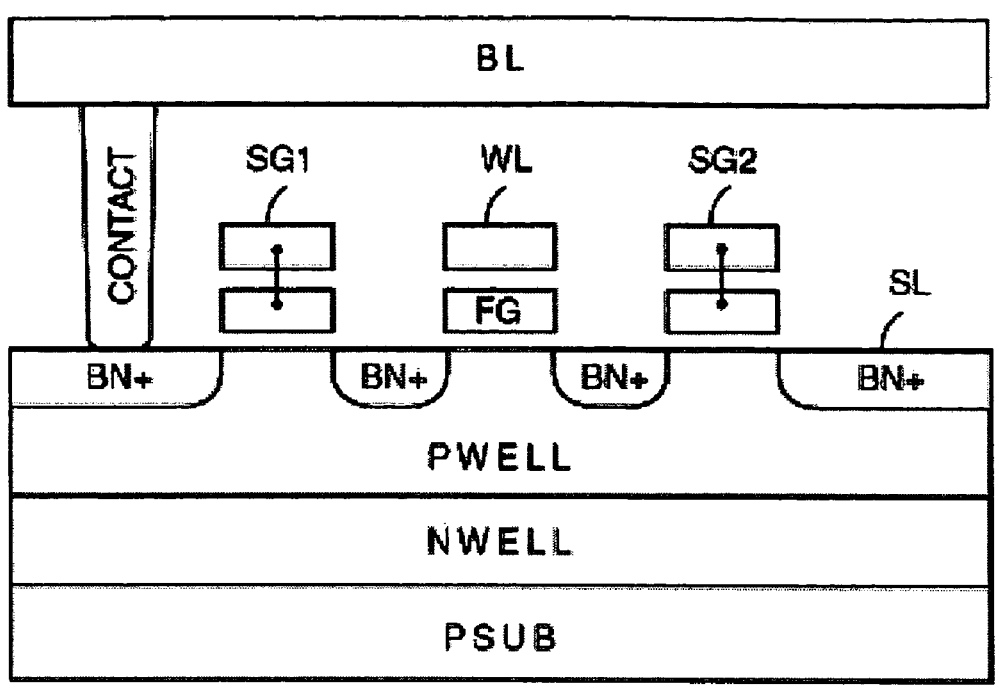
FIG. 6D shows that all 3Tr-OR n-channel cells of the present invention can also be formed in one big triple well without division in units of bytes as Toshiba's one.

The details of the potentials of the select gates of SG1 and SG2, bitline BL, sourceline SL, and wordline WL in the above described erase, program and read operations are shown in the following Table 3. Since the cells are not formed in the triple wells, the divided well spacing is not required in the present invention. If the EEPROM cells of the present invention are made the same as the FLASH cells of the present invention, then the EEPROM cells can be formed in a large triple well without any divided well as shown in FIG. 6D. The floating-gates and SG1 and SG2 are tied together through Poly1 contact holes. The P-well can be held to ground level in all operations such as program, erase and read. The write schemes of the present invention use FN-channel erase and FN-channel program in units of bytes like FLOTOX. Since the gates, drains, sources and P-well are all biased at ground level, the P/E disturbance will not occur to the non-selected cells. Thus high P/E cycles can be achieved.

TABLE 3

|  | Erase | Program | Read |
|---|---|---|---|
| 1) Selected cells | | | |
| P-sub | 0 V | 0 V | 0 V |
| BL | 0 V | 0 V/VDD | +1.5 V |
| SL | 0 V | ~2 V | 0 V |
| WL | −18 V | +18 V | VDD |
| SG1 | VDD | VDD | VDD |
| SG2 | VDD | 0 V | VDD |

TABLE 3-continued

|  | Erase | Program | Read |
|---|---|---|---|
| 1) Unselected cells | | | |
| P-sub | 0 V | 0 V | 0 V |
| BL | 0 V | 0 V | 0 V |
| SL | 0 V | 0 V | 0 V |
| WL | 0 V | 0 V | 0 V |
| SG1 | 0 V | 0 V | 0 V |
| SG2 | 0 V | 0 V | 0 V |

Figure 6E:
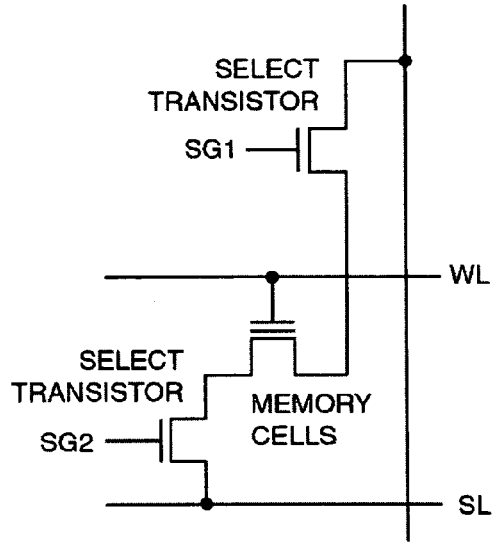
FIG. 6E and FIG. 6F illustrate another preferred embodiment of the present invention with respective circuit schematic and top view of cell layout. In contrast to the cell shown in FIG. 6A and FIG. 6B, the FLASH cell layout has a horizontal floating gate transistor with two vertical select-gate transistors.
Figure 6F:
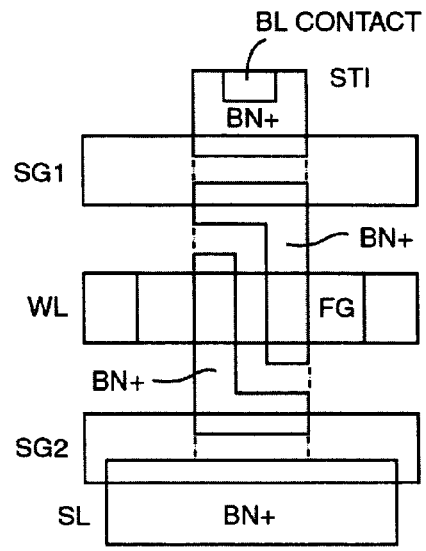

FIG. 6E and FIG. 6F illustrate another preferred embodiment of 3Tr-OR of the present invention with respective circuit schematic and top view of another cell layout. In contrast to the cell layout shown in FIG. 6A and FIG. 6B, FIG. 6F illustrates a preferred cell layout with a horizontal, BN+ S/D, floating gate transistor along x-direction associated with two vertical, BN+ S/D, select-gate transistors.

Figure 6G:
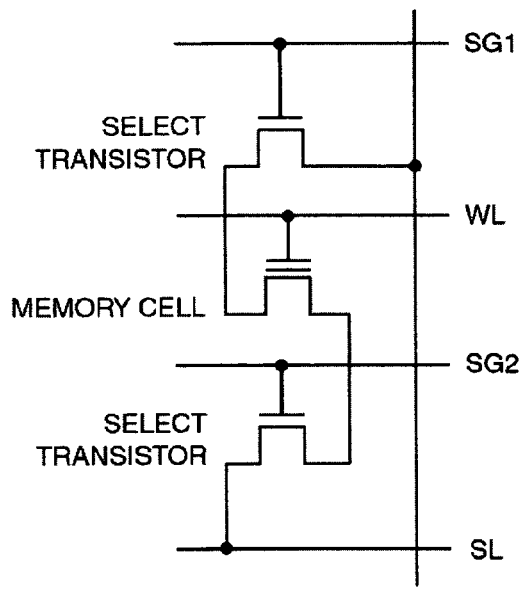
FIG. 6G and FIG. 6H show another preferred cell layout with all three transistors made into horizontal-gate. The floating gate flash cells all consistently use the same operating schemes of FN-channel erase and FN-channel program in units of bytes.
Figure 6H:
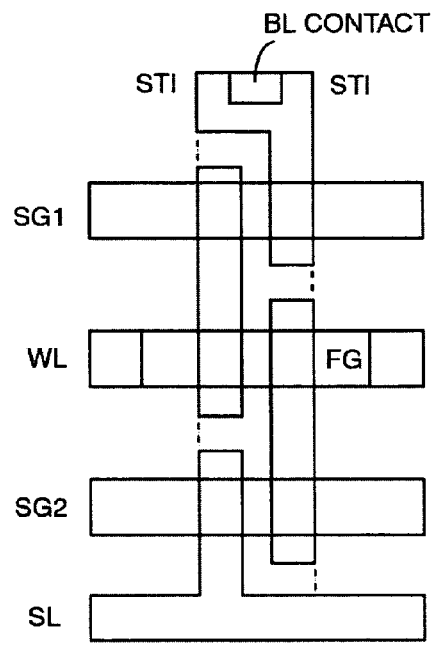

FIG. 6G shows a further preferred cell layout of 3T-OR with all three BN+ S/D transistors' horizontal-gates made along x-direction as seen from FIG. 6H. The floating gate flash cells are all designed to perform same operating schemes of FN-channel erase and FN-channel program in units of bytes without any disturbances. The disadvantage is that the cell sizes of FIG. 6G and FIG. 6H are larger than the FIG. 6B counterpart. The advantage is the consistent cell characteristics with the FLASH cell. A unified cell technology can be accomplished for a combo nonvolatile memory comprised of FLASH and EEPROM. In addition, the x-pitch of 3Tr-OR EEPROM cell can be made the same as 1Tr-Flash of the present invention. The page buffer for storing the page data and sense amplifiers to distinguish the cell data can be shared between FLASH and EEPROM to further reduce the die size. More details of 3Tr-OR operation of the present invention will be described with reference to the drawings of FIG. 16 to FIG. 25.

Figure 7A:
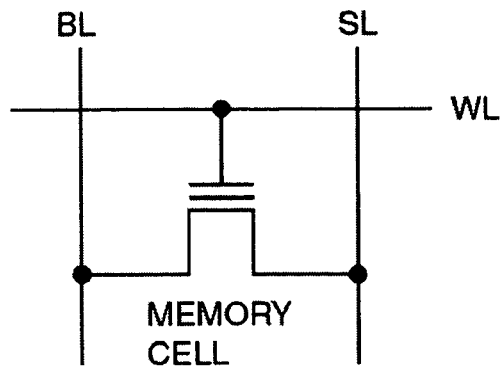
FIG. 7A and FIG. 7B illustrate an equivalent circuit and the top view of a 1-Tr FLASH memory cell based on same BN+ S/D technology as 3Tr-OR of the present invention. The FLASH cells are completely formed in a flat-cell array without a divided triple well. The FIG. 7C shows a cross-sectional view of a single FLASH cell with STI isolation. The FLASH cell uses the same operating scheme of FN-channel erase and FN-channel program in block and page size respectively.
Figure 7B:
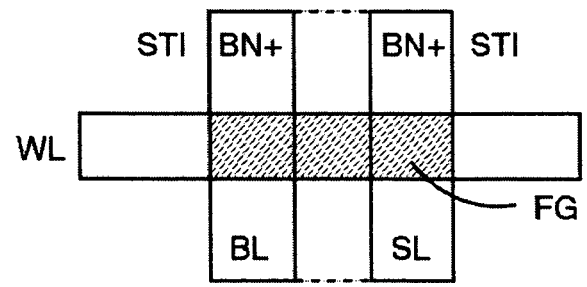
Figure 7C:
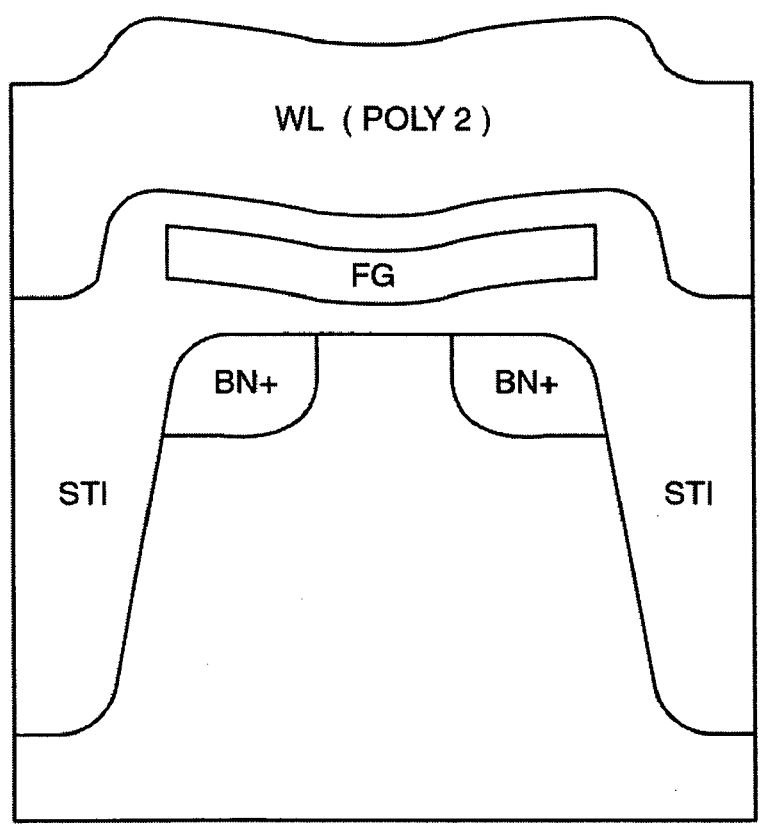

FIG. 7A and FIG. 7B illustrate an equivalent circuit and the top view of a 1-Tr-OR, BN+ S/D FLASH by using the same technology as 3Tr-OR of the present invention. The FLASH cells are completely formed in a flat-cell array without a divided triple well. FIG. 7C shows a cross-sectional view of a single FLASH cell with STI isolation between the common sourcelines and bitlines. FIG. 7C illustrates the cross-sectional view of a preferred BN+ S/D FLASH cell. The FLASH cell uses the same operating schemes of FN-channel erase and FN-channel program based on block and page size respectively. The operating voltages of the FLASH cell is consistent with Table 3 of 3Tr-OR cell.

Figure 8A:
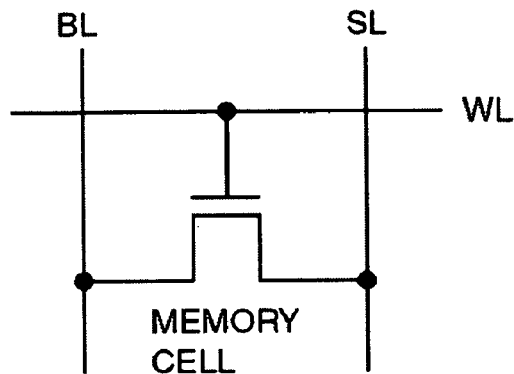
FIG. 8A and FIG. 8B illustrate an equivalent circuit and the top view of a 1-Tr ROM memory cell based on the same BN+ S/D technology as 3Tr-OR or 1Tr-FLASH of the present invention. The FIG. 8C shows a cross-sectional view of a single ROM cell in a big flat-cell array on P-substrate without any STI isolation. The data of ROM cell can only be altered by new photo mask changes at the fab site. In order to be consistent with BN+ EEPROM and BN+ FLASH cells on the same chip, the mask ROM cell can be made inside a large triple well.
Figure 8B:
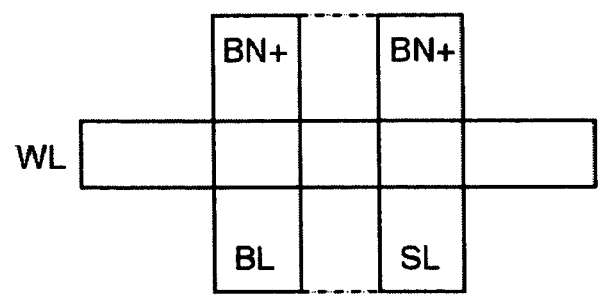
Figure 8C:
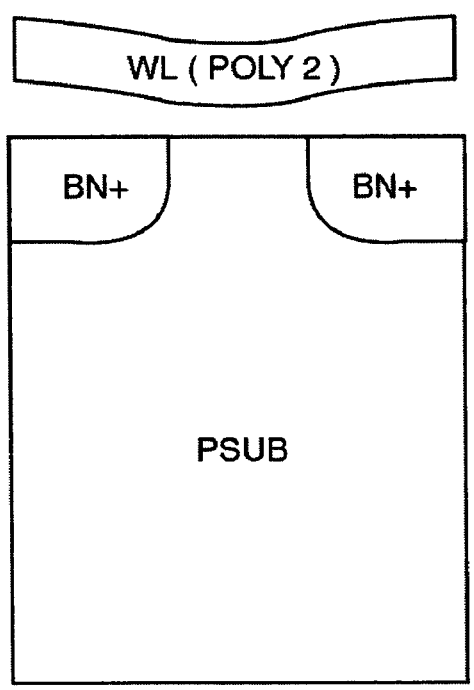

FIG. 8A and FIG. 8B illustrate an equivalent circuit and the top view of a 1-Tr ROM memory cell based on the same BN+ S/D technology as 3Tr-OR EEPROM or 1Tr-OR FLASH of the present invention. This is a single-poly gate n-channel transistor used to store code program. FIG. 8C shows a cross-sectional view of a single ROM cell in a large flat cell array on P-substrate without any STI isolation. The data of the ROM cell can only be altered by new photo mask changes at the fab site. The cell array is a NOR-type array. The data change is achieved by the Boron implant method. The cell channel obtains Boron code implant, increasing the cell's Vt to 4V+, e.g., the data is changed from 0 to 1. In order to make the process consistent with BN+ S/D EEPROM and BN+ S/D FLASH cells on the same chip, the mask ROM cell can be made inside a large trip well.

In summary, there is no need to erase and program ROM cell electrically. The cell size of ROM is much smaller than FLASH and EEPROM because no high-voltage operation is required in the ROM application. The Boron implant can be performed after Poly2 deposition to shorten the through-put. For a combo nonvolatile memory comprised of ROM, FLASH and EEPROM, the three cell arrays are all NOR-type, thus achieving faster speed than NAND.

FIG. 9A and FIG. 9C illustrate two kinds of distributions of EEPROM cells' threshold voltages (Vt) of the present invention. FIG. 9A shows that the Vt of erase cells are all in negative state of data "1". The Vt of all the program cells is in positive with data "0". FIG. 9B shows that the Vt of erase cells is partly in positive and partly in negative states of data "1". The Vt of the program cells is all positive and larger than Vdd with data "0". FIG. 9B and FIG. 9D show the equivalent circuits and read operating conditions for three gates of 3Tr-OR EEPROM cell of the present invention. Only the wordline gate voltage is different to ensure the right reading corresponding with positive and negative Vts in FIG. 9A and FIG. 9B.

Figure 10A:
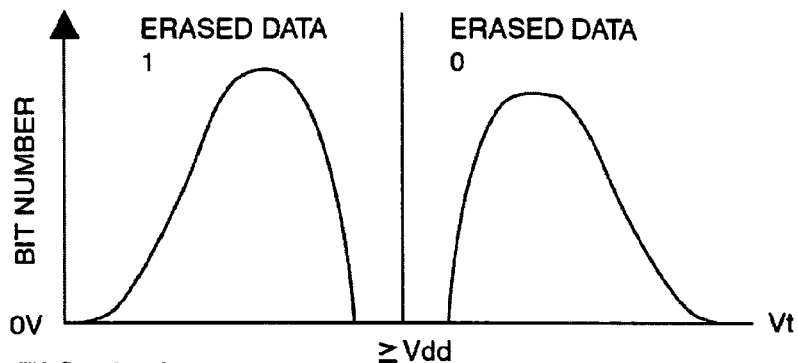
FIG. 10A illustrates the Vt distributions of the FLASH cell of the present invention. Unlike EEPROM Vt, the Vts of both erase and program of all Flash cells are in positive states. Negative Vt is not allowed.
Figure 10B:
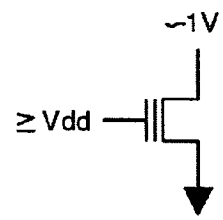
FIG. 10B shows the equivalent circuit for reading the FLASH cell of the present invention.

FIG. 10A illustrates the Vt distributions of the 1Tr-OR FLASH cell of the present invention. Unlike 3Tr-OR EEPROM Vt, the Vt distributions of all 1Tr-OR Flash cells, both erased and programmed, are in positive states. The negative Vt is not allowed to avoid current leakages that would result in a false reading. In Aplus' pending 1Tr-OR patents Ser. Nos. 09/852,247 and 09/891,782, a novel 3-step write is employed to prevent over-erase in the traditional NOR-type flash cell array. The 3-step write scheme ensures the cell's Vt is programmed on a bit-by-bit basis, thus each cell's Vt can be fully controlled in a very accurate state. The erase is performed to increase the cells' Vt in large block sizes (64 KB). A reverse program decreases cells' Vt and is performed only to the selected page (128 B) of wordline and then followed by a bit-by-bit FN-channel program operation. The three steps of erase, reverse program and program operations use FN-channel erase and FN-channel program to achieve high P/E cycles like the 3Tr-OR EEPROM cell of the present invention. The details can be referenced to the pending patent of "3-step Write" by the same inventors of the present invention FIG. 10B shows the equivalent circuit for reading 1Tr-OR BN+ S/D FLASH cell of the present invention.

Figure 11A:
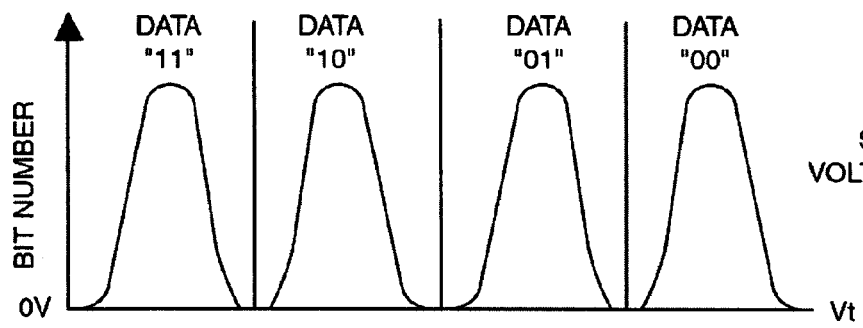
FIG. 11A illustrates the multiple Vt distributions of the FLASH cell of the present invention. Unlike EEPROM Vt, all Vts of both erase and program of Flash cells are in a positive state with some Vt margin. Negative Vt is not allowed. The figure shows four Vts of FLASH cell. The number of Vts can be increased depending on the application and reliability requirements. The four data have to be read out slowly and sequentially four times.
Figure 11B:
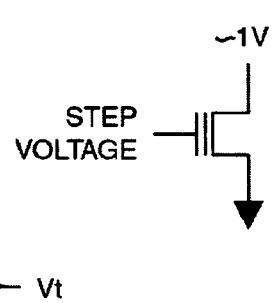
FIG. 11B shows the equivalent circuit for reading the FLASH cell with multiple Vts of the present invention.

FIG. 11A illustrates the multiple Vt distributions of the 1Tr-OR FLASH cell of the present invention. Unlike EEPROM Vt, all Vts of both erase and program of 1Tr-OR Flash cells are in a positive state with more than 0.5V Vt margin between any adjacent state. The negative Vt is not allowed to avoid false reading in this NOR-type cell array. The figure shows only four Vts of 1Tr-OR FLASH cell. The number of Vts can be increased depending on the application and reliability requirements. The four data—11, 10, 01 and 00—can be read out slowly and sequentially four times. The operating voltages of FIG. 11B shows the equivalent circuit for reading a 1Tr-OR multiple-level FLASH cell with a plurality of Vts of the present invention. The gate voltage is increased by step. Each step increments the gate voltage to the level higher than the previous Vt but smaller the next higher Vt for accurate read. The reading time will be proportional to the number of Vt states. The cell drain is biased below 1V to avoid soft writing during this multiple-Vt-cell read operation.

Figure 11C:
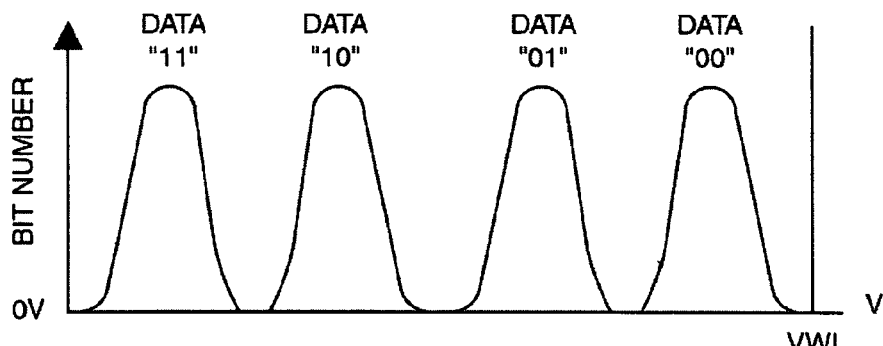
FIG. 11C illustrates the same multiple Vt distributions as FIG. 11A of the FLASH cell of the present invention. Unlike FIG. 11A, it is a fast read design, four cell data can be read out within one cycle by applying a voltage higher than the highest cell Vt to the selected wordline. Negative Vt is not allowed. The figure shows 4 Vts of the FLASH cell. The number of Vts can be increased depending on the application and reliability requirements.
Figure 11D:
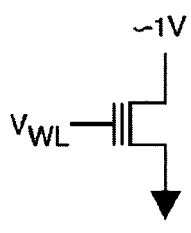
FIG. 11D shows the equivalent circuit for reading the FLASH cell with multiple Vts of the present invention.

FIG. 11C illustrates the same multiple Vt distributions as FIG. 11A of 1Tr-OR FLASH cell of the present invention. Unlike FIG. 11A, it is a fast read design. Four cell data can be read out within one cycle by applying a voltage higher than the highest cell Vt (data 00) to the selected wordline VWL. Negative Vt is not allowed. The figure shows 4 Vts of 1Tr-OR FLASH cell. The number of Vts can be increased depending on the application and reliability requirements. FIG. 11D shows the equivalent circuit for reading FLASH cell with multiple Vts of the present invention.

Figure 12A:
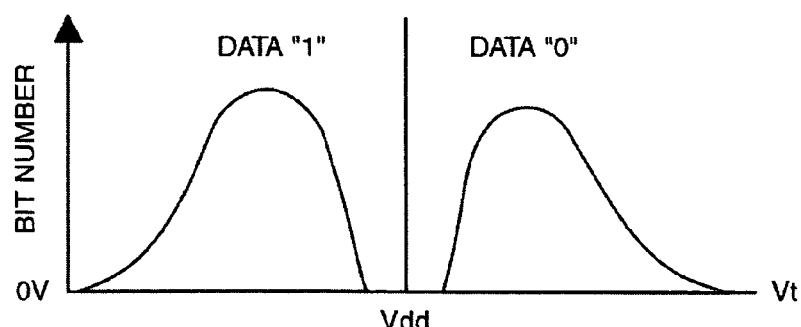
FIG. 12A illustrates the allowed Vt distributions of the ROM cell of the present invention. All Vts of the ROM cells are in positive states. Negative Vt is not allowed.
Figure 12B:
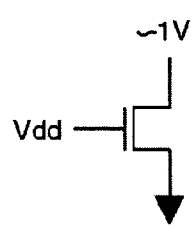
FIG. 12B shows the equivalent circuit for reading the ROM cell of the present invention.

FIG. 12A illustrates the allowed Vt distributions of the ROM cell of the present invention. All Vts of ROM cells are in positive states. In order to have positive cell Vt, the Boron implant is adopted to implant through channel. Vt is usually increased more than 4V for low voltage operation. To shorten the throughput, Boron is implanted after the poly-gate deposition. Negative Vt is not allowed because the ROM cell array is again a NOR-type array like 1Tr-OR FLASH and 3Tr-OR EEPROM. The whole cell array is formed on either a P-substrate or Triple well to be consistent with EEPROM and FLASH for process integrity. FIG. 12B shows the equivalent circuit for reading ROM cell of the present invention.

The previous paragraphs were focused on cell structures, cell write schemes, erase sizes, P/E cycle requirements and comparisons between prior arts and the present invention. The next paragraphs will center on the detailed description of cell arrays of all prior art and the present invention as related to EEPROM technology.

FIG. 13 illustrates a well-known circuit of traditional 2Tr-FLOTOX EEPROM cell array. The array is configured into a matrix with rows of wordlines and columns of bitlines divided into units of bytes. Each byte is denoted as BYTEN of eight regular metal1 bitlines connecting to drains of eight cells through eight n-channel transistors with the common gate coupling to BG. The ninth bitline denoted as GWLK is coupled to the common gate WLN of the selected byte of eight floating-gate transistors via an n-channel transistor with its gate connecting to BG.

In byte-erase operation, a single byte of eight cells will be selected to perform fast FN-channel erase in 5 mS with very small current consumption. The selected byte-wordline WLK of eight cells will be coupled to around 17V and the drains and sources of eight selected cells will be held at the ground level. Assuming BYTE 0 is selected for erase, the voltages of BL0 through BL7 will be biased at ground level and WL0 is coupled to 17V. The positive high-voltage 17V on the Poly2-gate and 0V in the channel-regions of eight selected floating-gate transistors will establish a sufficient electric field, thus inducing a tunneling effect to increase the Vt of all eight cells selected by byte-wordline WL0 in BYTE0. In order to have 17V on WL0, an equivalent or higher voltage has to be applied to GWL0 with BG voltage coupled to a voltage (~18V) one Vt higher than 17V to avoid the Vt drop due to the n-channel pass-gate.

In byte-program operation, the selected erased byte of eight cells with initial Vts at high state (~3V) will be selected to perform FN-channel program in 5 mS with very low current consumption. In contrast to erase operation, the selected gate WL0 of eight cells will be coupled to around 0V and the drains and sources of the eight selected cells will be held at either ground level or 15V depending on the data. If the selected cells are to be programmed to low Vt, then the corresponding bitline voltages have to be coupled to 15V. If the cells' Vt is intended to remain high, then the corresponding bitline voltages have to be held at ground level without causing tunneling effect. Both channel-erase and channel-program have a low operating current of around 10 pA per cell.

During BYTE0 program and erase operations, the remaining bytes of BYTE1 to BYTE K are all held at ground level to avoid any bitline and byte-wordline disturb. If more numbers of bytes are to be selected for erase in the same wordline of WL0, then the corresponding GWLK has to be coupled to 17V as WL0 with common gate voltage BG held at 18V.

In one-page program operation, the selected BG is coupled to 18V and the rest of the BGs are held at ground level to eliminate bitline high-voltage disturb to the non-selected bytes of EEPROM cells located in different word-lines. In the array layout, the pass-transistors used to couple the high-voltage to the selected byte-wordlines are laid out with eight cells and divided bitline transistors in a very crowded, tight-pitch array area. When technology advances to small geometry, the penalty of the pass-transistors becomes a large overhead to EEPROM memory.

There are two main disadvantages of FLOTOX EEPROM. The first is the high-voltage bitline voltage of 17V required for program operation, which drives the breakdown voltage of cell's junction and punch-through voltage of cell's channel-length, making it unscalable for technology below 0.25 um. Secondly, the very high breakdown device of 18V for byte-wordline pass-gate transistor drives the cell array layout overhead drastically higher. The FLOTOX cells are not formed in the triple well but on P-substrate. The cell operating scheme uses FN-channel-erase and FN-channel program for superior P/E cycles.

In conclusion, there exists a strong and urgent market need for highly-scalable FLASH-based cell and technology to achieve comparable performance to traditional FLOTOX technology.

Figure 14:
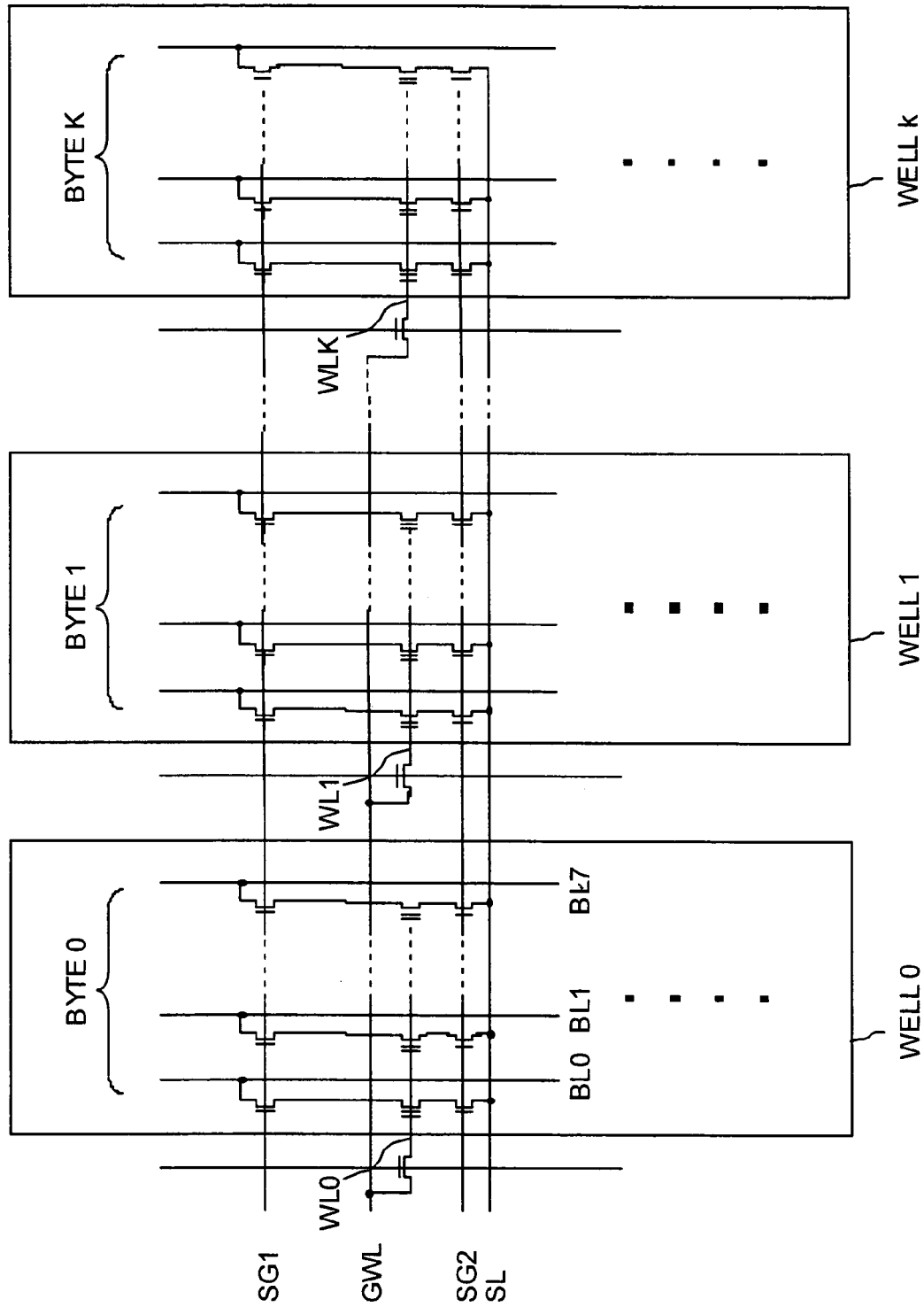
FIG. 14 illustrates a prior art circuit of Toshiba's 3Tr-NAND EEPROM cell array with a plurality of vertically divided triple wells in units of bytes. Between the vertically divided triple wells is a n-channel transistor having source connecting to common gate, WLN, of eight floating-gate transistors and drain connecting to common signal of GWL. Each byte denoted as BYTE K has eight regular metal1 bitlines coupling to drains of eight cells through eight n-channel transistors with the common gate coupling to SG1. The cell-operating scheme uses FN-channel-erase and FN-channel program.

FIG. 14 illustrates a prior circuit of Toshiba's 3Tr-NAND EEPROM cell array with a plurality of vertically divided triple wells in units of bytes. Between the vertically divided triple wells is a n-channel transistor having source connecting to common gate, WLN, of eight floating-gate transistors and drain connecting to global signal of GWL running horizontally across the cell array in the x-direction. Each byte denoted as BYTE K has eight regular metal1 bitlines coupling to drains of eight cells through eight n-channel transistors with the common gate coupling to SG1. The cell operating scheme uses FN-channel-ease and FN-channel program. The plurality of n-channel transistors with gates tied to select signals are physically placed between two adjacent high voltage (+21 V) triple-wells, causing significant overhead. The overall percentage of overhead increase of the byte-decoder circuits located in between the triple well is more than 200% of one byte pitch, which is very costly.

Figure 15:
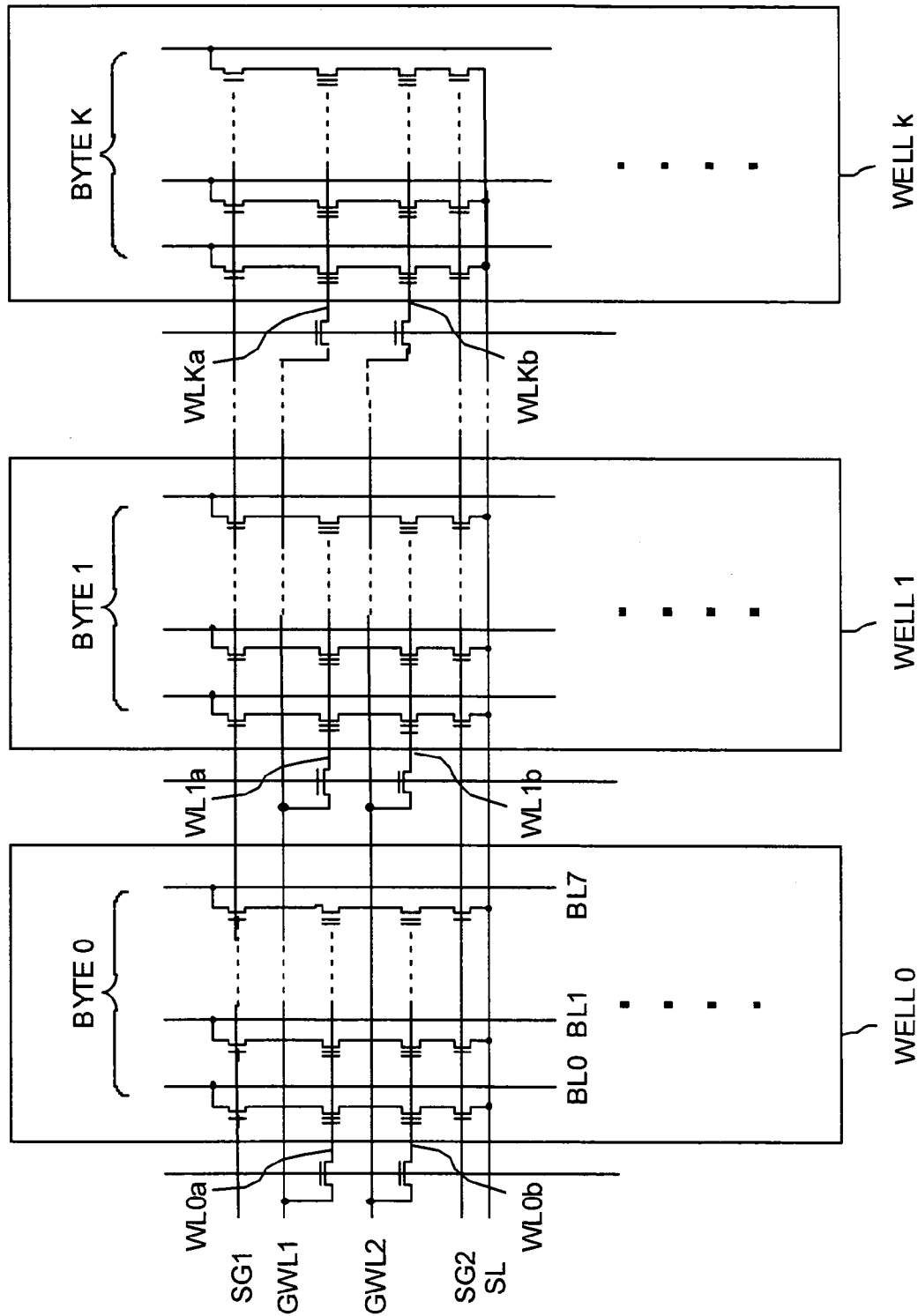
FIG. 15 illustrates a prior art circuit of Toshiba's 4Tr-NAND EEPROM cell array with a plurality of vertically divided triple wells in units of bytes. Between the vertically divided triple wells are two n-channel transistors having source connecting to respective common gates of WL0$a$ and WL0$b$ of individual byte. Each byte denoted as BYTE K has eight regular metal1 bitlines coupling to drains of top eight cells through eight n-channel transistors with the common gate coupling to SG1. The cell-operating scheme uses FN-channel-erase and FN-channel program.

FIG. 15 illustrates a prior art circuit of Toshiba's 4Tr-NAND EEPROM cell array with a plurality of vertically divided triple wells in units of bytes. Between the vertically divided triple wells are two n-channel transistors having sources connecting to two respective byte-wordlines with notations of WL0a and WL0b. Each WL0a or WL0b is connected to gates of eight floating-gate transistors and drains connected to global signals of GWL1 and GWL2 running horizontally across the cell array in the x-direction. Each byte denoted as BYTE K has eight regular metal1 bitlines coupling to drains of eight cells through eight n-channel transistors with the common gate coupling to SG1. Each byte denoted as BYTE K has eight regular metal1 sourcelines coupling to sources of eight cells through eight n-channel transistors with the common gate coupling to SG2. The cell operating scheme uses FN-channel erase and FN-channel program. The plurality of n-channel transistors with gates tied to select signals are physically placed between two adjacent high voltage (+21V) triple-wells, thus the overhead becomes significant. Although 4Tr-OR further reduces the effective EEPROM cell size from the 3Tr-NAND, the overall percentage of the overhead increase of the byte-decoder circuits located in between the triple well is still more than 100% of one byte pitch, again very costly. Therefore, creating a new scheme and layout technique to further reduce the array penalty of 3Tr-NAND and 4Tr-NAND poses a tough design and technology challenge.

Aplus has pending patents of 1Tr-OR BN+ S/D FLASH cell and array, Ser. Nos. 09/852,247 and 09/891,782. Unlike Hitachi's 1Tr-AND approach, it has a 3-step scheme of FN-channel erase, FN-channel reverse program and FN-channel program, with a relaxed metal bitline pitch one half of Hitachi's counterpart. The same process and 1Tr-OR BN+ S/D cell reconfigured in series with two n-channel transistors to become a 3Tr-OR cell for byte-writable EEPROM memory is disclosed in figures of FIG. 6A, FIG. 6B, FIG. 6C, FIG. 6D, FIG. 6E, FIG. 6F, FIG. 6G and FIG. 6H. The novel 3Tr-OR flash cell array for byte-writable EEPROM technology and market is disclosed in FIG. 16. Both 1Tr-OR FLASH and 3Tr-OR EEPROM use the same process and cell structure for combo nonvolatile memory that is comprised of block-writable FLASH and byte-writable EEPROM. Further detailed operations of the present invention will be explained below with reference to FIG. 16.

Figure 16:
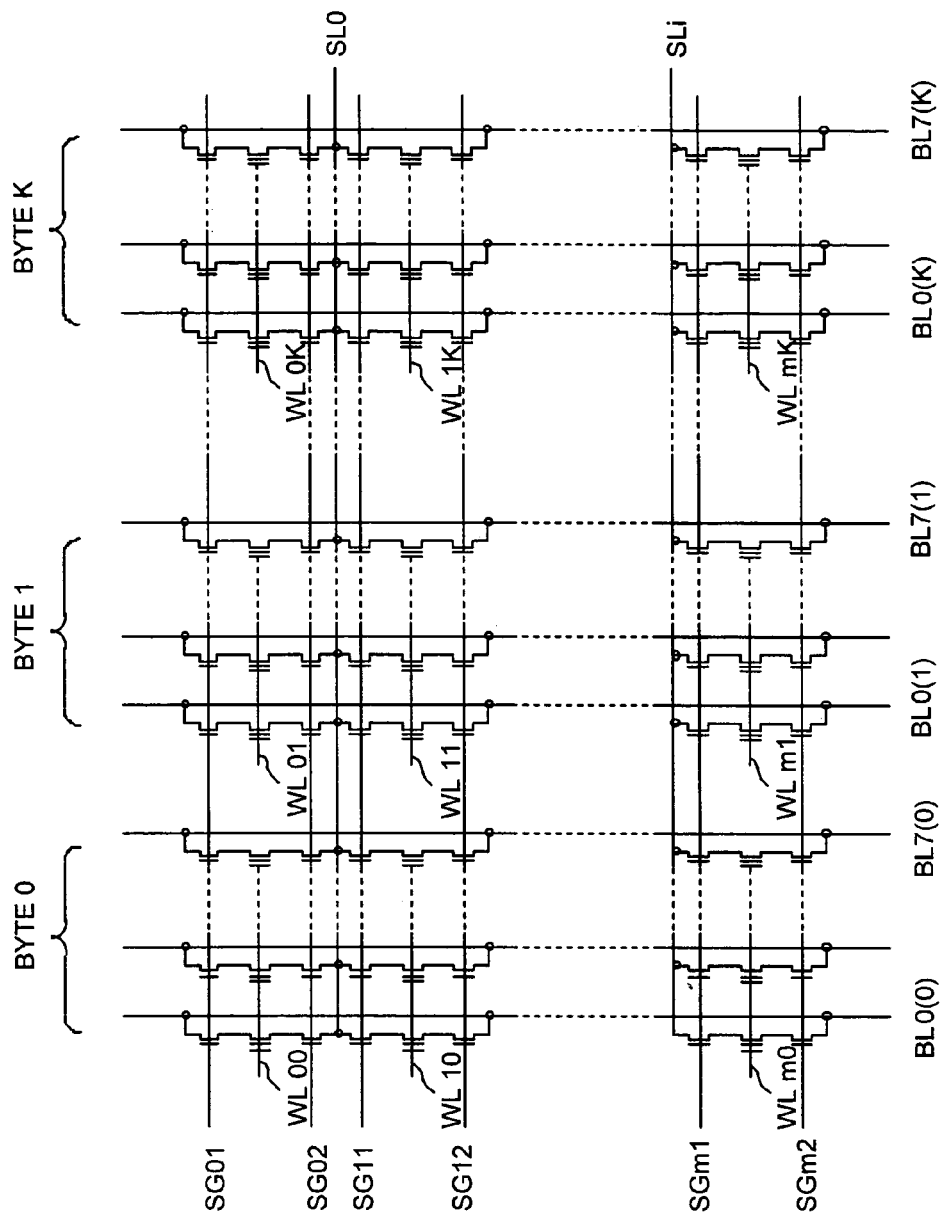
FIG. 16 illustrates a novel circuit of 3Tr-OR EEPROM cell array of the present invention designed for byte-erase and byte-program. It has no vertically divided triple wells in array. The global gate of top n-channel select transistor is coupled to SGm$_1$ running in perpendicular to bitline direction. The bottom of n-channel select transistor is coupled to SGm$_2$. The wordline is divided into a plurality of byte-wordlines as denoted WLmk. Each WLmK is to drive a common gate of eight nonvolatile cells. Unlike FLOTOX's and Toshiba's EEPROM cell arrays, all other transistors and divided triple wells are completely removed from cell array. The EEPROM cell array of the present invention thus contains the least number of transistors and occupies the most compact area. The cell-operating scheme uses FN-channel-erase and FN-channel program for better P/E cycles.

FIG. 16 illustrates an EEPROM memory array that is comprised of 3Tr-OR BN+ S/D cells of the present invention. It is unlike previous EEPROM technologies that use an n-channel transistor to connect respective byte-wordlines, where the layouts of these n-channel transistors are physically located in the cell array, significantly increasing the array penalty. In traditional FLOTOX technology, the required program voltage is positive +17V and cells and the n-channel transistors are formed on the same P-substrate with a reasonable overhead area. When FLOTOX is replaced by flash technologies, the cell write scheme will no longer require the positive high voltages. Most of today's flash technologies require positive as well as negative high voltages for a complete erase and program cycle. The negative high-voltage requires the aforementioned n-channel transistors and flash cells to be made into a triple well as P-substrate is no longer valid for the new array. Although Toshiba's 3Tr-NAND and 4Tr-NAND EEPROM cell arrays require only positive high voltage of around 20V for both program and erase operations, the cell arrays still require a divided triple well that needs a lot of spacing. Thus a tremendous array overhead still exists for the EEPROM array.

Referring to FIG. 16, in addition to the EEPROM memory elements of 3Tr-OR cell of the present invention, the whole Flash-based EEPROM cell array does not have any transistors. Only 3Tr-OR EEPROM cells are physically placed inside the array to make it very compact. No divided triple well or none of additional high-voltage transistors are connected next to any 3r-OR cells in the cell array. The whole array is configured in a way to only have two global select gates of SGm1 and SGm2 running horizontally in the x-direction with a plurality of bytes of eight M1 bitlines BYTE K running vertically in the y-direction. Traditional wordlines are divided into a plurality of byte-wordlines in which the eight cells' gates are tied together to WLmK. The common sourcelines are SLi that can be tied together or separated as denoted in FIG. 16. With no additional transistors for connecting byte-wordlines in the array area and no divided triple wells to distance adjacent bytes, a 70% array size reduction can be achieved from Toshiba's 3Tr-NAND or 3Tr-NAND counterparts. The cell's write scheme of the present invention also uses the aforementioned FN-channel-ease and FN-channel program for better P/E cycles. Regardless of positive or negative high-voltages required in many different flash technologies, the proposed cell array of the present invention can be universally used for any changes at all. Therefore, it becomes a great advantage for the proposed EEPROM array to be used for next generation, highly scalable, high P/E cycle, byte-writable EEPROM technology.

The byte-wordline decoders are not shown in FIG. 16. As it becomes more clear to the reader, the optimal location of byte-wordline decoders could be right on the top of chip or at the sides of the cell array. Either choice has its pros and cons. The byte-wordline decoders are like traditional row-decoders that are designed to connect the outputs of byte-wordline decoders to the corresponding byte-wordlines. Traditionally, the outputs of row-decoders run a plurality of polylines in perpendicular to bitlines to connect the gates of the corresponding wordlines. A single wordline needs to be connected to single outputs of row decoders. On the contrary, there is a plurality of byte-wordlines connected in a single wordline. Assuming one wordline has 128 B cells, each wordline will be broken into 128 byte-wordlines requiring 128 outputs from byte-wordline decoders. In the present invention, the connection metal lines from byte-wordline decoders can run down vertically to the corresponding byte-wordlines if the byte-wordline decoders are placed on top. If the byte-wordline decoders are placed at the sides of array the connection metal lines from byte-wordline decoders can run horizontally from left or right to connect the corresponding byte-wordlines. Increased number of metal lines will be more advantageous. In conclusion, the disclosed universal 3Tr-OR EEPROM cell array has no additional transistors inserted physically connecting the memory elements of any 3Tr-OR EEPROM cell of the present invention. The connection between the outputs of byte-wordline decoders and byte-wordlines depends on the physical locations of byte-wordline decoders and number of metal lines available. More number of metal lines will provide more flexibility to expand the memory density in the y-direction. More details will be addressed in the subsequent pages.

Figure 17:
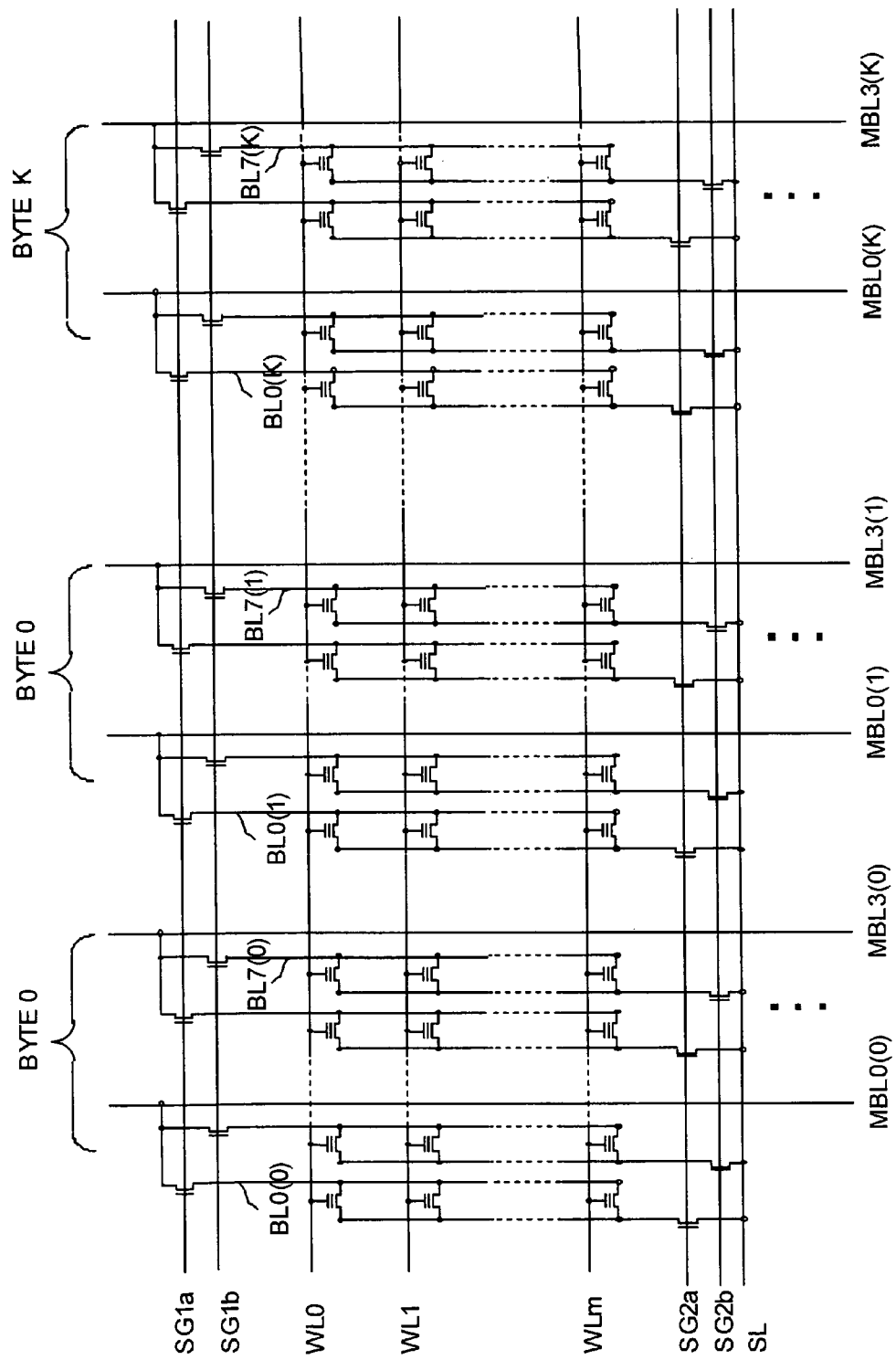
FIG. 17 illustrates a circuit of 1Tr-OR, BN+ S/D, FLASH cell array from Aplus' pending patent of the same inventors and intended to be used for combo nonvolatile memory comprised of FLASH and EEPROM of the present invention. The preferred FLASH cell performs block erase but page program. The FLASH cells are formed on either P-substrate or a big triple well without any division for compact array. The cell operating schemes use the same FN-channel-erase and FN-channel program as EEPROM cells with reverse Vt polarity for better P/E cycles.

FIG. 17 illustrates a circuit of 1Tr-OR, BN+ S/D, FLASH cell array from Aplus' patents of the same inventors and is intended to be used for the combo nonvolatile memory comprised of 1Tr-OR FLASH and 3Tr-OR EEPROM of the present invention. The preferred FLASH cell performs block erase but page program. The FLASH cells are formed on either the P-substrate as shown in FIG. 17 or a large triple well without any division for a compact array. The cell operating schemes use the same FN-channel erase and FN-channel program as 3Tr-OR EEPROM cell of the present invention with reverse Vt polarity for improved P/E cycles.

The wordlines of WL0 to WLm run in the x-direction without any divided byte-wordlines. In other words, the array is configured into many divided blocks. Each block contains a plurality of wordlines and sub-bitlines and sourceline of BN+ layer. The global bitline is metal1, which is used to connect the sub-blocks of the memory array like BN+ S/D 1Tr-NOR ROM. Between the respective source-lines and bitlines, spacing has to be maintained to avoid any malfunction of program and read operations; the details of the array architecture can be referred to in Aplus' U.S. Pat. No. 5,748,538 listed above. Aside from FLASH cells, there are no additional peripheral transistors physically placed in the cell array. This array allows single-page program and read.

Figure 18:
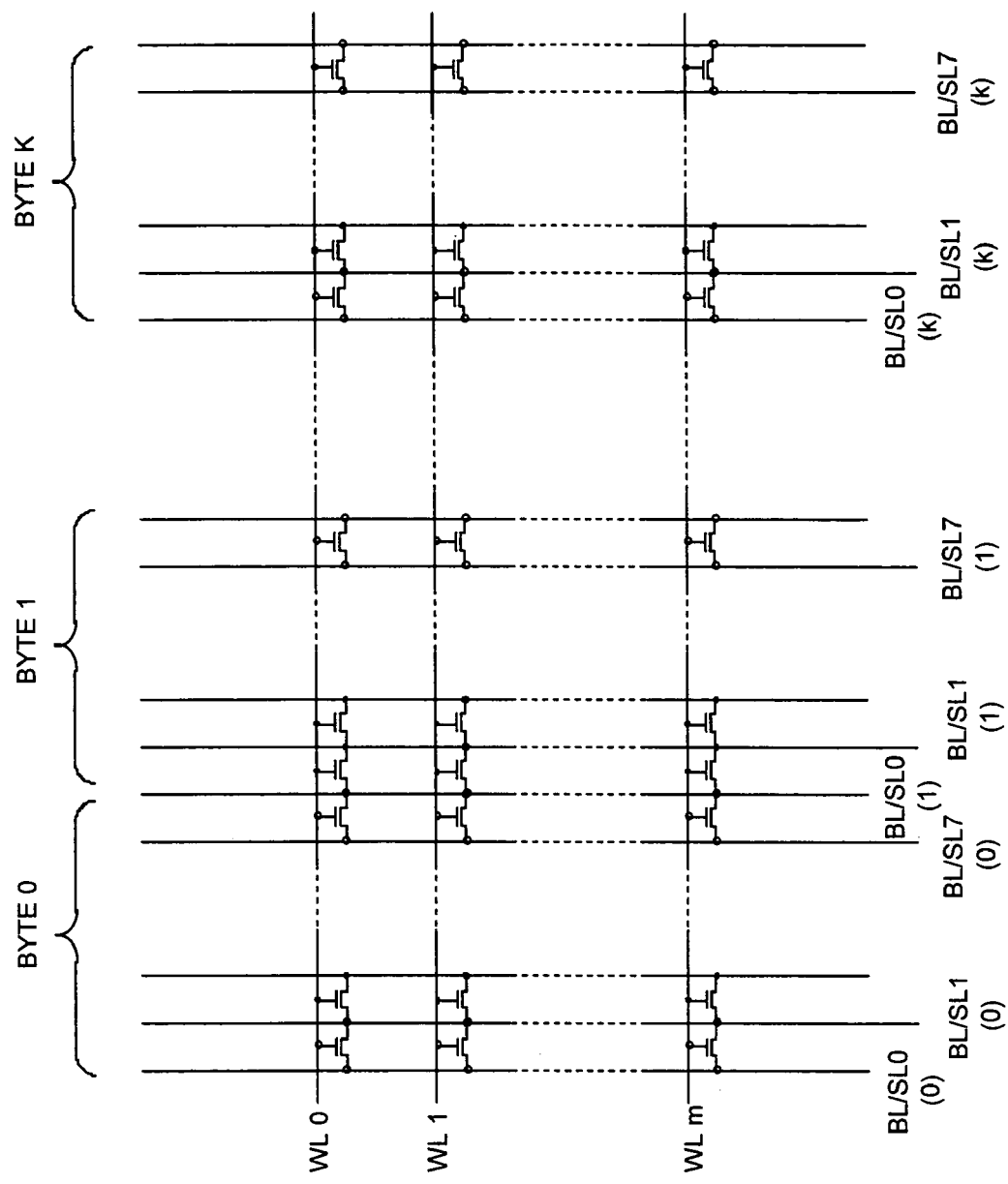
FIG. 18 illustrates a circuit of 1Tr-NOR, BN+ S/D, ROM cell array intended to be used in association with the present invention for combo nonvolatile memory comprised of ROM and EEPROM. The data of the ROM cell can only be altered by photo mask changes at fab site. The ROM cells are formed on either P-substrate or a large triple well without any division to achieve compact array.

FIG. 18 illustrates a circuit of 1Tr-NOR, BN+ S/D, ROM cell array intended for use in association with 3Tr-OR EEPROM of the present invention for the combo nonvolatile memory market. The data of the ROM cell can only be altered by photo mask changes at fab site. The ROM cells are in a big flat-cell array and are formed on either P-substrate or a large triple well without any triple well division and spacing for achieving compact array; the data of the ROM cell can be changed by Boron implant. For cells with the Boron implant, the Vts will be increased more than 4V. For cells without Boron implant, the Vt is adjusted to around 1V. ROM has no in-system re-programmability like EEPROM and FLASH.

FIG. 19A illustrates the first example of a preferred schematic and physical layout arrangement of byte-wordline decoders with 3Tr-OR, BN+ S/D, EEPROM cell array of the present invention. The plurality of the byte-wordline decoders are removed from the cell array and placed on top of the array. The plurality of byte-wordline decoders are all organized in one big triple well without any well division to save peripheral area. The number of outputs of each byte-wordline decoder depends on the availability of numbers and pitches of metal layers. The size of each byte-wordline decoder will be proportionally increased when the required number of outputs is increased. More available metal layers will increase the number of outputs with big savings in the array area as density increases. In one bitline pitch, all different layers of metal lines of different outputs generated from each byte-wordline decoder can be stacked together in $3^{rd}$ dimension, e.g. z-direction, and are connected to the respective bytes of WLKin the y-direction of cell array.

When the number of available metal lines is limited, the room for more outputs from byte-wordline decoders can be expanded in the x-direction to allow more vertical metal lines to connect to more byte-wordlines in the y-direction. By adding just one additional n-channel transistor with drain connecting to global vertical line of GWL, source connecting to respective byte-wordline and gate connecting to SB K, one more byte-wordline can be selected with negligible overhead. The 3Tr-OR EEPROM cells in the whole cell array are formed in the P-substrate without any triple wells in this example. The details of operation will now be described with reference to FIG. 19A.

Assuming BYTE 1 is selected for data change and four (4) metal lines are available in this process, then eight cells in BYTE1 have to be erased first. In this situation, WL2 has to be coupled with a erase voltage Verase associated eight bitlines held at ground level. Verase varies from −15V to −20V depending on the flash cell structure and coupling ratio between Poly2 and Poly1. In order to have Verase on WL1, GWL has to be coupled with Verase and SB1 coupled with Verase+Vt. The rest of signals of SB0, SB2 to SBK are grounded to float the byte-wordlines of WL1, WL3 to WLK. In addition, SG21 and SG22, the rest of signals of SG11, SG12, SG31, - - - , SGK1 and SGK2 have to be coupled to ground to shut the non-select n-channel transistors off from causing any bitline current leakages. For byte-program, two different voltages, 0V and Vinhibit, are required in eight bitlines of BL0 to BL7. 0V on bitline is to program, while Vinhibit on the bitline is to inhibit programming. The Vinhibit voltage is around 5 volts. The cells' drains of 0V are cells that are selected to be programmed to high Vt of more than 4V typically. The cells' drains of Vinhibit are cells selected not to be programmed and Vts stay as low as 1V. In order to have Vinhibit for program inhibit, the gate voltage of SG11 has to be coupled with more than Vinhibit+Vt which is at least 6V. Since a total of four metallines are available, three metallines can be used to connect the byte-decoder outputs to the respective byte-wordlines.

Typically, metal1 (M1) is reserved for bitline connections running vertically from the bitline column decoders at the bottom of the array to the selected cells in the y-direction (not shown in this figure). Since four metal lines of M1, M2, M3 and M4 are available in this example, another three metal lines not used for bitline connections can now be used for byte-wordline connections. In an eight bitline pitch area, total metal lines of twenty-four of M2, M3 and M4 can run down the array for byte-wordline connections. In this case, a total of 24 byte-wordlines can be connected successfully by twenty-four metal lines generated from top byte-wordline decoders. The twenty-four wordlines are eight M2 lines, eight M3 lines and eight M4 lines taking the room of a byte-wide pitch with the assumption all metal layers having same layout pitch.

Furthermore, if the global metal line of GWL is M4 (top metal layer), then another three metal lines of M3, M2, and M1 can use this area to connect to three additional byte-wordlines. Therefore, in total, (nine (9) M1 pitch for one line of GWL and eight lines of BL0 to BL7), twenty-seven (27) byte-wordlines can be connected by four metals (M2, M3 and M4) technology.

In FIG. 19A, it is shown that the 3Tr-OR cells of the present invention are formed on P-substrate without any triple well. FIG. 19B shows another preferred embodiment of 3Tr-OR cells of the present invention formed on a big triple well without any division and spacing. As the number of byte-wordlines to be connected increases, additional area is required to allow the running metal lines to connect to the additional byte-wordline decoders. FIG. 19C illustrates how to connect to more byte-decoders by running more groups of nine byte-wordline pitch such as WLi+1~m, WLi+1~i in addition to WLi+1~k. For any additional groups of nine (9) metal pitches, each can run four (4) metals. As a result, any one additional nine-bitline pitch can run thirty-six (36) metals to connect thirty-six byte-decoders.

The following Table 4 lists the outcomes of the connection of the number of byte-wordlines and number of metal lines in a nine-bitline pitch of 3Tr-OR array. The major difference between the two equations of 9×(N−1) and (N−1)+8N is with and without the layouts of the EEPROM cell below the connecting metal lines.

From market surveys, the number of metal lines available in embedded NVM system is greater than four. For example, there are a total of six metal lines available from TSMC's embedded Flash technology. The increase is metal line cost is preferable than having a layout with large overhead waste for triple-well spacing as proposed in Toshiba's approach of 3Tr-NAND or 4Tr-NAND.

The other advantage of the present invention is the layout of connecting peripheral devices by metal1 only. By placing the aforementioned metal lines below, more area is saved. The figures of FIG. 19D and FIG. E show the cross-sectional views of metal lines for connection by using three (3) metals and six (6) metals respectively. The EEPROM cells are formed on P-substrate. The Poly2 a gate of one byte cells is connected between Poly2 and M1. Subsequently, M1 is then connected to M2 on the next level. The final connection between M2 and M3 is used to connect the selected byte-wordline WL9 as indicated in FIG. 19D. FIG. 19E shows the same idea as FIG. 19D but the number of metallines available is six, which allows more connection between byte-wordline decoders and byte-wordlines.

TABLE 4

Number of Byte-wordlines vs. Number of available metal lines

| Number of metal lines available | 9-BL pitch metal lines |
|---|---|
| 4 | 27 |
| 5 | 36 |
| 6 | 45 |
| N | 9 × (N − 1) |

FIG. 20A further illustrates another example of a preferred schematic and physical layout arrangement of byte-wordline decoders and BN+ S/D cell array of the present invention. In contrast to FIG. 19A, the plurality of the byte-wordline decoders are removed from the top of the cell array and placed on the left or right side of the array. The plurality of byte-wordline decoders are all organized in one big triple well on the left and there is no need of divided triple wells in the array. The number of outputs of each byte-wordline decoder depends on the availability of numbers and pitches of metal layers as the proposed idea of FIG. 19A.

The size of each byte-wordline decoder will be proportionally increased when the required number of outputs is increased. More metal layers available will increase the number of outputs with big savings in the array area as density increases. In one cell's height of three wordlines' pitch, all different layers of metal lines of different outputs generated from each byte-decoder can be stacked together in $3^{rd}$ dimension, e.g. z-direction, and then connected to WL0, WL1, - - - and WLK, the respective byte-wordline in x-direction of cell array. When the number of available metal lines is limited, additional byte-wordline decoders have to be inserted in the cell array to allow metal layers to reach far-end byte-wordlines in the x-direction. This will increase the array area.

The height of each 3Tr-OR cell has a dimension of three wordline pitch. Therefore, this embodiment is less powerful in terms of metal connections as compared with the scheme of eight-bitline pitch as disclosed in FIG. 19A, FIG. 19B and FIG. 19C. The 3Tr-OR, EEPROM cells in the whole array is formed on P-substrate without any divided triple-wells.

FIG. 20B illustrates another example of a preferred schematic and physical layout arrangement of byte-wordline decoders and cell array as FIG. 20A of the present invention. The EEPROM cells in the whole array are formed in a big triple well without well division to save array area. During the P/E cycles, the P-well is biased at 0V and deep N-well is at Vdd. The number of metal line connections vs. number of available metal lines is shown in Table 5 below.

TABLE 5

Number of Byte-wordlines vs. Number of available metal lines

| Number of metal lines available | 9-WL pitch metal lines |
|---|---|
| 4 | 3 |
| 5 | 12 |
| 6 | 15 |
| N | 3 × (N − 1) |

Figure 20:
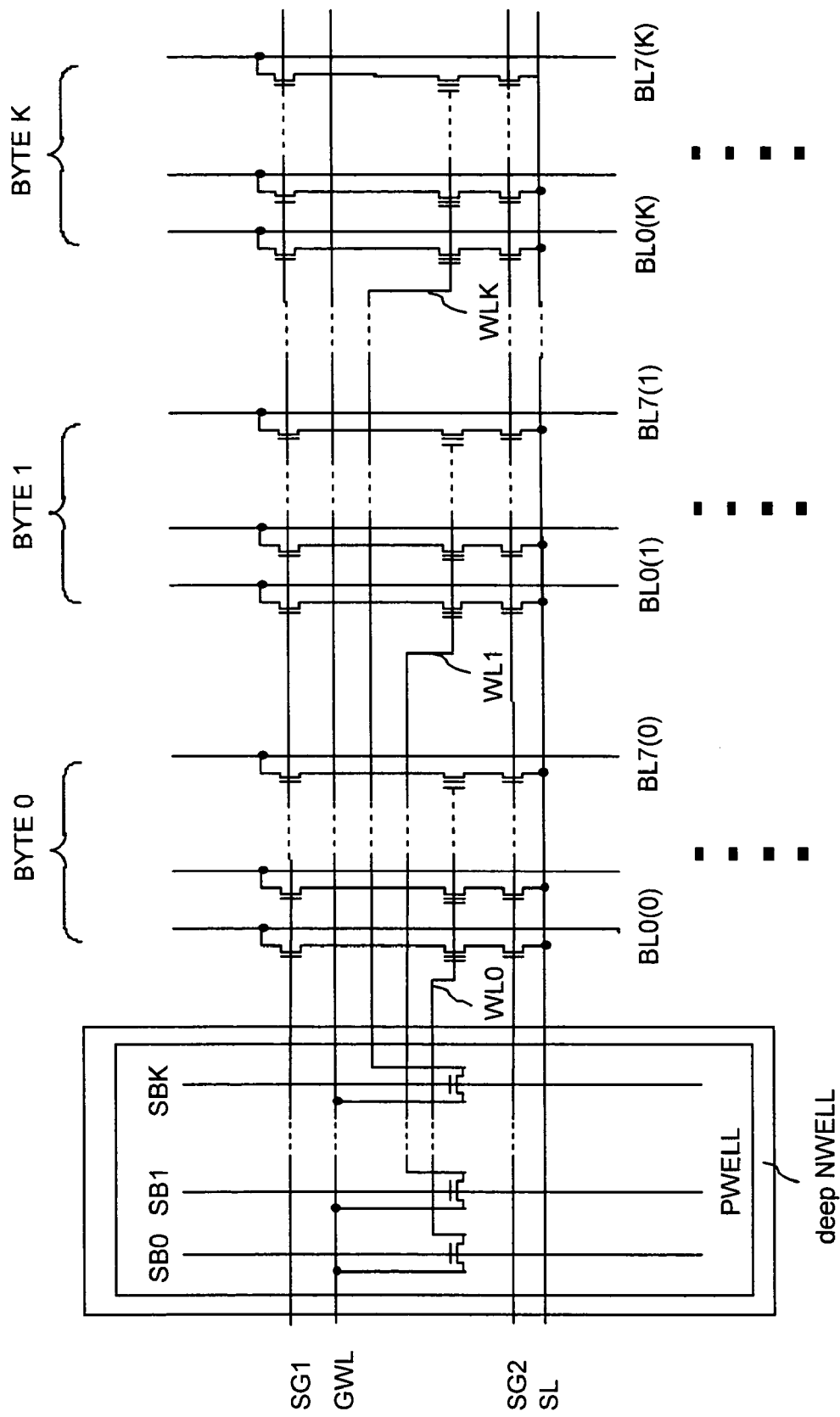
FIG. 20A illustrates another example of a preferred schematic and physical layout arrangement of byte-wordline decoders and BN+ S/D cell array of the present invention. In contrast to FIG. 19A, the plurality of the byte-wordline decoders are removed from the cell array and placed on either the left or right side of the array. The plurality of byte-wordline decoders are all organized in one large triple well and array has no need of divided triple well to save area. The number of outputs of each byte-decoder depends on the availability of numbers and pitches of metal layers. The size of each byte-decoder will be proportionally increased when the required number of outputs is increased. More metal layers available will increase the number of outputs with big saving in array area as density increases. In one cell's height pitch, all the different layers of metal lines of different outputs generated from each byte-decoder can be stacked together in $3^{rd}$ dimension, e.g. z-direction, and are connected to the respective bytes of WLKin the x-direction of the cell array. When the number of available metal lines are limited, additional byte-decoders have to be inserted in the cell array to allow metal layers connecting to more byte-wordlines in the x-direction. The height of each is three wordline pitch. Therefore, this embodiment has less power of metal connection as compared with the schemes disclosed in FIG. 19A, FIG. 19B and FIG. 19C. The EEPROM cells in the whole array are formed in the P-substrate without any triple well. The details of operation will be described subsequently with reference to this drawing in accompaniment with others in the present invention.
FIG. 20B illustrates another example of a preferred schematic and physical layout arrangement of byte-wordline decoders and cell array as FIG. 20A of the present invention. The EEPROM cells in the entire array are formed in a large triple well without well division to save array area.
FIG. 20C illustrates the cross-sectional view of one group of metal lines of the cell array in FIG. 20A and FIG. 20B of the present invention. In this figure, three metal layers are available for inter-connection. The metal1 (M1) is used for bitline connection in the lowest level running vertically. Two metals of metal2 (M2) and metal3 (M3) can be used for connecting byte-wordline decoders' outputs and the byte-wordlines. Each wordline pitch can run two metal layers of M3 stacking on top of M2, thus a total of seven lines can be connected to seven byte-wordlines (bytes) running horizontally in the x-direction as indicated.
FIG. 20D illustrates another cross-sectional view of one group of metal lines of the cell array in FIG. 20A and FIG. 20B of the present invention. In this figure, six metal layers are available for inter-connection. The metal1 (M1) is used for bitline connection in the lowest level running vertically. Five metals from metal2 (M2) to metal6 (M6) can be used for connecting byte-wordline decoders' outputs and the byte-wordlines. Each bitline pitch can run five metal layers from M6 stacking on top of M5 and M5 on M4, M4 on M3 and M3 on M2. In total, twenty lines can be connected to twenty byte-wordlines (bytes) running horizontally as indicated.
Figure 20:
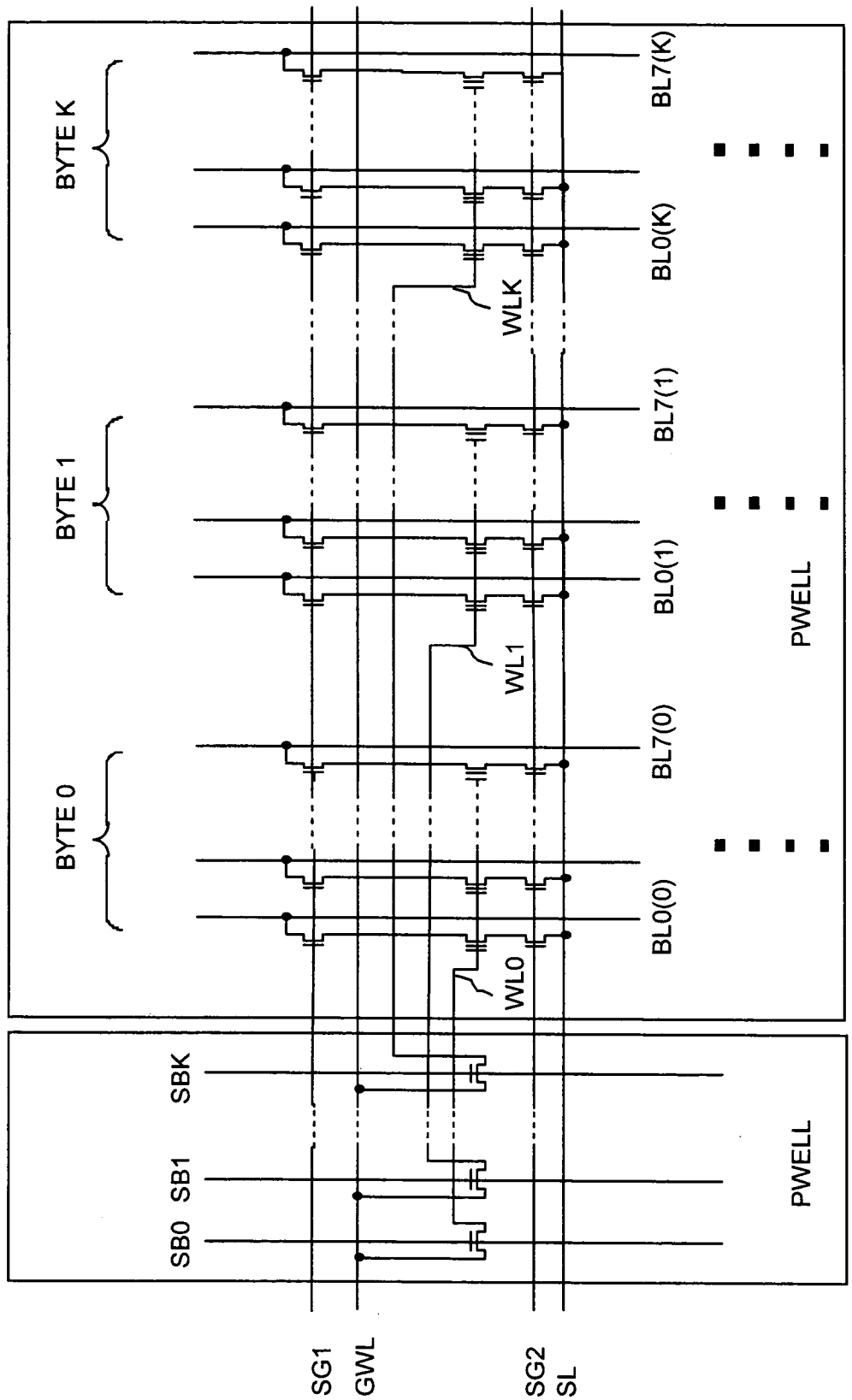
Figure 20C:
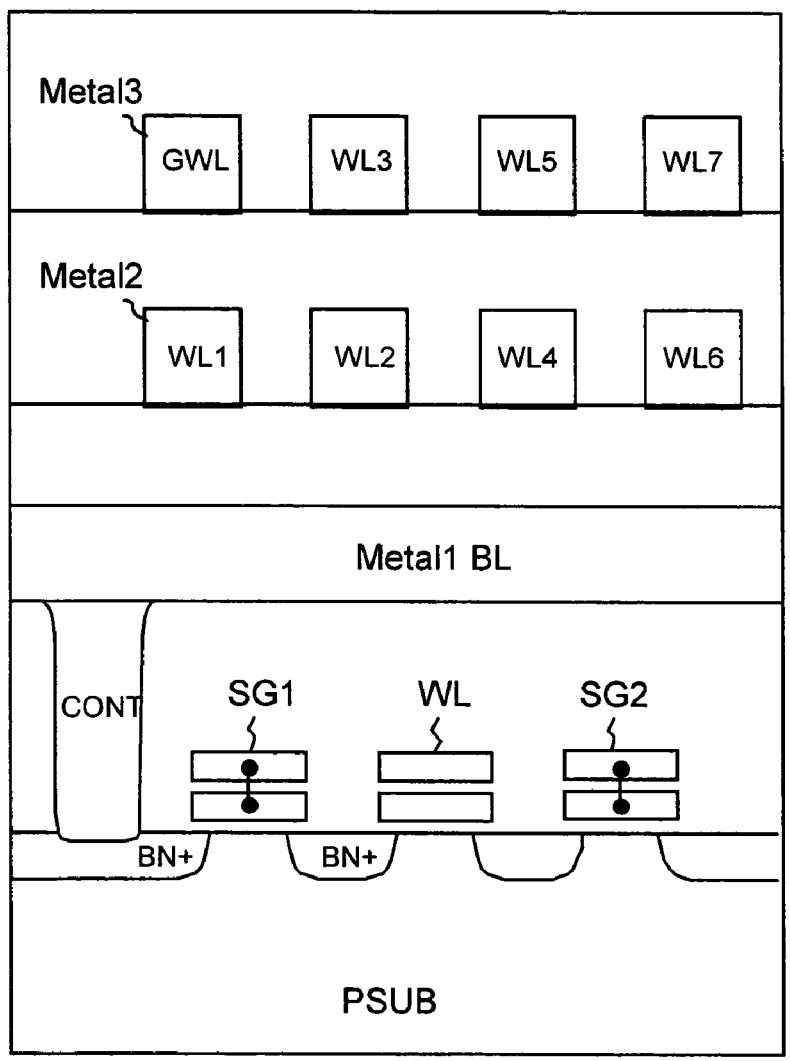

FIG. 20C illustrates the cross-sectional view of one group of metal lines of the cell array in FIG. 20A and FIG. 20B of the present invention. In this figure, three metal layers are available for inter-connection. The metal1 (M1) is used for bitline connection in the lowest level. Two metals of metal2 (M2) and metal3 (M3) can be used for connecting byte-wordline decoders' outputs to the byte-wordlines. Each wordline pitch can run two metal layers of M3 stacking on top of M2, thus a total of four lines can be connected to four divided byte-wordlines running horizontally in the x-direction as indicated.

Figure 20D:
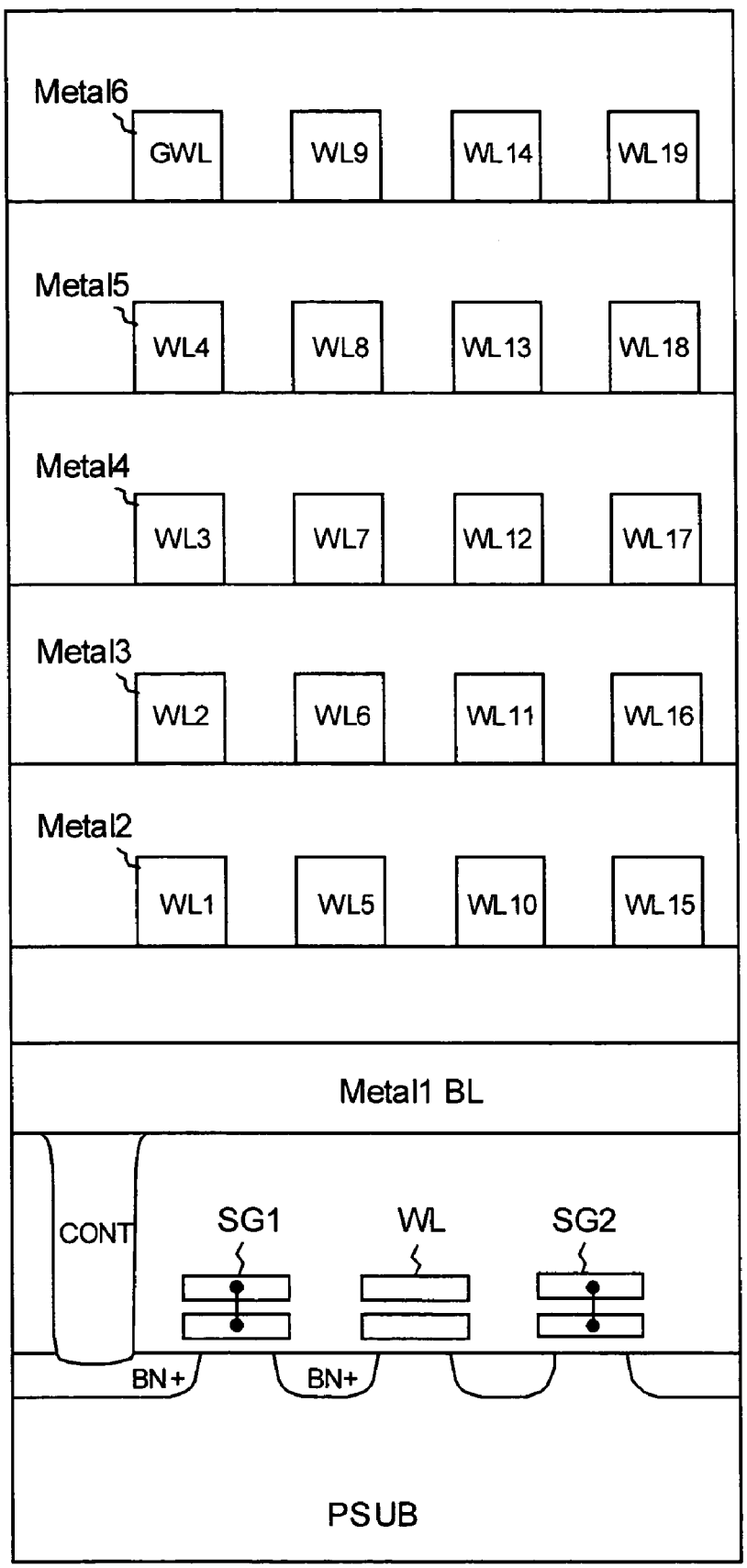

FIG. 20D illustrates another cross-sectional view of one group of metal lines of the cell array in FIG. 20A and FIG. 20B of the present invention. In this figure, six metal layers are available for inter-connection. The metal1 (M1) is used for bitline connection in the lowest level running vertically. Five metals from metal2 (M2) to metal6 (M6) can be used for connecting byte-decoders' outputs and the byte-wordlines. Each bitline pitch can run five metal layers from M6 stacking on top of M5 and M5 on M4, M4 on M3 and M3 on M2. In total, twenty lines can be connected to twenty byte-wordlines (bytes) running horizontally as indicated.

Now, the details of cell operation are described here with reference to FIG. 20A and FIG. 20B. When BYTE K is selected for data change, the eight cells that are connected to WLK will be erased to a low Vt of ~1V first by FN-channel erase and then followed by a FN-channel program operation. The FN-channel erase is achieved by applying a negative high-voltage Verase of −15V to −20V to the selected byte-wordline WLK with SBK at 0V and GWL at Verase with eight bitlines of BL0(K) to BL7(K) grounded. The electrical field of eight 3Tr-OR cells will have a tunneling effect occurring between Poly1 and substrate. The electrons will be expelled out from floating-gates of the selected eight cells of WLK, thus the Vts are decreased to around 1V within 5 mS. The rest of the byte-wordlines of WL0, WL1 to WLK−1 are at a floating state due to signals of SG0, SG1 to SGK−1 held at −20V. In this case, SG1 and SG2 are both coupled to Vdd with all unselected bitlines and byte-wordlines of WL0 to WLK−1 and SL at 0V. As a consequence, there is no erase and program disturbance to the EEPROM cells of the unselected bytes.

In program operation, the voltage of WL K will be at +20V and the bitlines' voltages are held at 5V or 0V depending on the data pattern. For those cells requiring high-Vt (>4V), 0V bitline is applied. On the contrary, for those cells requiring low Vt, the program inhibit voltages have to be applied selectively. The erase and program operations are performed by using the schemes of FN-channel erase and FN-channel program within 5 mS. In this example, all EEPROM cells are formed on P-substrate or in one large Triple-well. No divided triple wells are required. The following Table 6 and Table 7 show the details of the aforementioned operating voltages of each node in program and erase operations when EEPROM cells are formed in one large triple well.

The erase voltage of −20V is just an example. The required erase voltage of byte-wordline with respect to P-Well or P-substrate is subject to the thickness of inter-poly oxide, the thickness of tunneling oxide and the coupling ration from Poly2 to Poly1 floating-gate. The FN-channel tunneling effect will be induced when the applied electric field between Poly1 and P-well exceeds 10 MV/cm. The erase operation is to remove electrons from the floating-gate thus decreasing the cell's Vt. In contrast, the FN-channel program operation is to inject electrons from channel region back to floating-gate to increase the cell's Vt by applying +20V on Poly2 gate and holding the cell's channel region at ground of the selected byte-wordline.

TABLE 6

| ERASE | Selected byte-wordline | Non-selected byte-wordlines in selected wordline | Non-selected byte-wordlines in non selected wordlines |
|---|---|---|---|
| WLK | Verase | Floating | Floating |
| SL | 0 V | 0 V | 0 V |
| GWL | Verase | Verase | 0 V |
| BL0(K)–BL7(K) | 0 V | 0 V | 0 V |
| SGN1 | VDD | VDD | 0 V |
| SGN2 | VDD | VDD | 0 V |
| SBK | 0 V | Verase | 0 V |
| P-well | 0 V | 0 V | 0 V |
| Deep N-well | VDD | VDD | 0 V |

TABLE 7

| PROGRAM | Selected byte-wordline | Non-selected byte-wordlines in selected wordline | Non-selected byte-wordlines in non selected wordlines |
|---|---|---|---|
| WLK | Vprog | Floating | Floating |
| SL | ~2 V | ~2 V | 0 V |
| GWL | Vprog | Vprog | 0 V |
| BL0(K)–BL7(K) | 0 V/Vinhibit | 0 V | 0 V |
| SGN1 | Vinhibit + Vt | Vinhibit + Vt | 0 V |
| SGN2 | 0 V | 0 V | 0 V |
| SBK | Vprog + Vt | 0 V | 0 V |
| P-well | 0 V | 0 V | 0 V |
| Deep N-well | VDD | VDD | 0 V |

Figure 21:
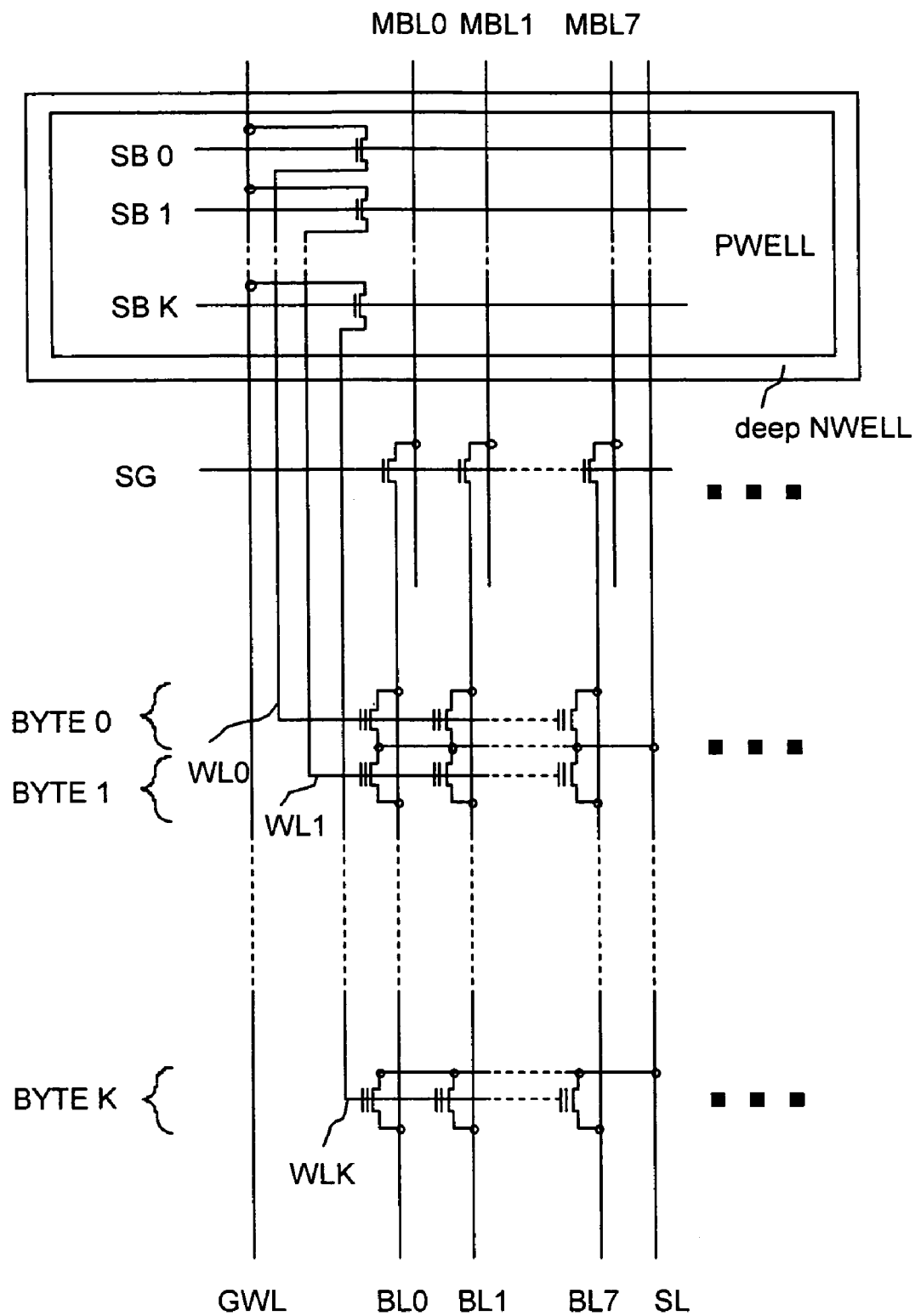
FIG. 21 illustrates one example of a preferred schematic and physical layout arrangement of byte-wordline decoders and 1Tr-ETOX cell array of the present invention. The plurality of the byte-wordline decoders are removed from the cell array in one large triple well located on top of the array without any well division in the array to save area as shown in FIG. 19A. The pull-down devices of each byte-wordline decoder are not shown for simplicity of description, but are well-known to those skilled in the art.

FIG. 21 illustrates yet another preferred embodiment of schematic and physical layout arrangement of byte-wordline decoders and its connection methods as applied in 1Tr-ETOX cell array of the present invention. The plurality of the byte-wordline decoders are removed from the cell array and are placed in one large triple well located on top of the array without any well division in the array to save area as in FIG. 19A.

Traditionally, a 1Tr-ETOX flash array (Intel) only allows either FN-edge erase or FN-channel program in a block size of 64 KB. After erase operation, the cells' Vt in the selected block will be decreased to below 1.5V. The current for FN-edge erase is about 10 nA per flash cell, while FN-channel erase consumes less than edge-erase at about 10 pA per cell. During CHE program, around +5V is applied to the drains and about +10V to the gates (wordline) of the selected cells. Typically, the number of selected cells for CHE program is eight. Because a high-current pump is very noisy and area consuming, it is not recommended to have a simultaneous program of greater than eight bits. The eight selected program cells are not physically adjacent but actually dispersed in a long selected wordline. For FN-edge erase, the cells' gates of selected block are applied with about −10V and the cells' deep-source node is held at +5V. After 300 mS erase operation, the cells' Vt will typically be decreased to below 1.5V. The following Table 8 shows the traditional ETOX cell's program and erase operation. Dispersed 8 means the eight program cells are dispersed in a single wordline, making the cell suitable for byte-erase and byte-program without disturbance.

TABLE 8

Traditional ETOX's Program and Erase Operations For FLASH memory

| 1Tr-ETOX Flash cell | CHE byte-program | FN-edge Block Erase | FN-Channel Block Erase |
|---|---|---|---|
| Gate | +10 V | −10 V | −10 V |
| Drain | +5 V | Floating | Floating |
| Source | 0 V | +5 V | Floating |
| P-well | 0 V | 0 V | +5 V |
| bits | Dispersed 8 | 512K | 512K |

TABLE 9

Traditional ETOX's Program and Erase Operations For EEPROM memory

| 1Tr-ETOX Flash cell | CHE byte-program | FN-Channel Block Erase |
|---|---|---|
| Gate | +10 V | −15 V |
| Drain | +5 V | Floating |
| Source | 0 V | Floating |
| P-well | 0 V | 0 V |
| bits | Consolidated 8 | 512K |

Figure 22:
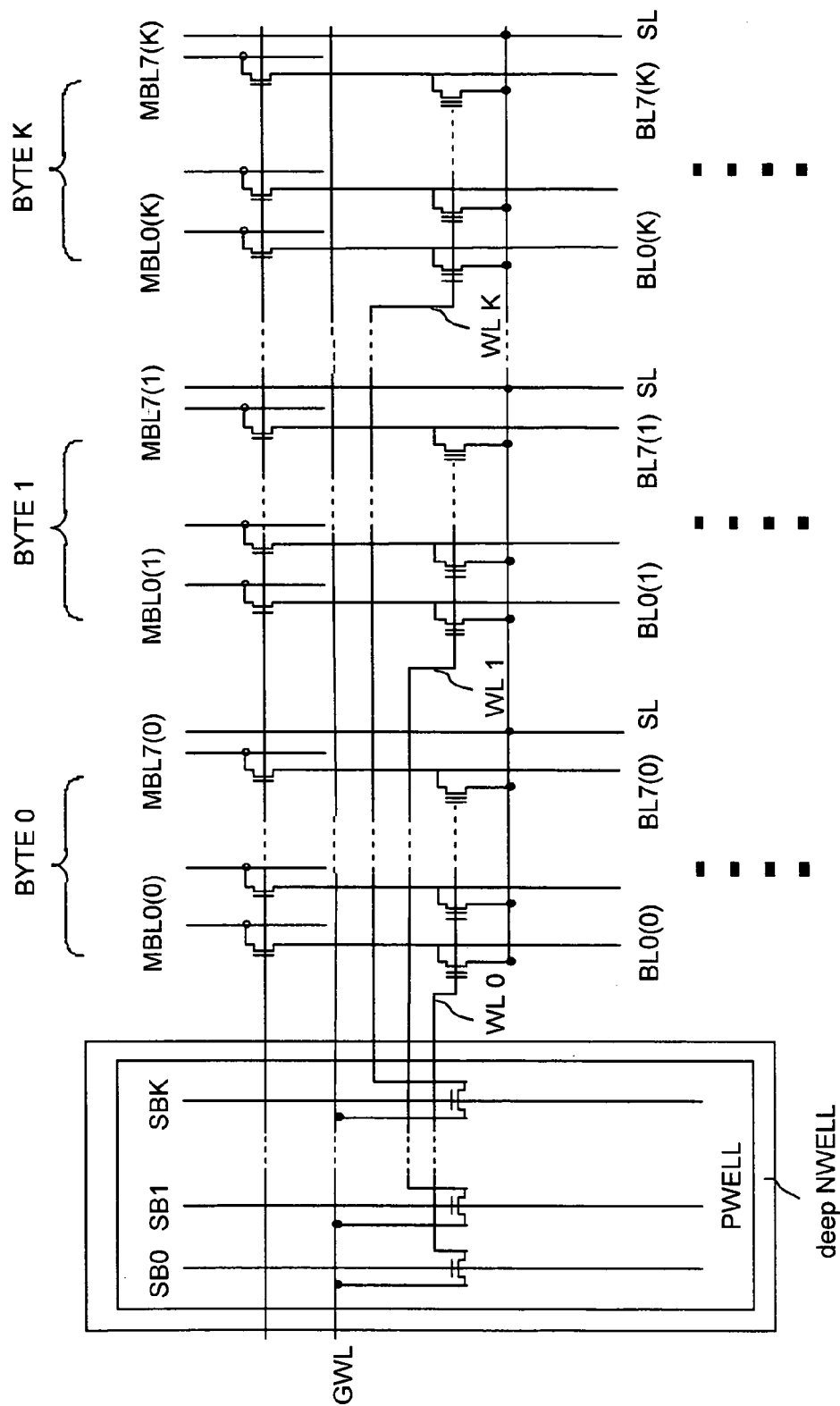
FIG. 22 illustrates one example of another preferred schematic and physical layout arrangement of byte-wordline decoders applying to 1Tr-ETOX cell array of the present invention. The plurality of the byte-wordline decoders are removed from the cell array in one large triple well located on the side of the array without any well division in the array to save area as FIG. 20A.

In contrast to the conventional block-erase 1Tr-ETOX array, FIG. 21 and FIG. 22 show a novel 1Tr-ETOX flash array that allows byte-erase and byte-program. The cell's erase and program conditions are the same as the traditional ones shown on Table 8. The traditional long wordline of ETOX cell array is broken into a plurality of byte-wordlines. Bitlines are configured into one or several divided blocks depending on the density requirement of EEPROM as the traditional one without any changes. In order to perform the erase and program operations for the EEPROM part independently from the FLASH part in the combo nonvolatile memory, it is preferable to have the triple wells of EEPROM separate from the FLASH triple well to avoid any disturbance for better P/E cycles.

Figure 19:
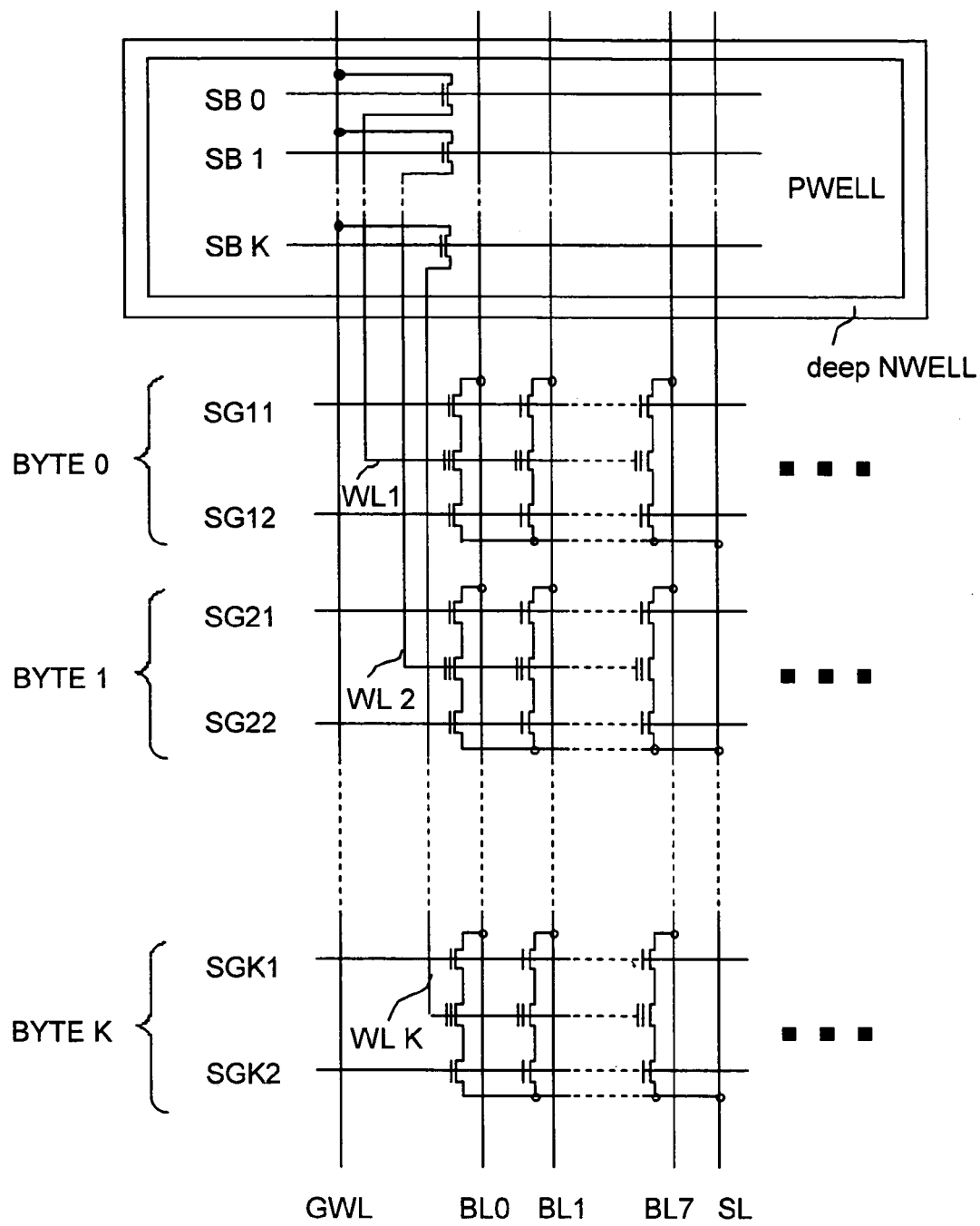
FIG. 19A illustrates one example of a preferred schematic and physical layout arrangement of byte-wordline decoders and BN+ S/D cell array of the present invention. The plurality of the byte-wordline decoders are removed from the cell array and placed on top of the array. The plurality of byte-wordline decoders are all organized in one large triple well without any well division to save area. The number of outputs of each byte-decoder depends on the availability of numbers and pitches of metal layers. The size of each byte-decoder will be proportionally increased when the required number of outputs is increased. More metal layers available will increase the number of outputs with large savings in the array area as density increases. In one bitline pitch, all different layers of metal lines of different outputs generated from each byte-decoder can be stacked together in $3^{rd}$ dimension, e.g. z-direction, and are connected to the respective bytes of WLK in the y-direction of cell array. When the number of available metal lines are limited, the room for more outputs from byte-decoder can be expanded in x-direction to allow more metal lines to connect to more bytes in y-direction. The EEPROM cells in whole cell array are formed in P-substrate without any triple well. The details of operation will be described subsequently with reference to this drawing in accompaniment of others in the present invention.
FIG. 19B illustrates another example of a preferred schematic and physical layout arrangement of byte-wordline decoders and cell array as FIG. 19A of the present invention. The EEPROM cells in whole cell array are formed in a large triple well without well division to save array area.
FIG. 19C illustrates another further example of a preferred schematic and physical layout arrangement of byte-wordline decoders and cell array as FIG. 19A of the present invention. The cell array has wasted area in array when additional groups of metal lines of different layers of WLi+1~m and WLi+1~I are running down in bitline directions from top bigger byte-decoder in addition to WLi+0~k as compared with FIG. 19A & FIG. 19B. This embodiment allows more metal lines to be connected to more byte-wordlines when the number of metal layers are limited. Although the cell array has area covered by these additional metal lines without any devices underneath, it is still a big savings in total die area.
FIG. 19D illustrates the cross-sectional view of one group of metal lines of the cell array in FIG. 19A, FIG. 19B and FIG. 19C of the present invention. In this figure, three metal layers are available for inter-connection. The metal1 (M1) is used for bitline connection in the lowest level. Two metals of metal2 (M2) and metal3 (M3) can be used for connecting byte-wordline decoders' outputs and the byte-wordlines. Each bitline pitch can run five metal layers from M6 stacking on top of M5 and M5 on M4, M4 on M3 and M3 on M2. AN additional 6 lines (in the pitch of the $9^{th}$ bitline) are allowed. In total, forty-five lines can be connected to forty-five byte-wordline (bytes) as indicated.
Figure 19B:
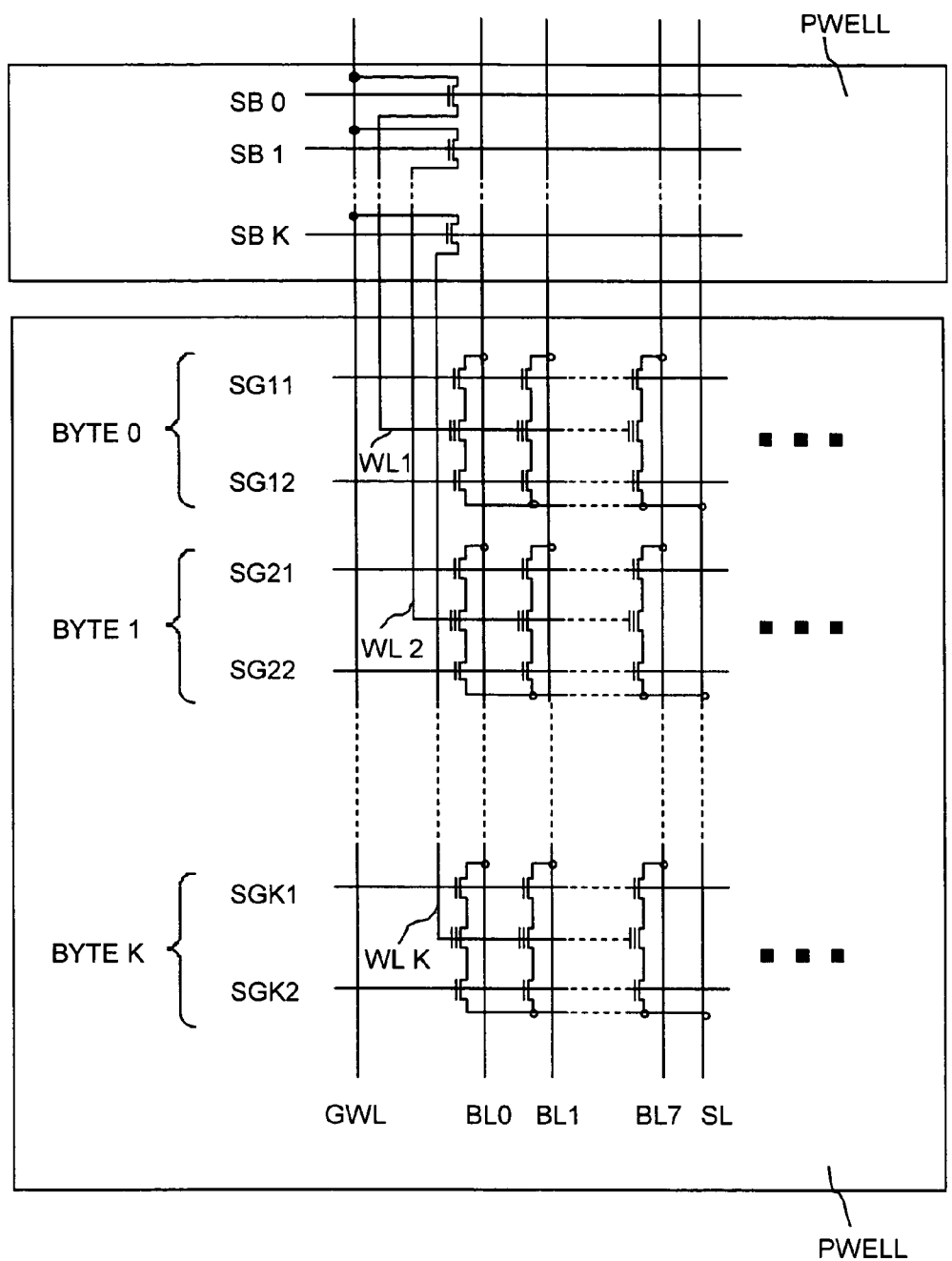
Figure 19:
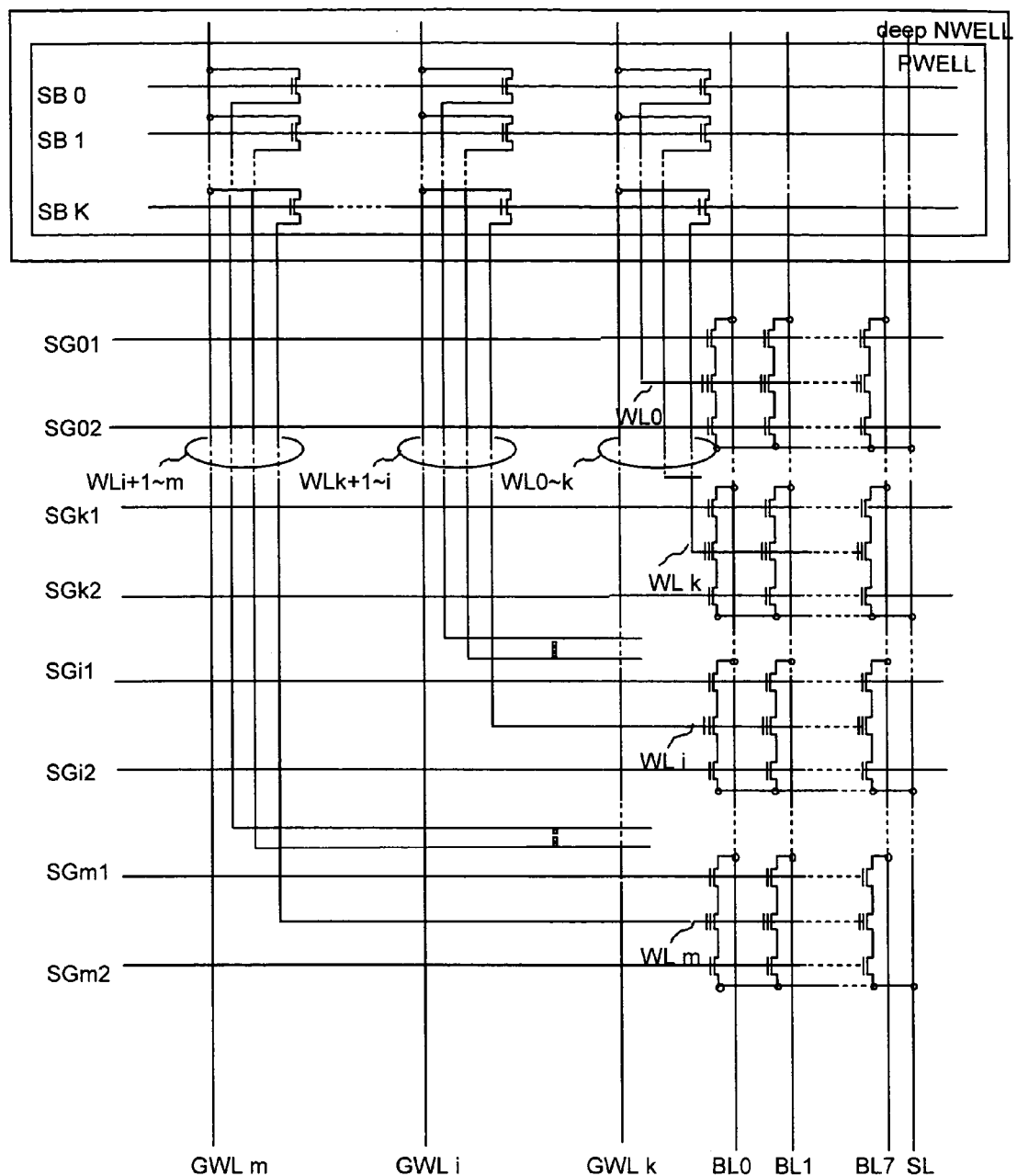
Figure 19D:
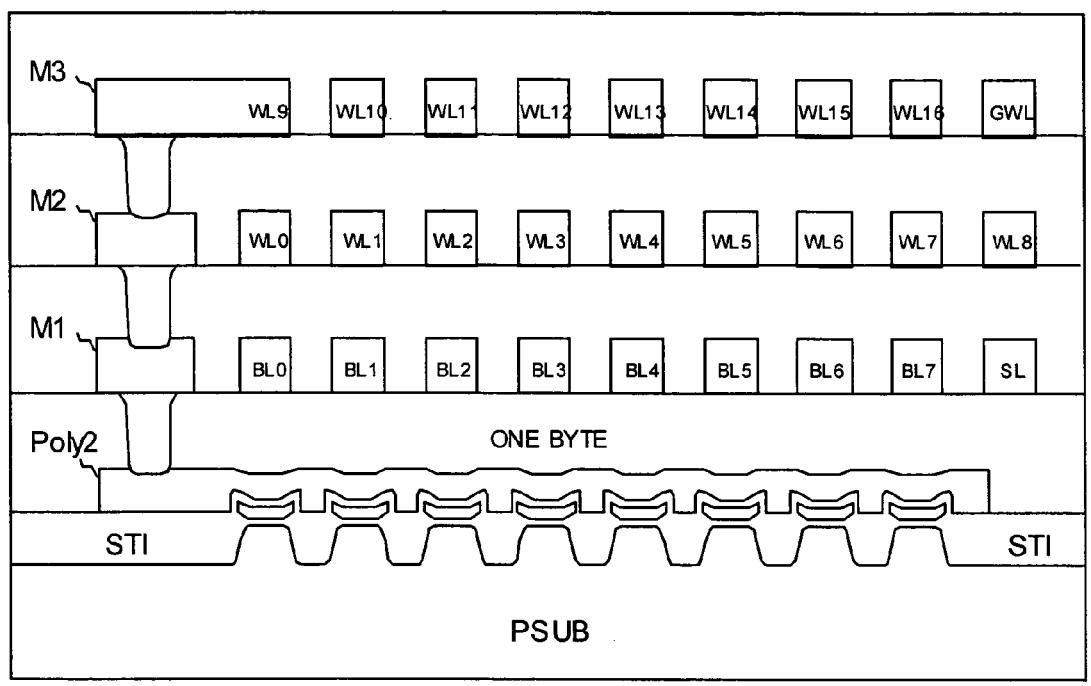
Figure 19E:
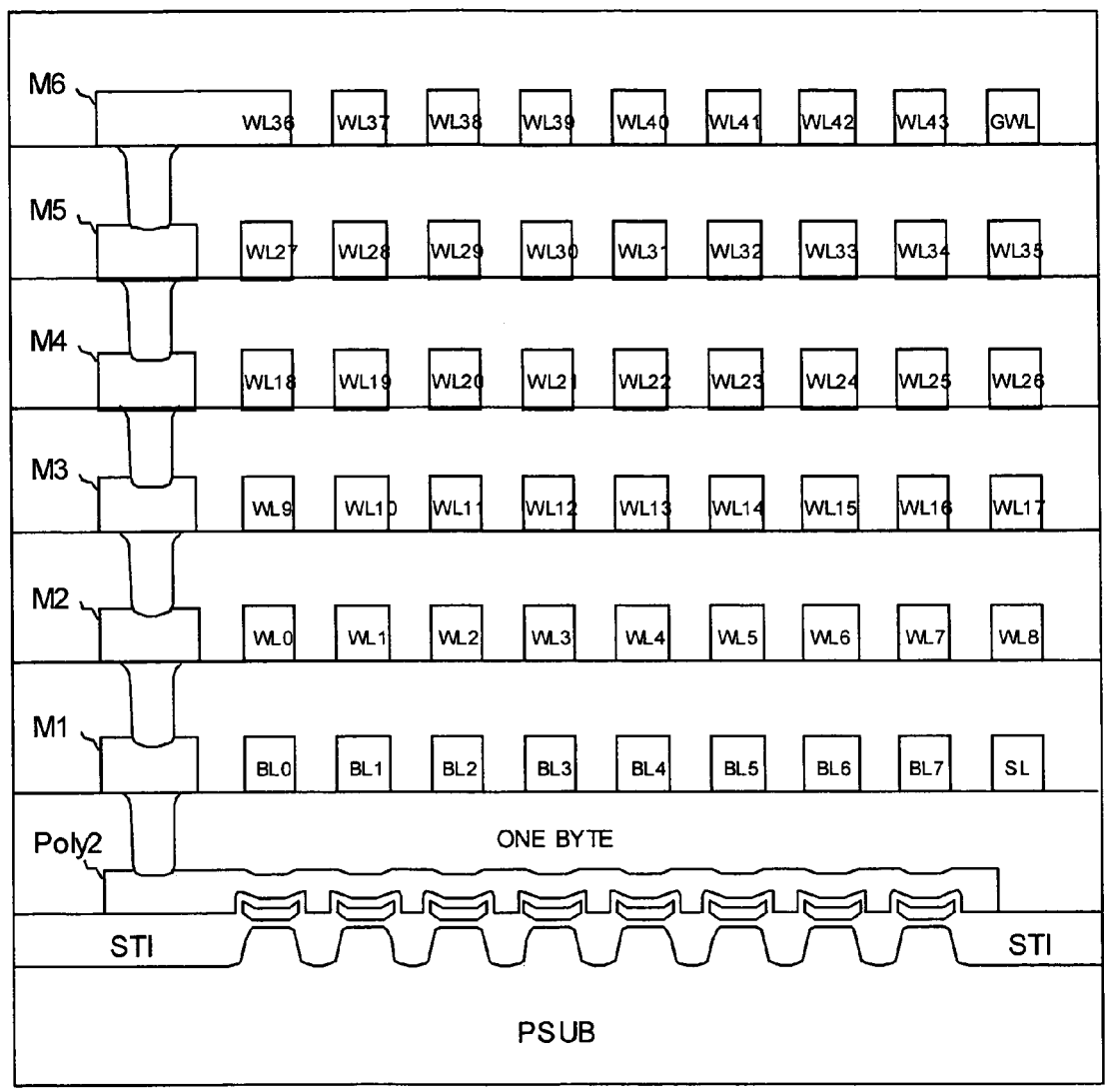

With reference to FIG. 21 and FIG. 22 EEPROM arrays, two major design differences exist between the byte-wordline decoder of FIG. 21 and FIG. 19. The first concerns the handling of the byte-wordline voltage. The second is the increase in erase voltage to −15V for byte-wordlines of EEPROM with 0V P-well in triple well or 0V P-substrate. The unselected byte-wordlines can be left floating for 3Tr-OR cell array, but the unselected byte-wordlines have to be grounded during erase, program and read to avoid bitline leakages in FIG. 21 and FIG. 22. In 3Tr-OR, the FLASH cell is in series with two n-channel transistors. When the cell's gate is in floating, the bitline will not conduct any leakage because the n-channel select transistor will block it. The operations of cell arrays of the present invention are now explained.

Assuming WL0 is selected for byte-erase, then a negative high-voltage of −15V has to be coupled to WL0. The P-well of byte-wordline decoders on top of the array has to be biased at ground level with SB0 at 0V and GWL at −15V. The rest of WL1 to WLk has to coupled to ground with SB1 to SBK at −15V. Each byte-wordline requires a n-channel pull-down device to discharge them to ground. This n-channel device has to be formed in the same triple well on top and is not shown over here for simple drawing. As a consequence, only the selected byte-wordline, WL0, is erased and the rest of the byte-wordlines are not disturbed in the erase operation in units of bytes. For programming eight consolidated bits by CHE, the selected byte-wordline is coupled to +10V. The rest of byte-wordlines of WL1 to WLK are held to ground without causing any bitline leakage. The bitlines of MBL0 to MBL7 are either coupled to 5V or ground for programming or program-inhibit respectively. Since only one single byte-wordline gets erased each time, there is no over-erase issue in this 1Tr-OR EEPROM array of the present invention. Because the CHE program for EEPROM cells and FLASH cells are the same, the details are not further explained here for concise description.

Figure 23:
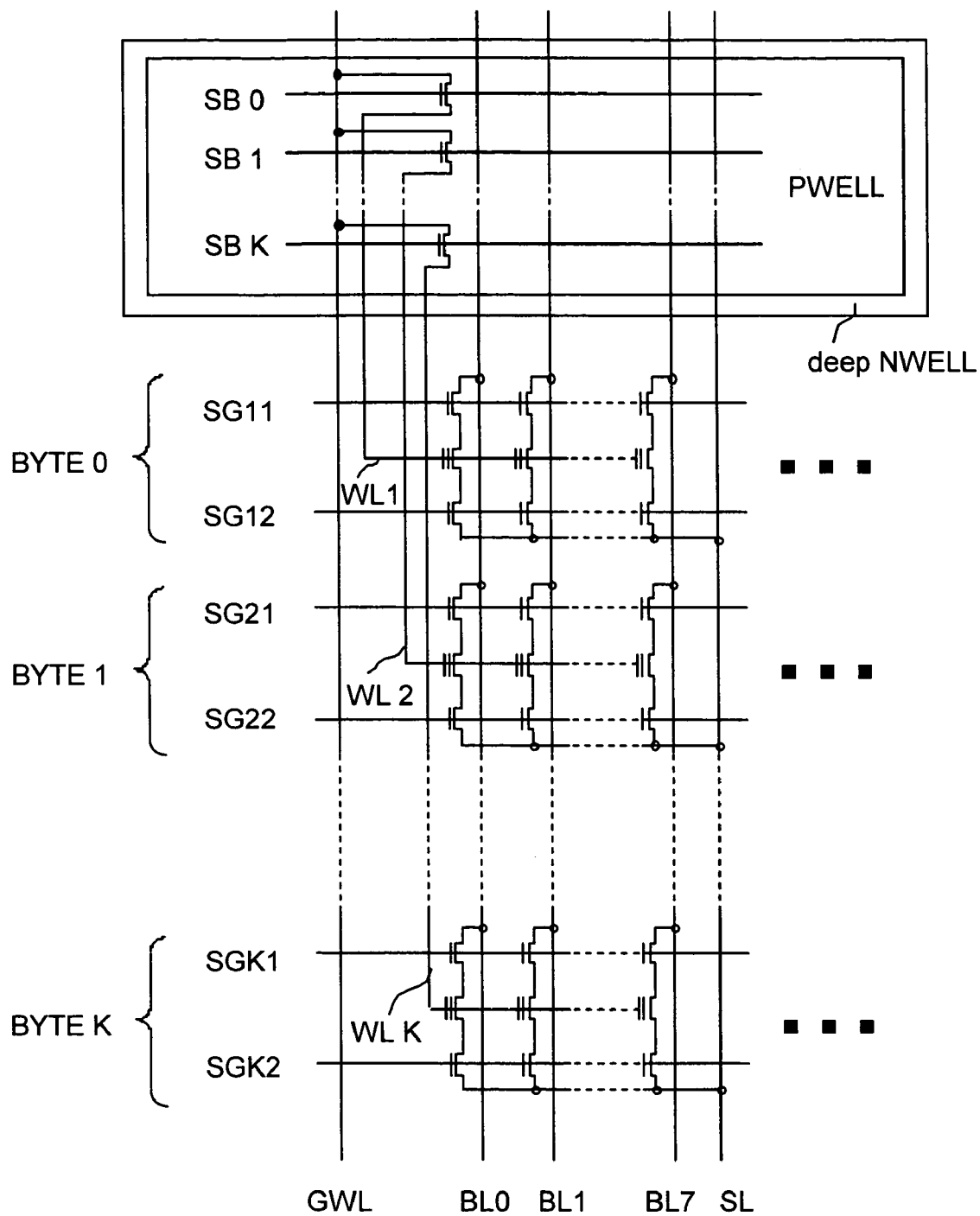
FIG. 23 illustrates one more example of a preferred schematic and physical layout arrangement of byte-wordline decoders applying to Toshiba's 3Tr-NAND cell array of the present invention. The plurality of the byte-wordline decoders are removed from the cell array in one large triple well located on top of the array without any well division in the array to save area as shown in FIG. 19A.

FIG. 23 illustrates yet another preferred embodiment of the present invention of same schematic and physical layout arrangement of byte-wordline decoders applying to Toshiba's 3Tr-NAND cell array of the present invention. The plurality of the byte-wordline decoders are removed from the cell array and are placed in one big triple well located on top of array without any well division in array to save area like FIG. 19A. The detailed operation can be similar to FIG. 19, so is not repeated here.

Figure 24:
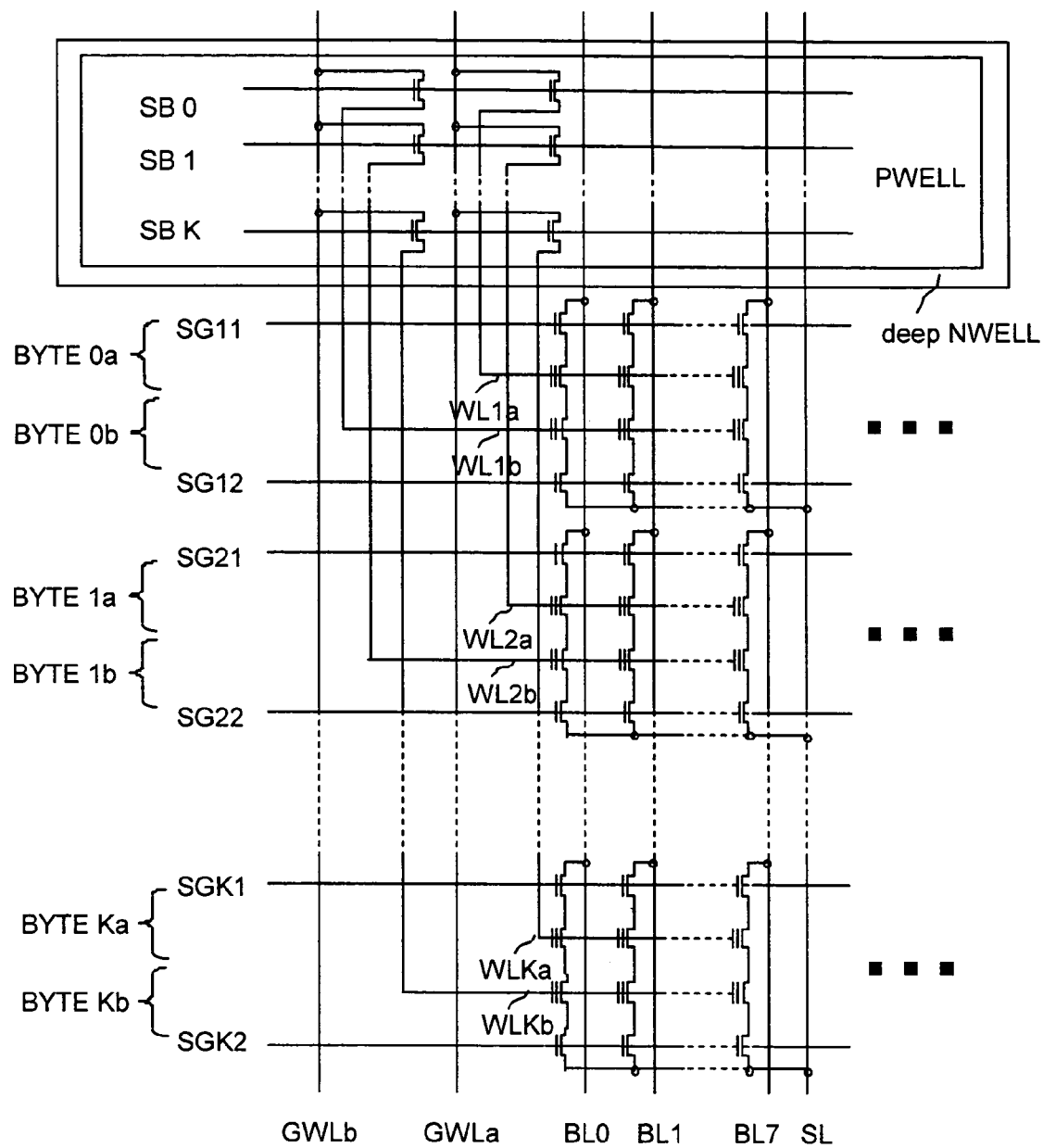
FIG. 24 illustrates one more example of a preferred schematic and physical layout arrangement of byte-wordline decoders applying to Toshiba's 4Tr-NAND cell array of the present invention. The plurality of the byte-wordline decoders are removed from the cell array in one large triple well located on top of the array without any well division in array to save area as FIG. 19A.

FIG. 24 illustrates yet another preferred embodiment of the present invention of the same schematic and physical layout arrangement of byte-wordline decoders applying to Toshiba's 4Tr-NAND cell array of the present invention. The plurality of the byte-wordline decoders are removed from the cell array and are placed in one large triple well located on top of the array without any well division in the array to save area as FIG. 19A. The detailed operation can be similar to FIG. 19, so is not repeated here.

Figure 25:
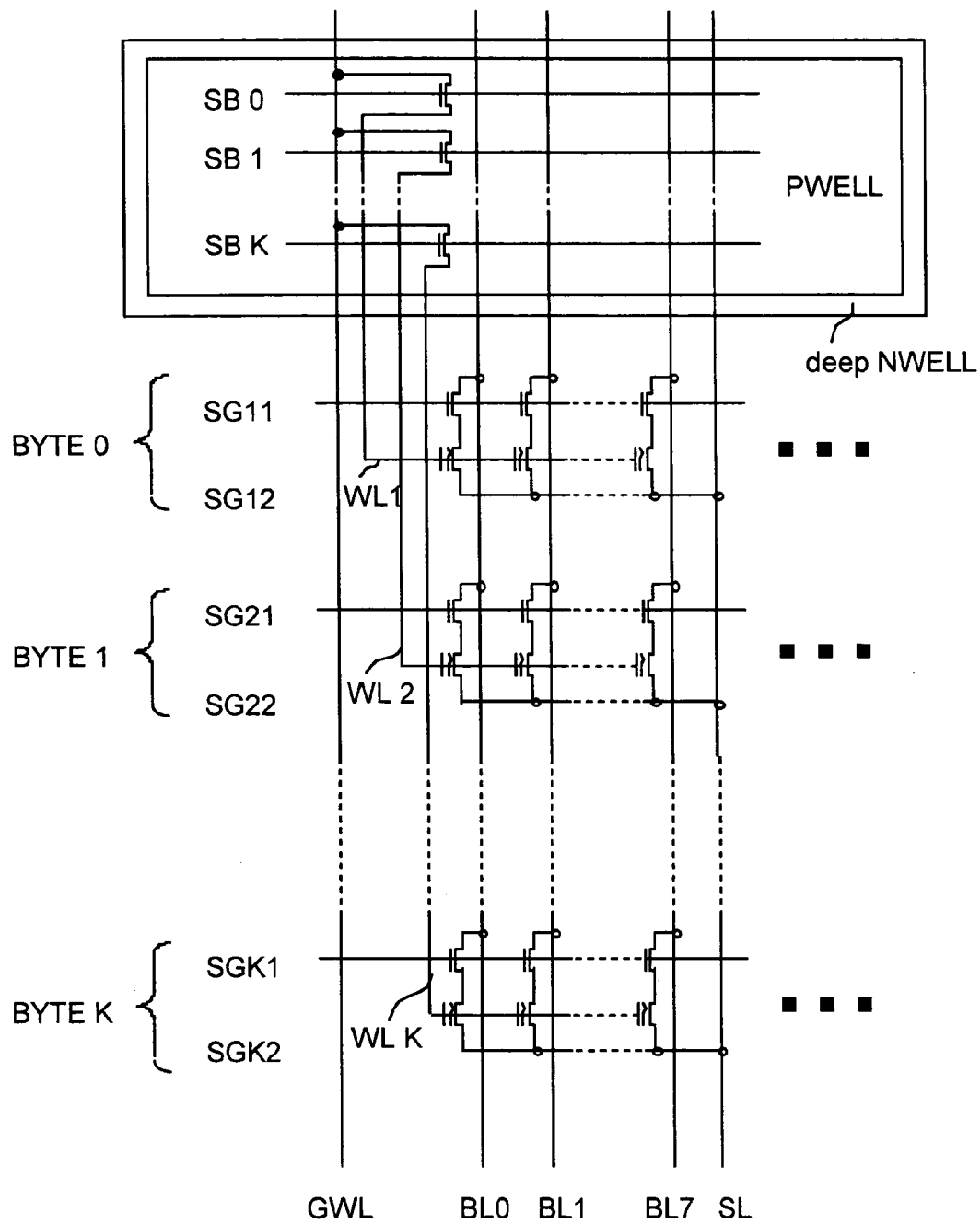
FIG. 25 illustrates one more example of a preferred schematic and physical layout arrangement of byte-wordline decoders applying to traditional 2Tr-FLOTOX cell array of the present invention. The plurality of the byte-wordline decoders are removed from the cell array in one large triple well located on top of the array without any byte-wordline transistor whose drain is connected to GWLK, gate connected to BG, and source connected to WLK in the array to save area as shown in FIG. 13.

FIG. 25 illustrates still another preferred embodiment of the present invention of the same schematic and physical layout arrangement of byte-wordline decoders applying to a prior art of 2Tr-NAND cell array and including Aplus' 2Tr-OR BN+ S/D array of the present invention. The plurality of the byte-wordline decoders is removed from the cell array and is placed in one big triple well located on top of array without any, byte-wordline transistor whose drain is connected to GWLK, gate connected to BG and source connected to WLK in the array to save area as shown in FIG. 13. The detailed operation is similar to FIG. 19 so is not repeated here.

Figure 26:
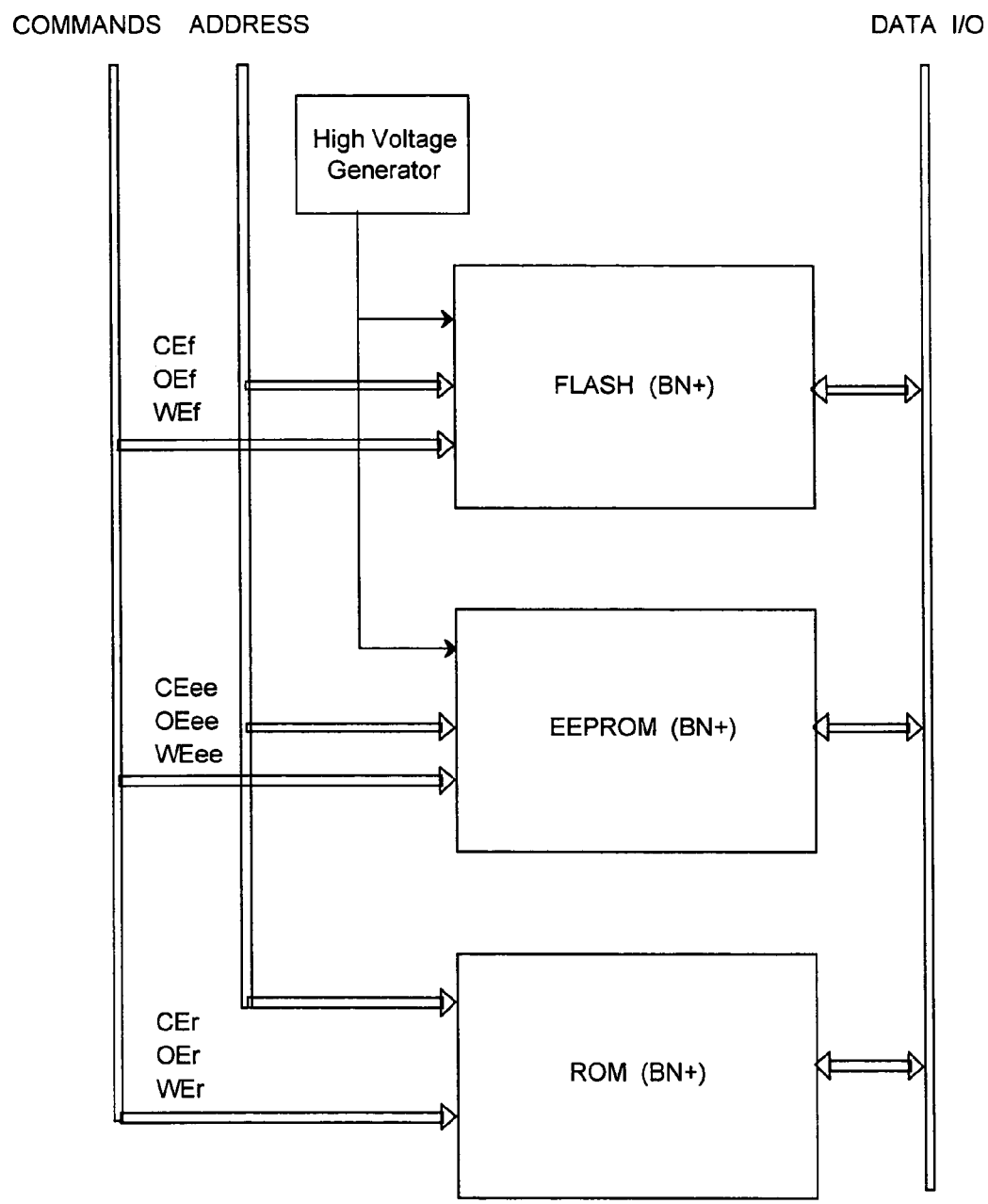
FIG. 26A illustrates a preferred combo nonvolatile memory comprised of FLASH, EEPROM and ROM with one unified cell structure of BN+ S/D. Since the CPU will not read data from all three memories simultaneously, the address lines, and data lines can be shared by the three nonvolatile memories. The chip-enable (CE) and output-enable (OE) are respectively assigned to individual memory to avoid multiple read at the same time. FLASH memory can be used to store program code or data that is erased by page or block. EEPROM is used for storing data that requires high-frequency change rates in units of bytes. ROM can be utilized to store program code. ROM can be used to store data when FLASH is used to store program code. Both EEPROM and FLASH require on-chip high voltage charge pumps for program and erase operations when a single low power supply VDD is used.
FIG. 26B illustrates another preferred embedded nonvolatile memory comprised of FLASH, EEPROM and ROM with one unified cell structure of BN+ S/D.
Figure 26:
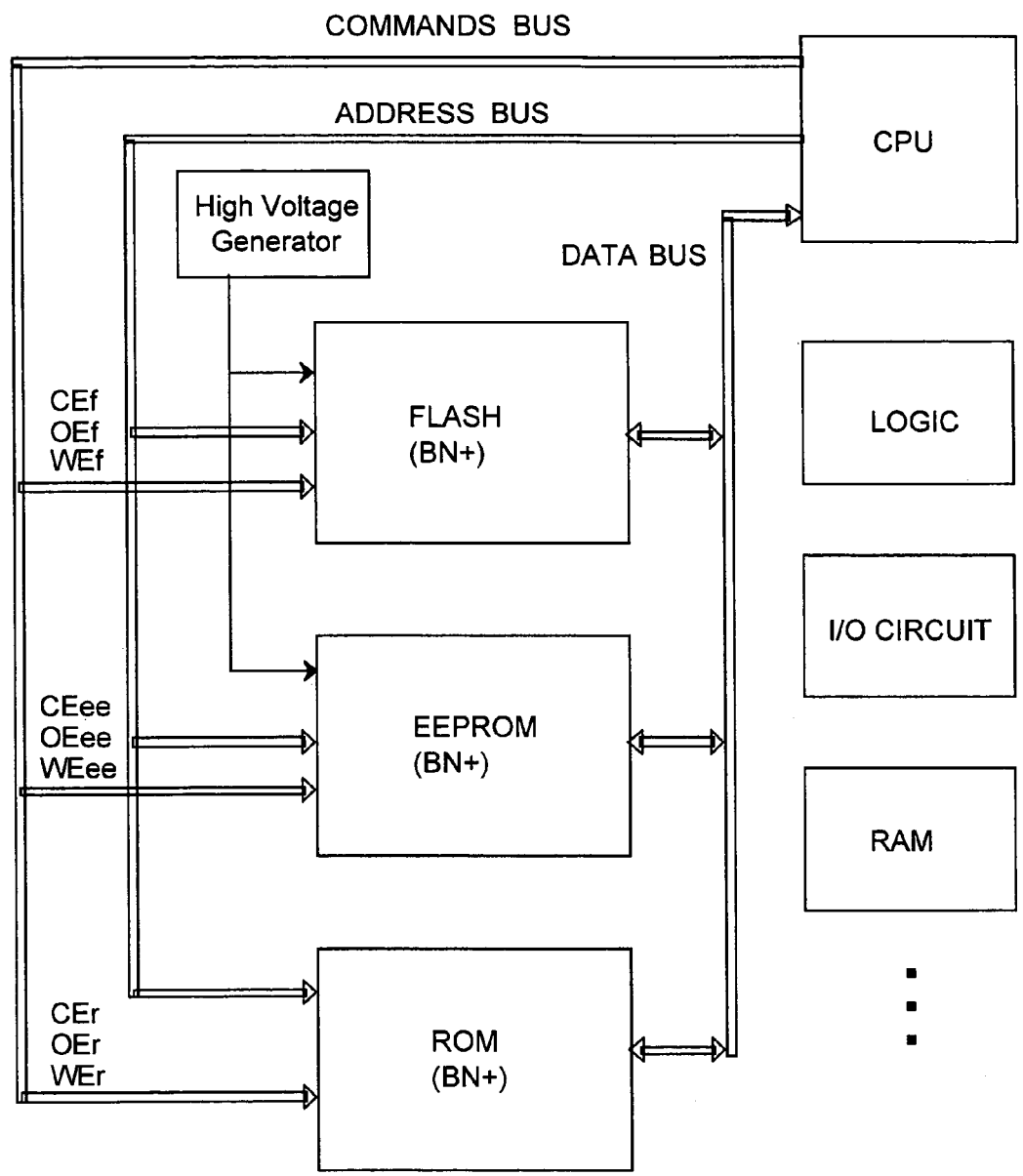

FIG. 26A illustrates a preferred combo nonvolatile memory comprised of three memories of FLASH, EEPROM and ROM with one unified cell structure of BN+ S/D. Since the CPU will not read data from all three memories simultaneously, the address lines, and data lines can be shared by the three nonvolatile memories. The chip-enable (CE) and output-enable(OE) are respectively assigned to individual memory to avoid data contention in read operation. Only Flash and EEPROM memories require write-enable WE. For example, CEf, OEf and WEf are the chip-enable, output-enable and write-enable for the FLASH part. CEee, OEee and WEee are the chip-enable, output-enable and write-enable for the EEPROM part. CEr and OEr are the chip-enable, output-enable and write-enable for the ROM part. When CEf is in a low state, the FLASH will be disabled to consume zero power and enters into standby mode. When OEf is in low state, all FLASH outputs will be disabled and enter into high-impedance state. When WEf is in low state, the FLASH will not allow any program and erase operations. By contrast, when CEf, OEf and WEf are in high states, the FLASH is enabled for operation, the outputs are enabled to output further data and ready to accept program and erase commands. Similarly, the signal control of CEee, OEee and WEee for the EEPROM part and CEr and OEr for the ROM part is equivalent to FLASH and thus will not be described here. This novel nonvolatile memory can share a low-voltage VDD supply without any additional high-voltage power supply for program and erase operations.

FIG. 26B illustrates a preferable embedded nonvolatile memory system comprised of three memories of FLASH, EEPROM and ROM made of one unified cell structure of BN+ S/D, CPU (microprocessor for executing instructions of program), RAM, (temporary memory for scratch pad and other circuit parts such as encryption and decryption circuits), Analog circuits and RF circuits etc. In this embedded chip, the high-voltage pump generator can be shared by FLASH and EEPROM. The CPU will not read data from all three memories simultaneously so that the address lines, and data lines can be shared by three nonvolatile memories. One function of this embedded system is to read data from one memory at a time from ROM, EEPROM, FLASH and RAM respectively but still allow for the simultaneous operations of program and erase. During the erase and program operation, the built-in on-chip logic will automatically inform CPU of the completion of the P/E operations of EEPROM or FLASH. Therefore, the whole CPU system speed will not be jeopardized during the program and erase operation period. One of the applications of FIG. 26B is the Smart card chip design.

Figure 27:
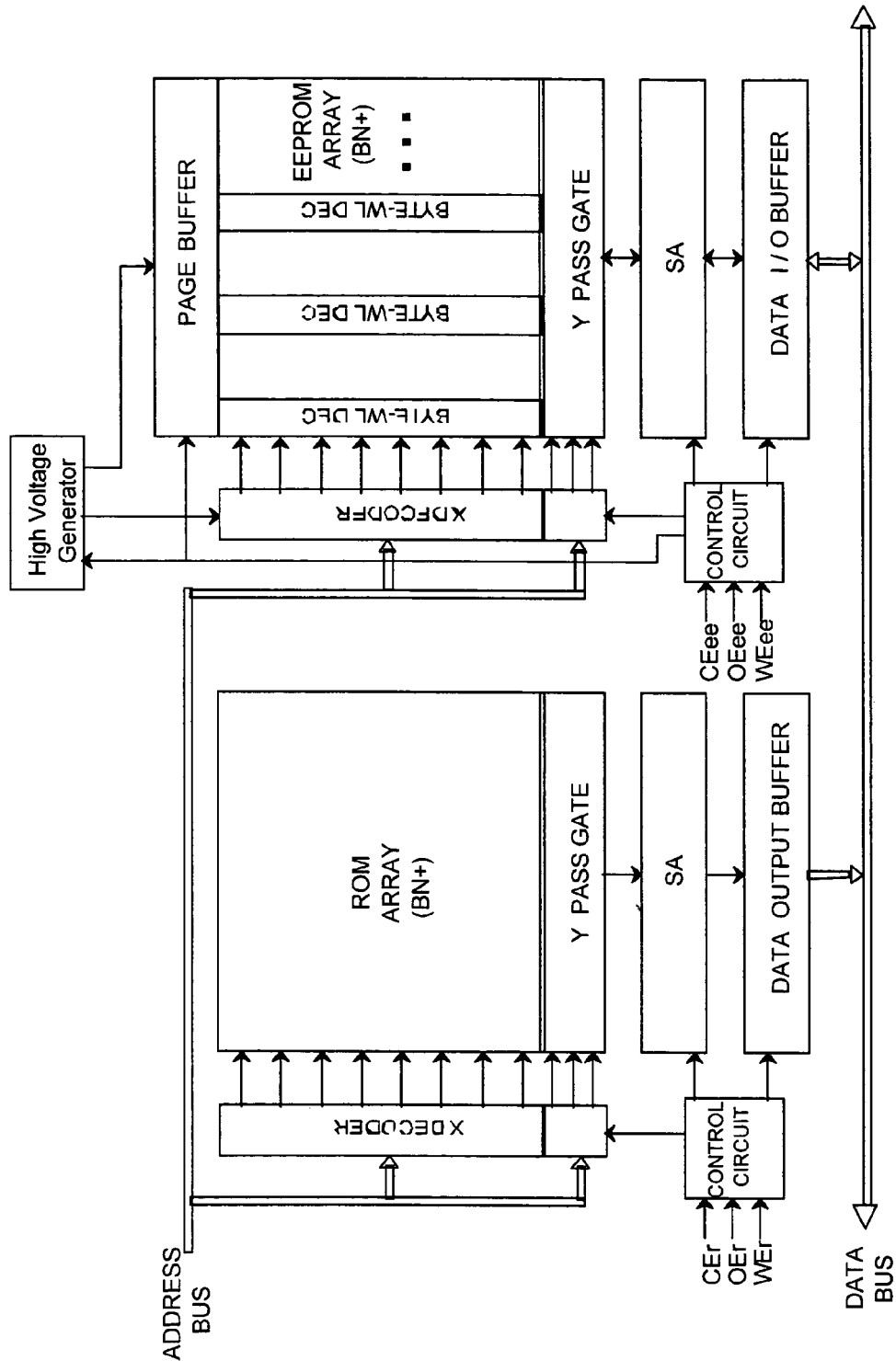
FIG. 27 illustrates a preferred combo nonvolatile memory comprised of EEPROM and ROM with one unified cell structure of BN+ S/D of the present invention. Since CPU will not read data from all three memories simultaneously, the address lines, and data lines can be shared by the two nonvolatile memories. The chip-enable (CE) and output-enable (OE) are respectively assigned to individual memory to avoid multiple read at the same time. EEPROM is used for storing data that requires high-frequency change rates in units of bytes. ROM can be utilized to store program code. EEPROM employs schemes of FN-channel erase and FN-channel program. EEPROM requires on-chip high voltage charge pumps for program and erase operations when single low power supply VDD is used. ROM data can only be changed at fab site when photo mask changes.

FIG. 27 illustrates a preferred combo nonvolatile memory comprised of EEPROM and ROM made of one unified cell structure of BN+ S/D of the present invention. Since the CPU will not read data from two memories simultaneously the address lines, and data lines can be shared by both nonvolatile memories. The chip-enable (CE) and output-enable(OE) are respectively assigned to individual memory to avoid data contention in read operation. EEPROM is used for storing data that requires high-frequency change rate in units of bytes. ROM can be utilized to store fixed program code. The EEPROM part employs schemes of FN-channel erase and FN-channel program of 3Tr-OR or 2TR-OR EEPROM cells and EEPROM byte-wordline decoders as depicted in FIG. 19 or FIG. 20. EEPROM requires on-chip high voltage charge pumps for program and erase operations when the single low power supply VDD is used. ROM data can only be changed at the fab site when the photo mask is changed. The sense amplifiers have the option of being shared by both nonvolatile memories as shown in FIG. 27.

Figure 28:
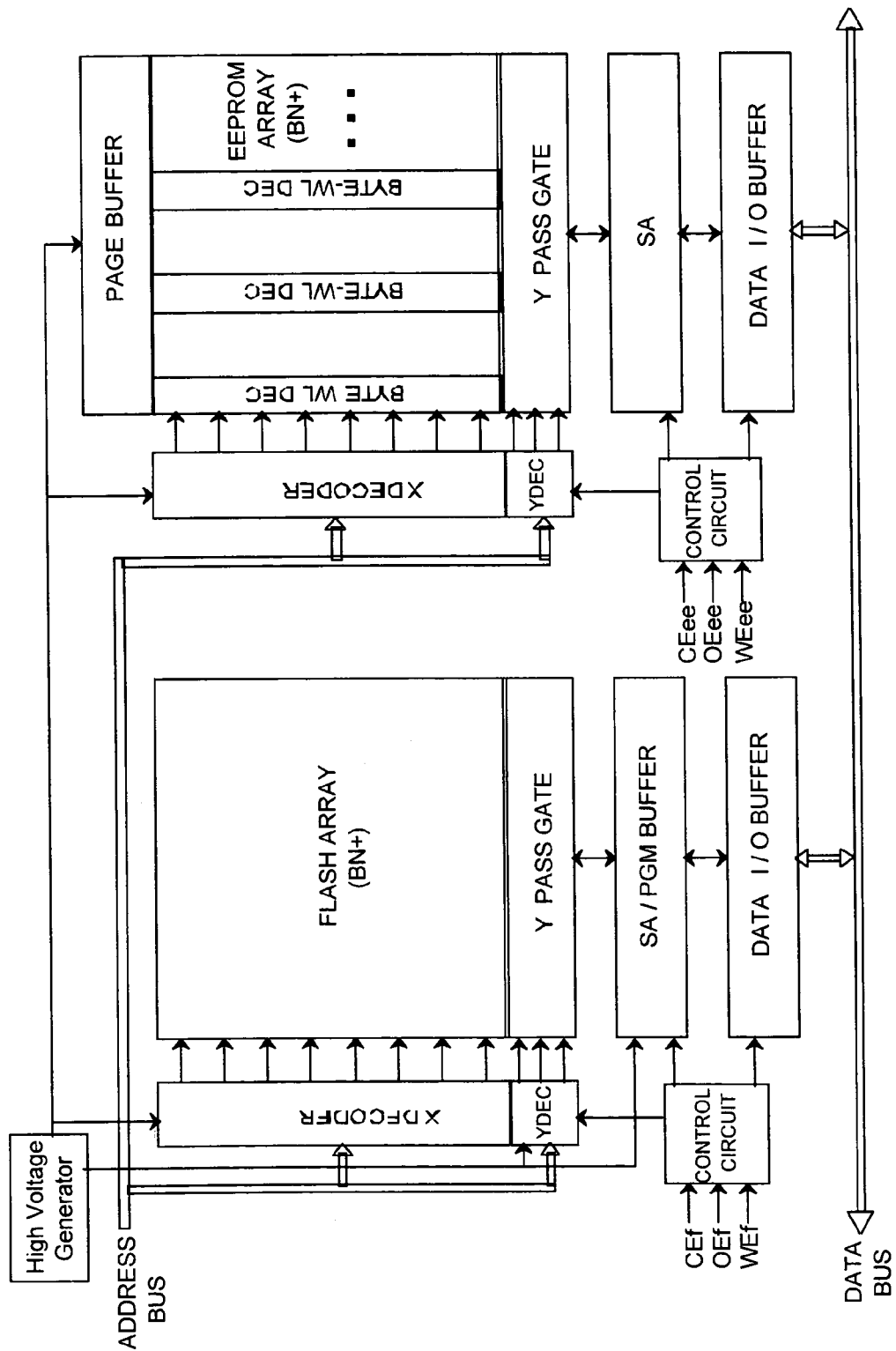
FIG. 28 illustrates a preferred combo nonvolatile memory comprisied of FLASH, and EEPROM with one unified cell structure of BN+ S/D of the present invention. Both EEPROM and FLASH employ schemes of FN-channel erase and FN-channel program. Since the CPU will not read data from all two memories simultaneously, the address lines, and data lines can be shared by the three nonvolatile memories. The chip-enable (CE) and output-enable(OE) are respectively assigned to individual memory to avoid multiple read at the same time. FLASH memory can be used to store program code that is erased by page or block. EEPROM is used for storing data that requires high-frequency change rates in units of bytes. Both EEPROM and FLASH require on-chip high voltage charge pumps for program and erase operations when single low power supply VDD is used.

FIG. 28 further illustrates a preferred embodiment of a combo nonvolatile memory comprising 1Tr-OR FLASH and 3Tr-OR or 2Tr-OR EEPROM made of one unified cell structure of BN+ S/D of the present invention. Both EEPROM and FLASH employ schemes of FN-channel erase and FN-channel program. Since the CPU will not read data from two memories simultaneously, the address lines and data lines can be shared by both nonvolatile memories. The chip-enable (CE) and output-enable(OE) are respectively assigned to individual memory to avoid data contention in read operation. FLASH memory can be used to store program code that is erased by page or block. EEPROM is used for storing data that requires high-frequency change rate in units of bytes. Both EEPROM and FLASH require on-chip, high voltage charge pumps for program and erase operations when single low power supply VDD is used. The sense amplifiers have the option of being shared by both nonvolatile memories. The type of byte-wordline decoder layout and scheme is the same as FIG. 20 but can be modified to FIG. 19.

Figure 29:
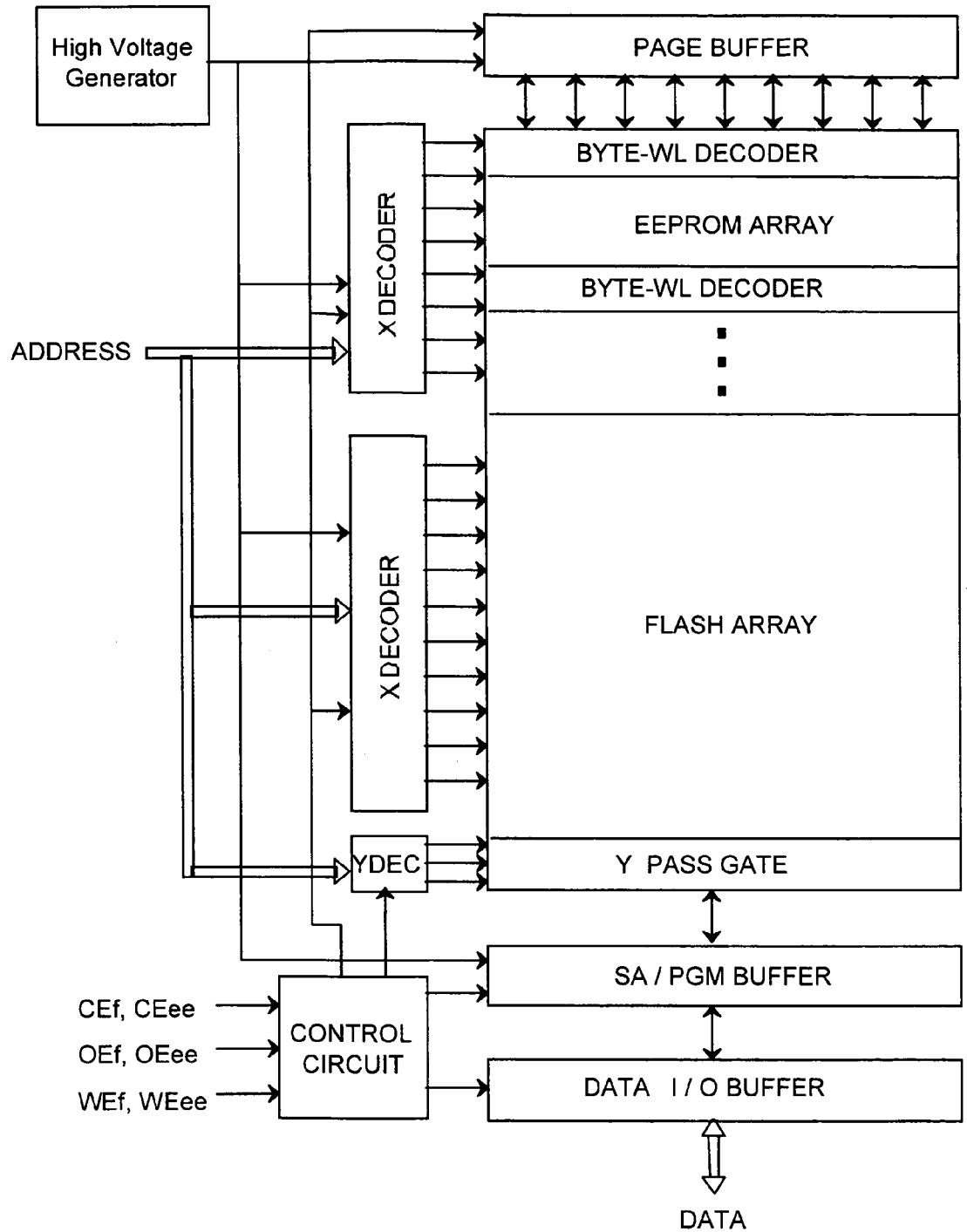
FIG. 29 illustrates a preferred combo nonvolatile memory comprised of FLASH and EEPROM with one unified 1Tr-ETOX cell structure. EEPROM employs schemes of FN-channel erase and FN-channel program. Since the CPU will not read data from the two memories simultaneously, the address lines, data lines, Sense Amplifiers (SA), and Data I/O buffers can be shared by both nonvolatile memories. The chip-enable (CE) and output-enable(OE) are respectively assigned to individual memory to avoid multiple read at the same time. FLASH memory can be used to store program code that is erased by page or block. EEPROM is used for storing data that requires high-frequency change rate in units of bytes. Both EEPROM and FLASH require on-chip high voltage charge pumps for program and erase operations when single low power supply VDD is used.

FIG. 29 illustrates a preferred combo nonvolatile memory comprising FLASH and EEPROM made of one unified 1Tr-ETOX cell structure. Both EEPROM and FLASH part employ the same schemes of FN-channel or FN-edge erase but CHE fast program. Since the CPU will not read data from two memories simultaneously, the address lines, data lines, sense amplifier, page buffers and I/O buffers can be shared by both nonvolatile memories. The chip-enable (CE) and output-enable(OE) are respectively assigned to individual memory to avoid data contention issue in read operation. FLASH memory blocks. EEPROM is used for storing can be used to store program code that is erased in units of pages or data that requires high-frequency change rate in units of bytes. Both EEPROM and FLASH require on-chip high voltage charge pumps for program and erase operations when single low power supply VDD is used; the x-decoders for EEPROM and FLASH are separated and optimized for respective layout pitch and circuit designs. No over-erase issue will occur to the EEPROM part according to the present invention. The EEPROM cells will suffer some 5V bitline disturb during repeat CHE program operation. In order to lengthen P/E cycles, the number of cells in each divided bitline in EEPROM is optimal if kept within 16. The optimal cells' Vt of EEPROM part can be lower than cells' Vt of FLASH part because the traditional FLASH over-erase issue will not occur in the EEPROM of the present invention.

Figure 30:
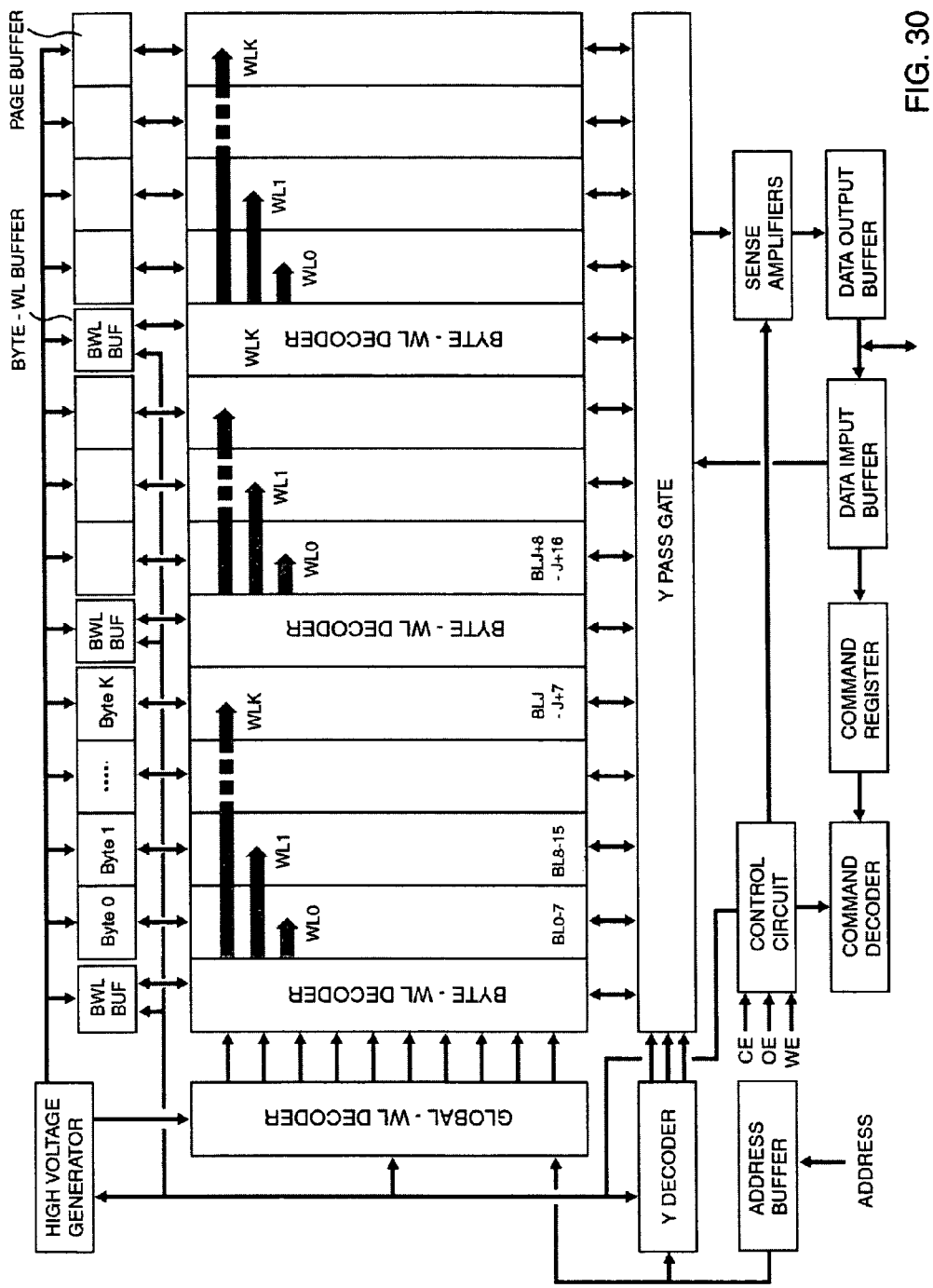
FIG. 30 illustrates an example of one preferred pure EEPROM nonvolatile memory of BN+ S/D of the present invention. EEPROM employs schemes of FN-channel erase and FN-channel program. For high density EEPROM, the byte-wordline decoders are inserted in the array and connecting metal lines are run horizontally to connect the outputs of byte-wordline decoders to the divided wordlines. Similarly, the byte-wordline decoders can be placed on top of the array like FIG. 19A.

FIG. 30 illustrates an example of one preferred pure EEPROM nonvolatile memory made of 3Tr-OR or 2Tr-OR, BN+ S/D of the present invention. EEPROM employs schemes of FN-channel erase and FN-channel program. For high density EEPROM, the byte-wordline decoders are inserted in the array and connecting metal lines run horizontally to connect the outputs of byte-wordline decoders to the divided wordlines. Similarly, the byte-wordline decoders can be placed on top of the array to connect the plurality of byte-wordlines by running vertical metal lines as FIG. 19A. This EEPROM memory allows byte-erase, page erase and chip-erase like the traditional FLOTOX cell array but has superior performance in terms of cell scalability. The plurality of byte-wordline decoders may have to be inserted in the array as memory density increases. A global-WL decoder is designed at the left side of array. Its outputs are than connected to a plurality of Byte-WL decoders via multiple metal layers. Each byte-WL decoder can be connected to K byte-WL decoders as seen from FIG. 30.

FIG. 31A and FIG. 31B illustrate a prior art's write scheme for a traditional FLASH that performs FN-channel erase in unit of blocks to increase cells' Vt more than the desired value and then followed by a bit-by-bit, FN-edge program at drain side of cell. The Vts distribution of block erase is in a wide range due to a big number of cells are selected for erase. The cells' characteristics are in wide ranges such as different erase and program speed due to varied tunnel oxide thickness, coupling ratio and cells' junctions' profile and many others. The programmed Vt distribution in a selected page is much narrower than those cells' Vt after erase in a big block. The reason for tight programmed Vt is that the program operation can be performed on bit-by-bit basis that makes cells' Vt control very efficiently and effectively. This scheme does not use high-quality FN-channel program thus is not suitable for EEPROM market.

FIG. 32A and FIG. 32B illustrate another prior art's write scheme for a traditional FLASH that performs FN-channel erase in unit of blocks to decrease cells' Vt lower than the desired value and then followed by a bit-by-bit, FN-channel program in channel region of cell. The block erase conditions are about −15V on gate and 0V on both source and drain to induce FN-tunneling effect. The Vts distribution of block erase is in a wide range due to a big number of cells are selected for erase. The cells' characteristics are in a wide ranges such as different erase and program speed due to the varied tunnel oxide thickness, coupling ratio and cells' junctions' profile and many others. The programmed Vt distribution in a selected page is much narrower than those cells' Vt after erase in a big block. The reason for tight programmed Vt is that the program operation can be performed on bit-by-bit basis that makes cells' Vt control very efficiently and effectively. The disadvantage of this write scheme is the severe over-erase issue in block erase in a NOR-type cell array. Therefore, this scheme is not suitable for Flash in code market that requires erase operation performed in units of big blocks and immure to over-erase issue.

FIG. 33A and FIG. 33B illustrate a novel scheme of a 3-step write scheme to be used in either 1Tr-OR FLASH or 3Tr-OR EEPOM of the present invention. It performs first-step of FN-channel block-erase in units of blocks and second-step of FN-channel reverse-program in units of page and third step of bit-selective program that was invented by Aplus' same inventors. In conclusion, the same scheme can be utilized by 1Tr-OR, BN+ S/D, FLASH cell associated with 3Tr-OR or 2Tr-OR, BN+ S/D, EEPROM cell for the combo nonvolatile memory of the present invention. The block-erase can be performed by applying VPP of around +15V to gate and 0V to cell's source and drain to induce the FN-tunneling effect to increase cells' Vt. The page reverse-program can be achieved by applying VNN to gate and source and drain coupling to ground. VNN is around −15V typically. The cells' Vts distribution of block erase are in a wide range due to a big number of cells are selected for erase. The cells' characteristics are in a wide ranges such as different erase and program speed due to the varied tunnel oxide thickness, coupling ratio and cells' junctions' profile and many others. The reverse-programmed cells' Vt distribution in a selected page is much narrower than those cells' Vt after erase in a big block. The reason achieving tight programmed cells' Vts is due to the program operation performed in units of page and with a more uniform initial Vt of selected block after block-erase. The tight cells' Vts after program operation is due to the scheme of bit-by-bit FN-channel program which is a well known technique for superior Vt control on individual cell during program operation.

Figures 34A, 34B:
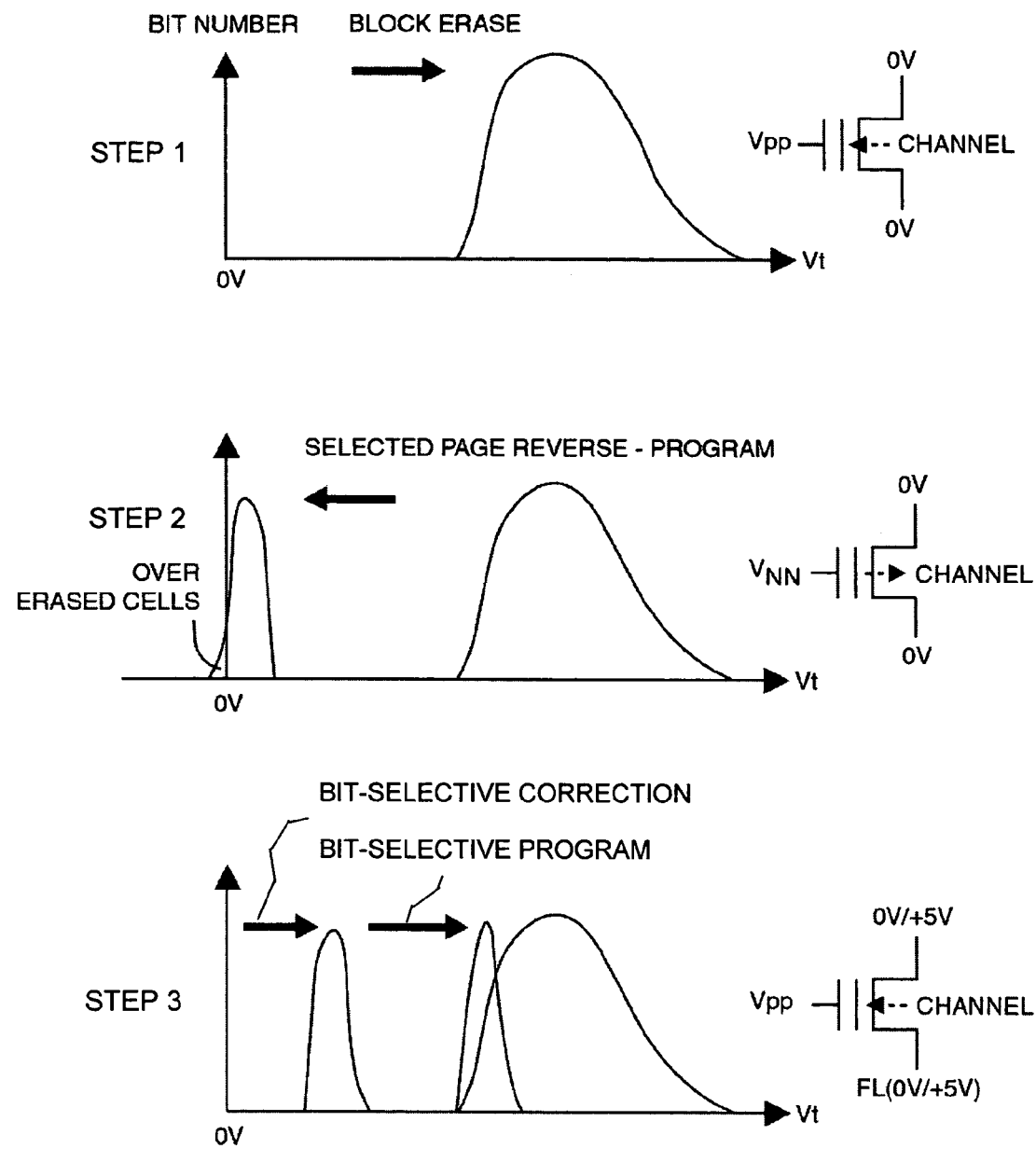
FIG. 34A and FIG. 34B illustrate another novel scheme of a 3-step write scheme to be used in either 1Tr-OR FLASH or 3Tr-OR EEPROM of the present invention.
Figure 35A:
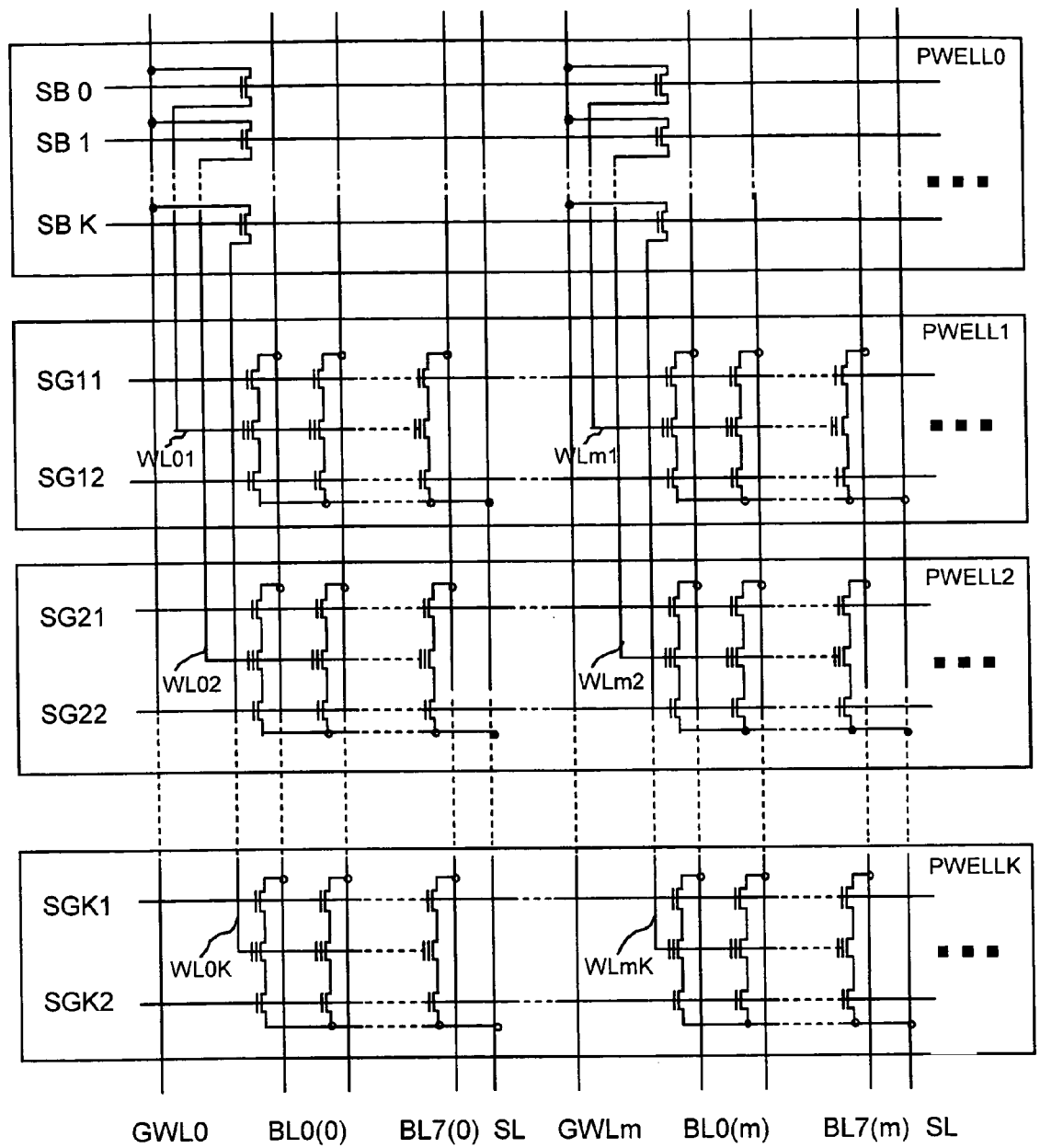
FIGS. 35A–35E illustrate another scheme of the schematic and layout of cell and byte-wordline in a triple well of the present invention. The operating voltage of erase and program operations have been further reduced from 20V to +−10V.
Figure 35B:
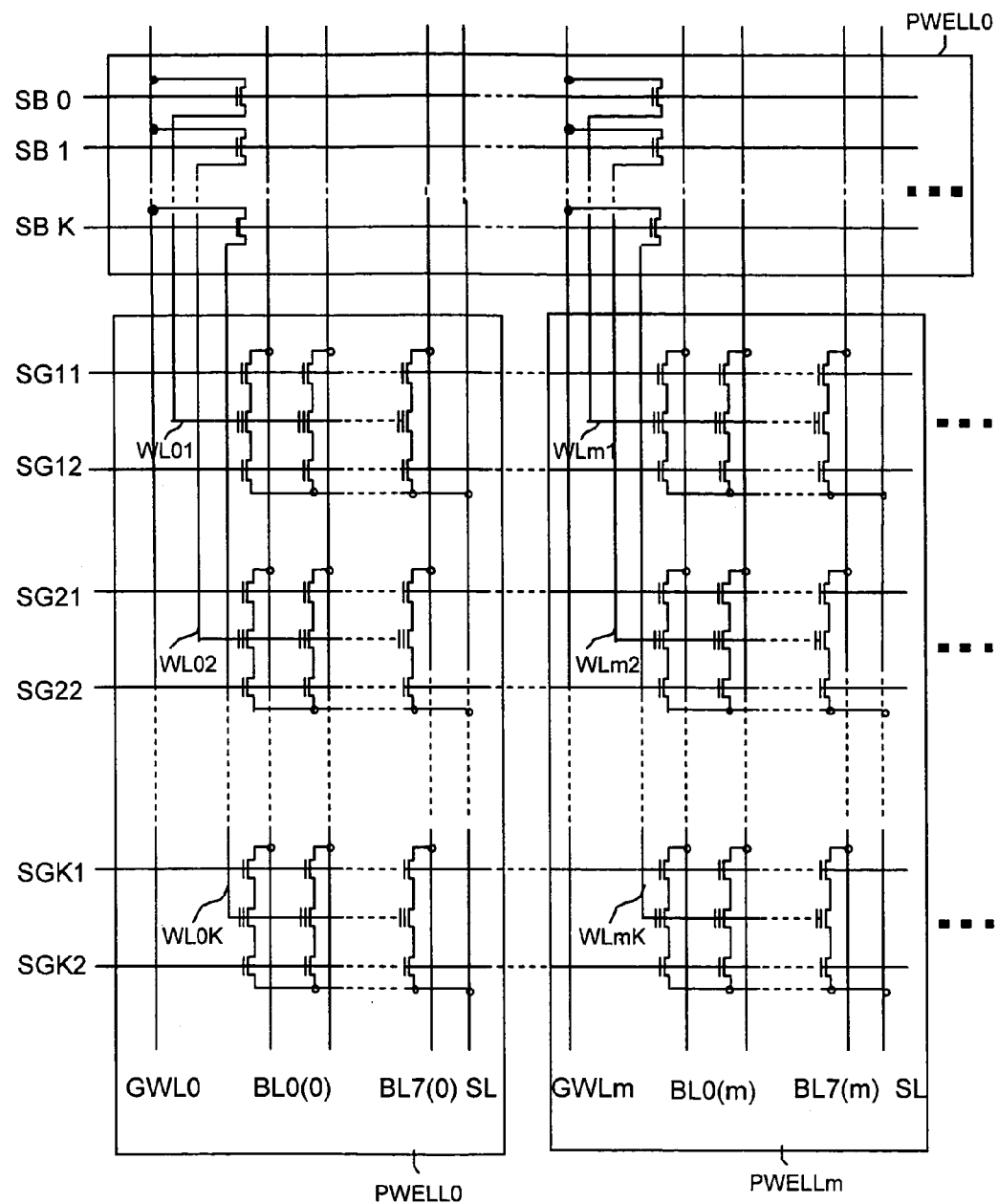
Figure 35C:
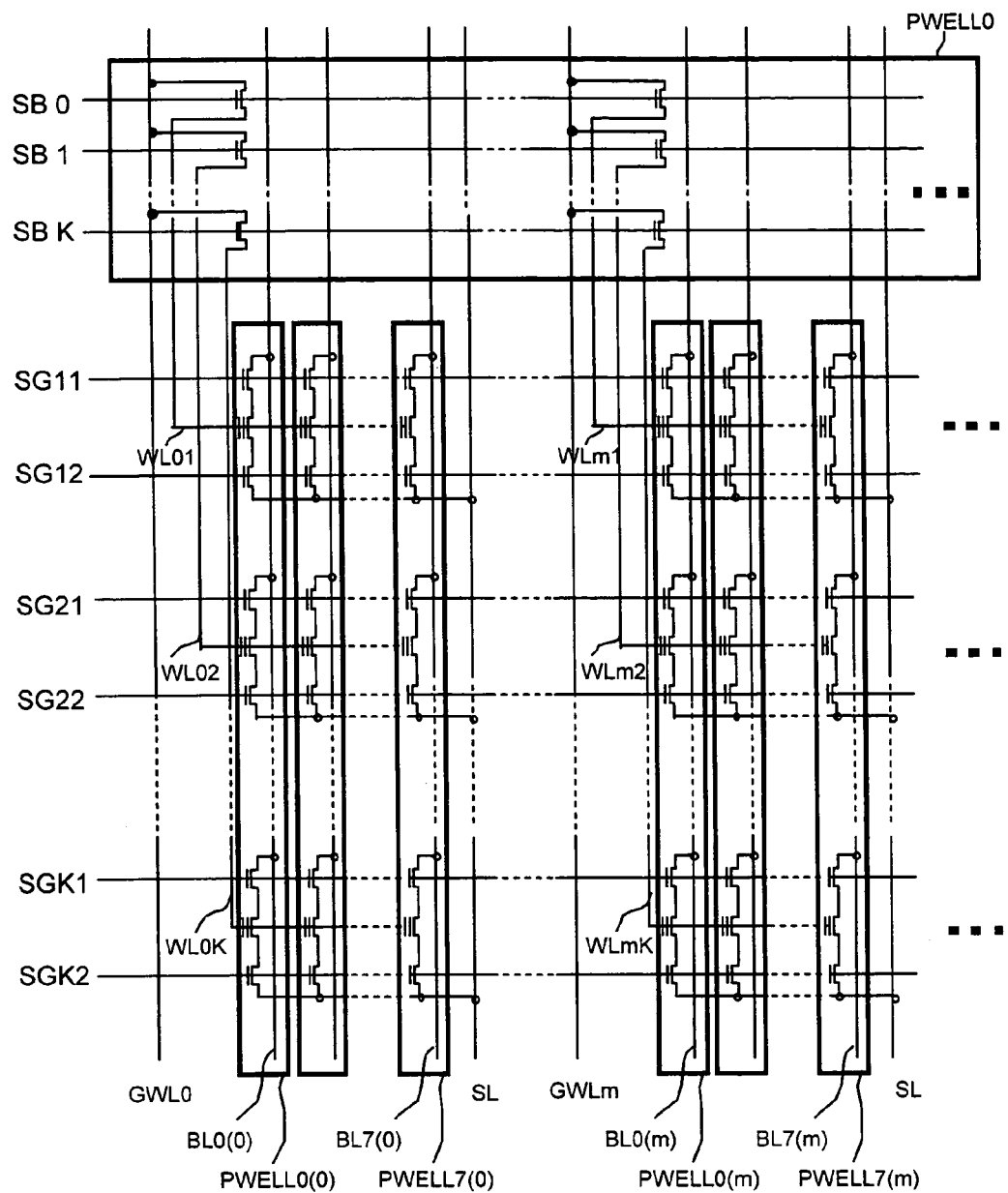
Figure 35D:
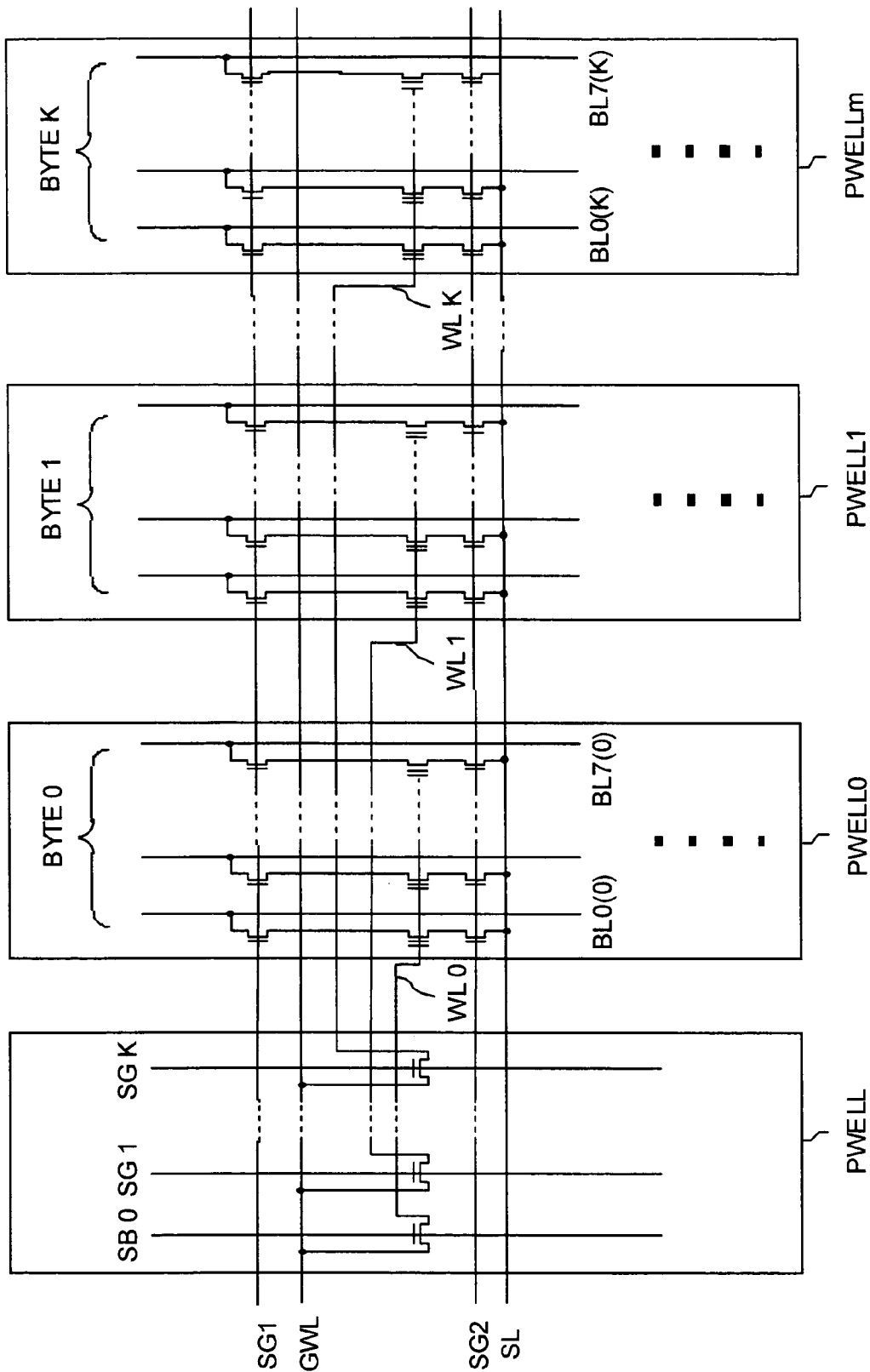
Figure 35E:
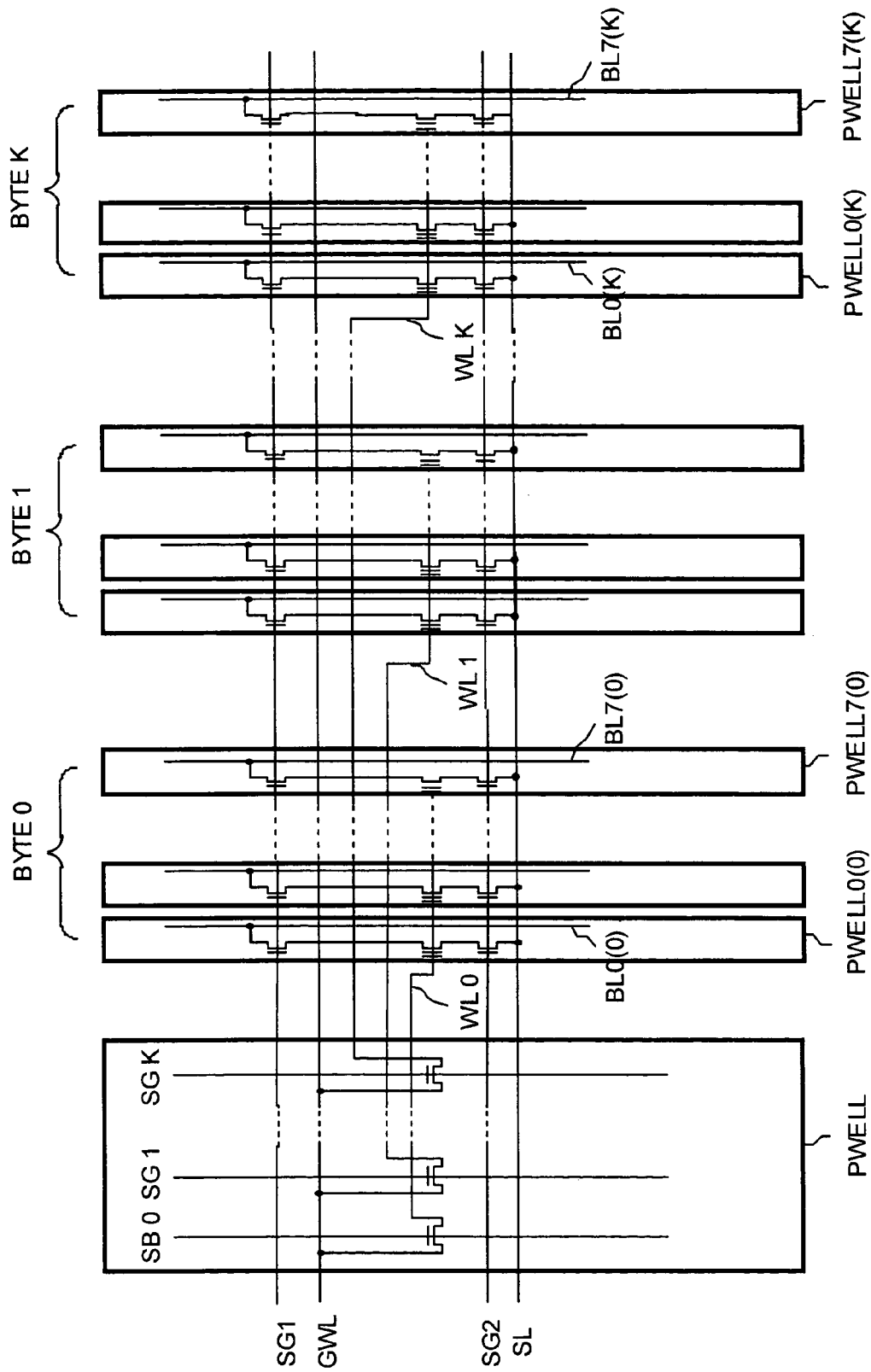

FIG. 34A and FIG. 34B illustrate another novel scheme of a 3-step write scheme to be used in either 1Tr-OR FLASH or 3Tr-OR EEPOM of the present invention. It performs first-step of FN-channel block-erase in units of blocks and second-step of FN-channel reverse-program in units of page and third step of bit-selective program as FIG. 33A and FIG. 33B invented by Aplus' same inventors. The only difference is the Vts of reverse-program. In FIG. 34A, the cells' Vts of a selected page are intended to be programmed lower than the cells' Vts in a page of FIG. 33A. The circuits and technology need no changes and just performs the reverse-program Vt verification at lower value. The approach disclosed in FIG. 34A and FIG. 34B is suitable for the environment of lower VDD operation than the situation of in FIG. 33A and FIG. 33B.

In conclusion, the large FLASH cells' Vts for conventional code market can be very effectively controlled in a very tight distribution for both programmed cells and erased cells in a units of big block by using "3-step write" schemes as proposed in Aplus' pending patent with outcomes predicted in figures of FIG. 32A, FIG. 32B, FIG. 33A and FIG. 33B. The schemes are preferred to be used for 1Tr-OR FLASH, 3Tr-OR EEPROM and 2Tr-OR EEEPROM of the present invention.

The operation of FIG. 35A to FIG. 35E is the same as that of FIGS. 19 and 20. The only difference is to have a split-voltage to reduce from +20V to +/−10V for the lower breakdown voltage requirement in peripheral devices in FN-channel-erase and FN-channel-program.

Figure 36:
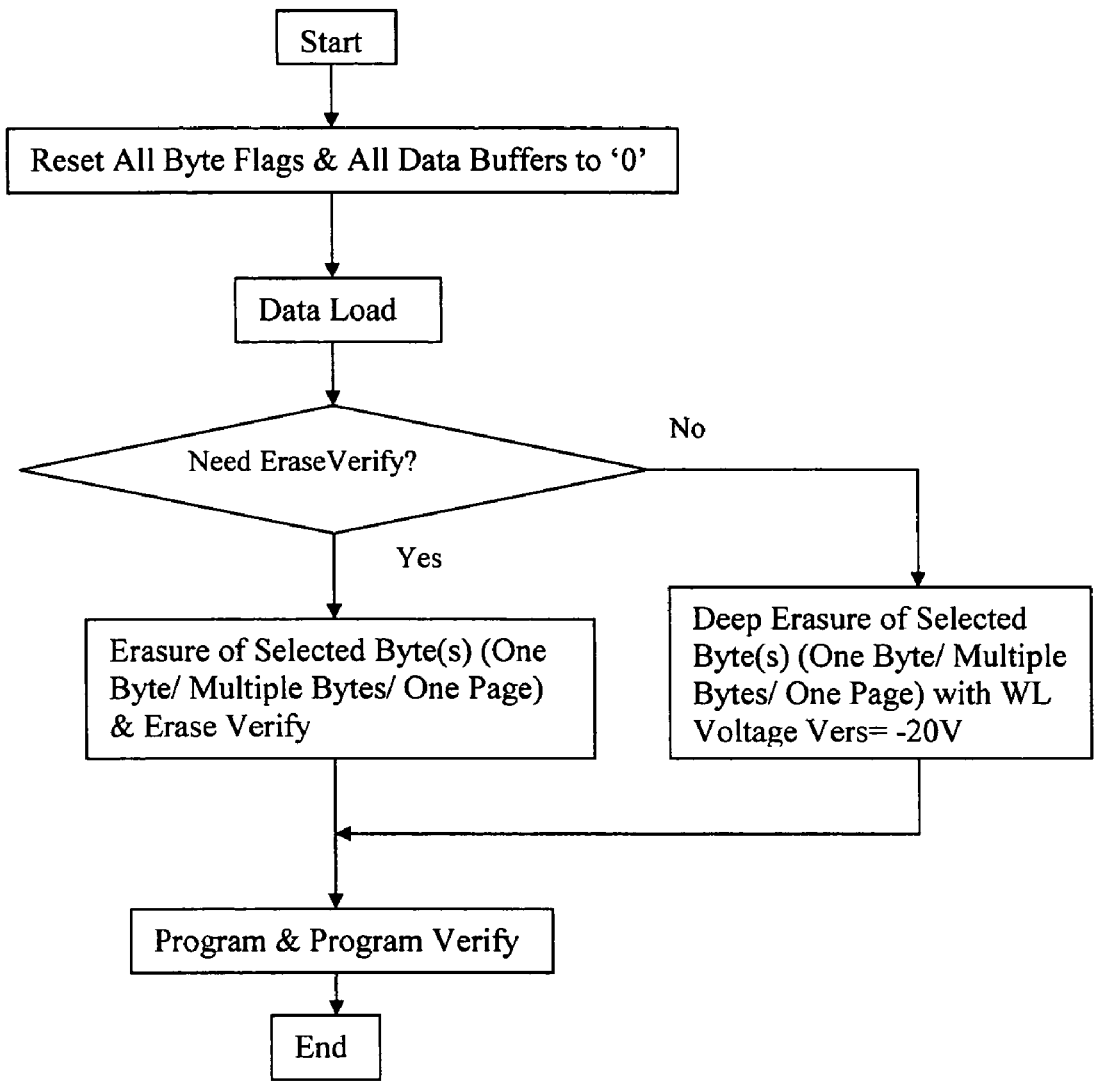
FIG. 36 illustrates a flow chart of erase and program operation of 3Tr-OR EEPROM array of the present invention. The preferred program and erase flows are designed to be performed in units of bytes. Unlike previous arts, an erase verify is implemented to ensure the stress of electric field is reduced for high P/E cycles in the event of varied cell characteristics due to process variations in the cell array.

FIG. 36 illustrates a flow chart of erase and erase verify operations in units of bytes for the novel 3Tr-OR or 2Tr-OR EEPROM array of the present invention. In EEPROM memory, there is on-chip page buffer designed to store the write data in size of page. The page size is around 128 B or 256 B typically. The page buffer comprises of a array of latch-cells. Each bit of data requires a latch-cell to store the temporary data for write operation. In real operation, the data for change is in units of bytes. It can be only a single byte or multiple bytes of data required for changes for more than 500K cycles independently. Totally, it may need to update data in a whole page having number of bytes of 128 B or 256 B with same P/E performance. Each byte has one dedicated bit and is called a Byte flag. This flag is used to store the information about which byte is selected for erase and program. Furthermore, the Byte-flag can be extended to be utilized for telling the system more information about erase verify, program verify and others.

Now, the detailed Write flow will be described here with reference to FIG. 36. When EEPROM is selected to perform write operation, all bytes of page buffers and all bits of byte-flag have to reset for further instructions and data. In this flow, all bits of byte-flags and all bytes of page buffers are preferred to set to "0" for initial condition prior to any steps of Data-preload, Erase and Program. The new data is then loaded into on-chip page buffer via one or more output buffers and is serially clocked in by a system clock. New data of "1" will over-write old data of "0". The bits of byte-flags will be set when the data of the selected bytes require a change or update. Before an erase operation is performed, one decision has to made if erase-verified is needed or not. In EEPROM design during program operation of the present invention, erase-verify is not a must operation.

In the flow path that requires a erase-verify, then an iterative series short pulses of erase and verify are performed. The number of short pulses required depends on the allowed erase and program time. The pulse voltage is preferred to be increased from initial voltage and then increased by step of 0.5V, instead of applying a high negative voltage of −20V in the beginning. For better P/E quality for better endurance cycles, more pulses are better. Due to built-in page buffers and circuits of byte-flags, the data can be flexibly erased in units of bytes, e.g., single byte, multiple bytes and a page that contains 128 B or 256 B. The specification of erase time for single byte, multiple bytes or a page is the same around 5 mS in conventional EEPROM. The width of erase pulse can be set 1 mS or 100 uS depending on a cell's characteristics. For 1 mS pulse width, a total of 5 pulses can be applied for tight-Vt erase below 1V or 0V depending on which Vt scheme is employed. After the completion of each successful erase pulse, an erase verify is performed by reading out and verifying the data via on-chip sense amplifiers. If the cells' Vts of erased bytes cannot meet the Vt requirement, then the additional erase pulses have to be continuously applied one by one for further erase. Erase will only stop when the erased Vt meeting the pre-determined specification.

In the flow path that does not require an erase-verify, then a single long pulse of erase and a single verify is performed. The allowed single pulse of erase and program is around 5 mS time. Similar to the non-erase-verify case and thanks to the built-in page buffers and circuits of byte-flags, the data can be flexibly erased in units of bytes, e.g., single byte, multiple bytes and a page that contains 128 B or 256 B. The specification of erase time for single byte, multiple bytes or a page is the same around 5 mS in EEPROM of the present invention. After the completion of each successful erase pulse, an erase verify is skipped on those erase bytes. If the cells' Vts of erased bytes cannot meet the Vt requirement, then the part becomes junk. Erase will only stop when the allowed erased of 5 mS is expired. Regardless of decision of erase or not, only those cells all pass the erase Vt specification will then be continued to perform the program and program verify operations as indicated in FIG. 36

Figure 37:
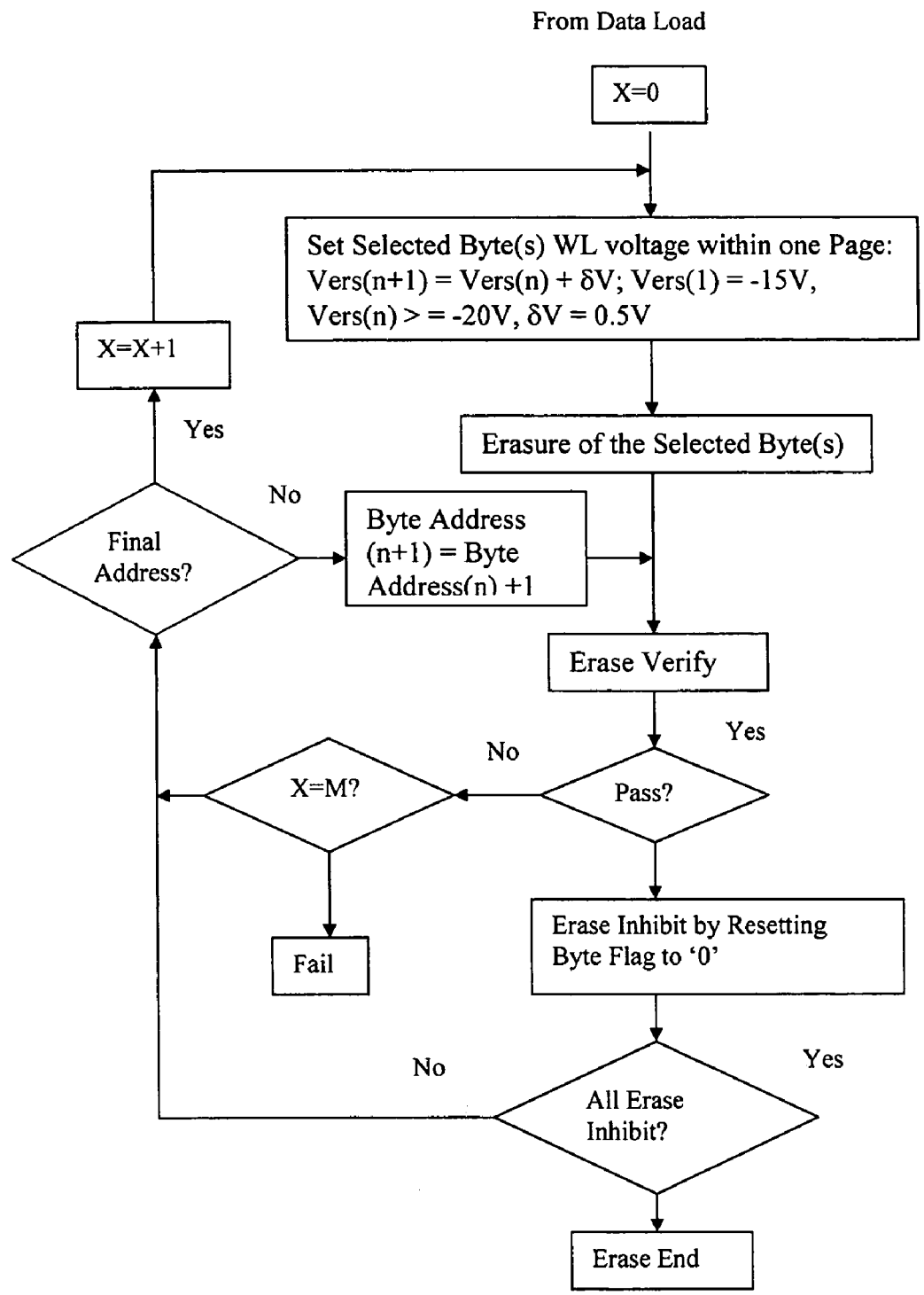
FIG. 37 illustrates a flow chart of erase and erase verify operations of 3Tr-OR EEPROM array of the present invention.

FIG. 37 illustrates a flow chart of more detailed steps of erase & erase verify and program & program verify operations of FIG. 36 of 3Tr-OR EEPROM array of the present invention. FIG. 37 starts with FROM DATA LOAD. Firstly, selecting bytes of byte-wordline for erase wordline voltage which starts from −15V first to avoid a big electric stress to those fast cells to secure the lengthy p/e cycles more than 500K. After each erase pulse is performed and Vt verification is not passed, then a second pulse will be applied again and verification of Vt is continued. This iterative short-pulse erase and Vt verification is repeated and stops until the cells' Vt in selected bytes are met. In order to prohibit any further erase pulses to those cell being erased correctly, the byte-flags have to be reset to "0" for those cell require no further erase pulse. The erase verify is performed by sense amplifiers and each time only one byte is verified. More bytes for erase verification have to be done associated with address increment to next location of next selected bytes. Until all selected bytes meeting the Vt of erase state, then erase stops and inform the system. The erase operation is to decrease the Vts of the erased bytes.

Figure 38:
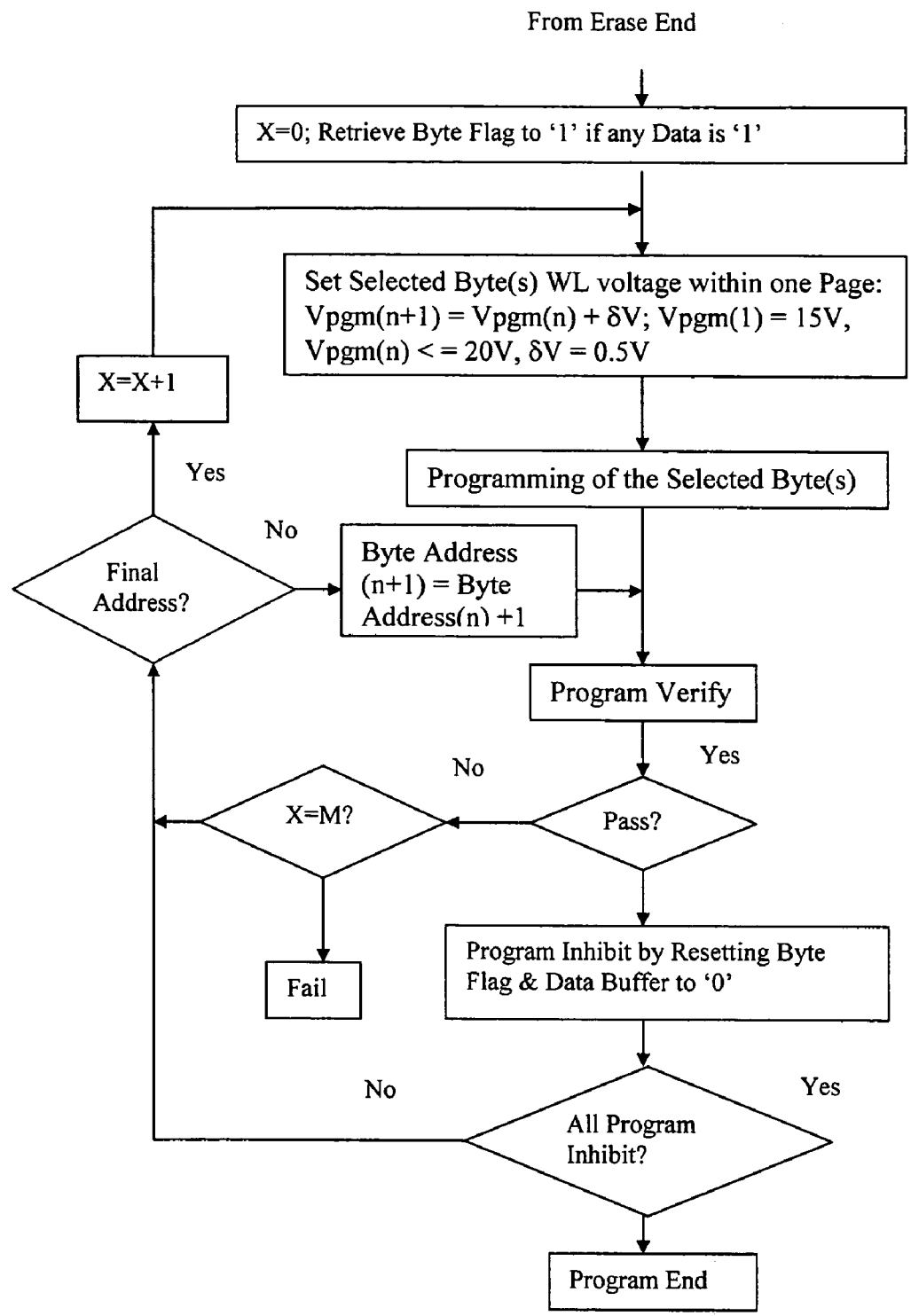
FIG. 38 illustrates a flow chart of program and program verify operations of 3Tr-OR EEPROM array of the present invention

Similarly, the preferred flow of a detailed program operation of the present invention is proposed in FIG. 38. The program voltage is set to be around +15V first and then gradually increased to final +20V to avoid the program stress in the beginning of the program operation. Right after the completion of each program pulse, a program verify immediately follows. If the program data does not meet the specification, the second pulse is applied to the gate again for further program. Once the particular byte of data program operation meets all the Vt specification, it will be set an inhibit voltage of around 5V to prevent further program pulses for better endurance cycles. Only those cells' Vt fail to meet the program specification will receive additional program pulse of the present invention.

In conclusion, the cells following the write flows of FIG. 36 and FIG. 37 of the present invention will achieve superior program/erase quality for better endurance cycles of more than 500K.

While the invention has been particularly shown and described with reference to the preferred embodiments thereof, it will be understood by those skilled in the art that various changes in form and details may be made without departing from the spirit and scope of the invention.

What is claimed is:

1. A three-transistor EEPROM cell memory comprising:
two global select gates running horizontally;
a plurality of bytes of eight bitlines running vertically;
a wordline divided into a plurality of byte-wordlines running horizontally over a floating gate; and
a plurality of BN+ source/drains running vertically.

2. The EEPROM cell memory according to claim 1 wherein said cell memory resides in a p-substrate.

3. The EEPROM cell memory according to claim 1 wherein said cell memory resides in an undivided triple well in a p-substrate.

4. The EEPROM cell memory according to claim 1 wherein said floating gate and said two select gates are tied together through polysilicon contact holes.

5. The EEPROM cell memory according to claim 1 wherein the write schemes of said memory cell use FN-channel erase and FN-channel program in units of bytes.

6. A three-transistor EEPROM cell memory comprising:
two global select gates running vertically;
a plurality of bytes of eight bitlines running vertically;
a wordline divided into a plurality of byte-wordlines running horizontally over a floating gate; and
a plurality of BN+ source/drains running horizontally.

7. The EEPROM cell memory according to claim 6 wherein a cell array made of said plurality of BN+ source/drains resides in a p-substrate.

8. The EEPROM cell memory according to claim 6 wherein a cell array made of said plurality of BN+ source/drains resides in an undivided triple well in a p-substrate.

9. The EEPROM cell memory according to claim 6 wherein said floating gate and said two select gates are tied together through polysilicon contact holes.

10. The EEPROM cell memory according to claim 6 wherein the write schemes of said cell memory use FN-channel erase and FN-channel program in units of bytes.

11. A three-transistor EEPROM cell memory comprising:
two global select gates running horizontally;
a plurality of bytes of eight bitlines running vertically;
a wordline divided into a plurality of byte-wordlines running vertically over a floating gate; and
a plurality of BN+ source/drains running vertically.

12. The EEPROM cell memory according to claim 11 wherein a cell array made of said plurality of BN+ source/drains resides in a p-substrate.

13. The EEPROM cell memory according to claim 11 wherein a cell array made of said plurality of BN+ source/drains resides in an undivided triple well in a p-substrate.

14. The EEPROM cell memory according to claim 11 wherein said floating gate and said two select gates are tied together through polysilicon contact holes.

15. The EEPROM cell memory according to claim 11 wherein the write schemes of said cell memory use FN-channel erase and FN-channel program in units of bytes.

16. A nonvolatile memory comprising:
an array of three-transistor EEPROM cells, each cell comprising: two global select gates;
a plurality of bytes of eight bitlines;
a wordline divided into a plurality of byte-wordlines running over a floating gate;
a plurality of cells with BN+ source/drains; and
a plurality of byte-wordline decoders formed in an undivided triple well and located outside of said array of three-transistor EEPROM cells and connected to said byte-wordlines by a plurality of metal lines.

17. The memory according to claim 16 wherein said plurality of byte-wordline decoders are located above said array of three-transistor EEPROM cells and wherein said plurality of byte-wordline decoders are connected to said plurality of byte-wordlines by vertical metal lines.

18. The memory according to claim 16 wherein said plurality of byte-wordline decoders are located to one side of said array of three-transistor EEPROM cells.

19. The memory according to claim 16 wherein said plurality of byte-wordline decoders are located within said array of three-transistor EEPROM cells and wherein said plurality of byte-wordline decoders are connected to said plurality of byte-wordlines by horizontal metal lines.

20. The memory according to claim 16 wherein said plurality of metal lines reside in three to six or more metal layers.

* * * * *